United States Patent
Schenk et al.

(10) Patent No.: US 11,664,445 B2
(45) Date of Patent: May 30, 2023

(54) SHORT-CIRCUIT SEMICONDUCTOR COMPONENT AND METHOD FOR OPERATING IT

(71) Applicant: Infineon Technologies Bipolar GmbH & Co. KG., Warstein (DE)

(72) Inventors: Mario Schenk, Warstein (DE); Reiner Barthelmess, Soest (DE); Peter Weidner, Soest (DE); Dirk Pikorz, Warstein (DE); Markus Droldner, Ahlen (DE); Michael Stelte, Borchen-Etteln (DE); Harald Nübel, Warstein (DE); Uwe Kellner-Werdehausen, Leutenbach (DE); Christof Drilling, Winterberg (DE); Jens Przybilla, Warstein (DE)

(73) Assignee: Infineon Technologies Bipolar GmbH & Co. KG, Warstein (DE)

( * ) Notice: Subject to any disclaimer, the term of this patent is extended or adjusted under 35 U.S.C. 154(b) by 274 days.

(21) Appl. No.: 16/912,029

(22) Filed: Jun. 25, 2020

(65) Prior Publication Data

US 2021/0036136 A1     Feb. 4, 2021

(30) Foreign Application Priority Data

Aug. 1, 2019 (DE) .................... 10 2019 120 876.9
Sep. 13, 2019 (DE) .................... 10 2019 124 695.4

(51) Int. Cl.
    *H01L 29/74*        (2006.01)
    *H01L 29/749*      (2006.01)
              (Continued)

(52) U.S. Cl.
CPC ...... *H01L 29/7424* (2013.01); *H01L 29/0839* (2013.01); *H01L 29/74* (2013.01);
(Continued)

(58) Field of Classification Search
CPC . H01L 29/74–749; H01L 29/083–0839; H01L 29/42308; H01L 29/1012–102;
(Continued)

(56) References Cited

U.S. PATENT DOCUMENTS 3,409,811 A    11/1968   Willi
3,577,046 A *   5/1971   Moyson .............. H01L 27/0817
                                                 257/163
(Continued)

FOREIGN PATENT DOCUMENTS

DE         2204853 A1     9/1972
DE         1489092 B2    10/1972
(Continued)

OTHER PUBLICATIONS

The European Search Report for European Patent Application No. 20174662.5, dated Nov. 10, 2020, EPO, Munich, Germany.

*Primary Examiner* — Jose R Diaz
(74) *Attorney, Agent, or Firm* — Murphy, Bilak & Homiller, PLLC

(57) ABSTRACT

A short-circuit semiconductor component comprises a semiconductor body, in which a rear-side base region of a first conduction type, an inner region of a second complementary conduction type, and a front-side base region of the first conduction type are disposed. The rear-side base region is electrically connected to a rear-side electrode, and the front-side base region is electrically connected to a front-side electrode. A turn-on structure, which is an emitter structure of the second conduction type, is embedded into the front-side base region and/or rear-side base region and is covered by the respective electrode and is electrically contacted with the electrode placed on the base region respectively embedding it. It can be turned on by a trigger structure which can be activated by an electrical turn-on signal. In the activated (Continued)

Figure 1:
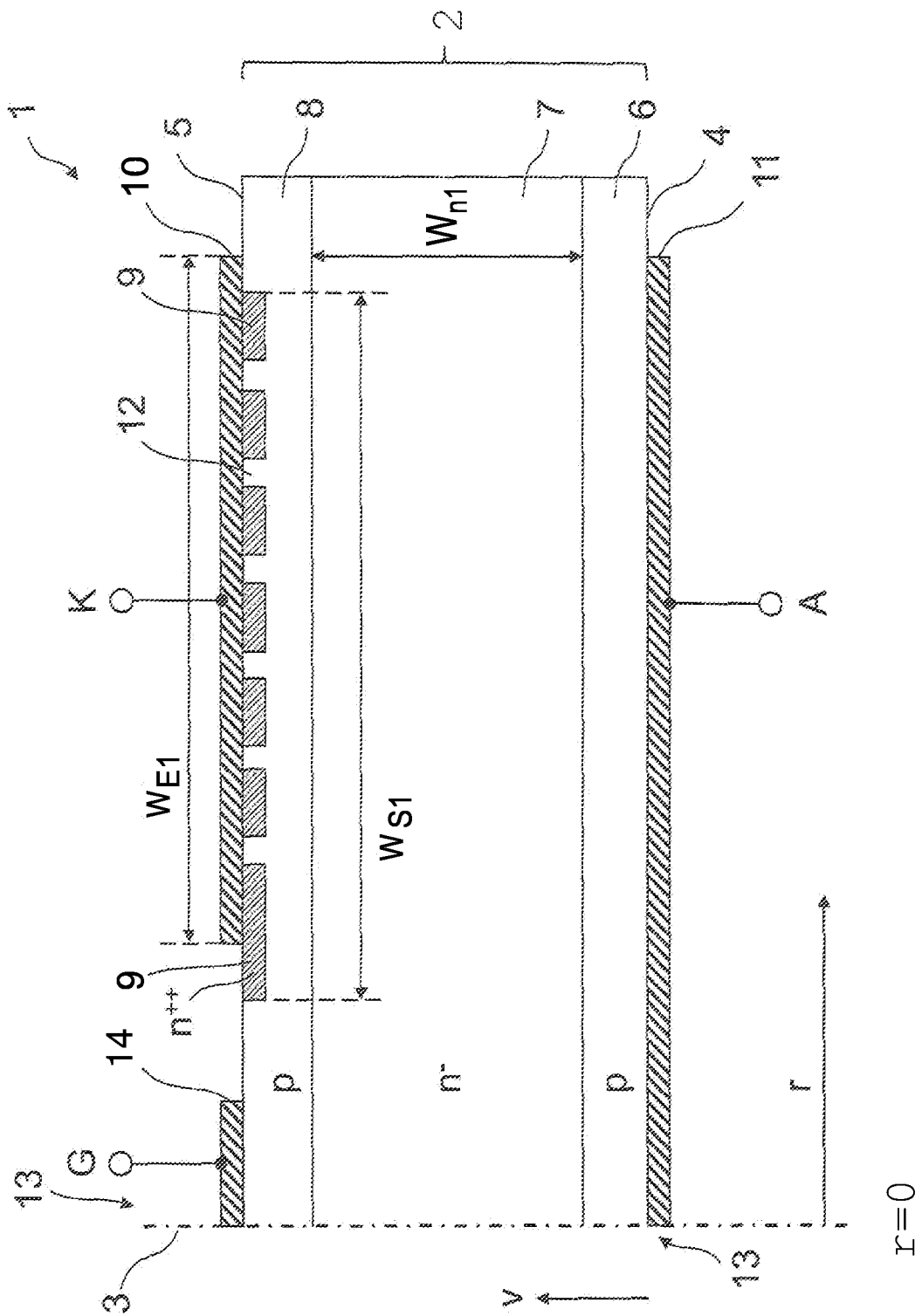

state, the trigger structure injects an electrical current surge into the semiconductor body, which irreversibly destroys a semiconductor junction.

25 Claims, 18 Drawing Sheets

(51) Int. Cl.
*H01L 29/08* (2006.01)
*H02H 9/04* (2006.01)
*H01L 29/417* (2006.01)

(52) U.S. Cl.
CPC ........ *H01L 29/749* (2013.01); *H01L 29/7412* (2013.01); *H02H 9/041* (2013.01); *H01L 29/41716* (2013.01)

(58) Field of Classification Search
CPC ........... H01L 29/41716; H01L 27/0817; H01L 23/62; H01L 29/749; H01L 29/7424; H01L 29/0839; H01L 29/7412; H02H 9/041

See application file for complete search history.

(56) References Cited

U.S. PATENT DOCUMENTS

| | | | |
|---|---|---|---|
| 3,660,687 | A | 5/1972 | Sahm et al. |
| 4,542,398 | A | 9/1985 | Yatsuo et al. |
| 4,775,883 | A | 10/1988 | Borchert et al. |
| 5,969,922 | A | 10/1999 | Pezzani |
| 9,741,839 | B1 | 8/2017 | Nakagawa |
| 2021/0367067 | A1* | 11/2021 | Kellner-Werdehausen ................ H01L 29/7424 |

FOREIGN PATENT DOCUMENTS

| | | |
|---|---|---|
| DE | 3134074 A1 | 5/1982 |
| DE | 4215378 C1 | 9/1993 |
| DE | 10333798 A1 | 2/2005 |
| DE | 102004025082 B4 | 12/2006 |
| DE | 102008049678 A1 | 4/2010 |
| DE | 102009045216 A1 | 4/2011 |
| DE | 10323220 B4 | 7/2014 |
| DE | 102018102234 A1 | 8/2019 |
| EP | 0463913 A1 | 1/1992 |
| EP | 3001525 A1 | 3/2016 |
| EP | 3721472 A1 | 10/2020 |
| JP | S57118671 A | 7/1982 |
| WO | 2019149581 A1 | 8/2019 |

* cited by examiner

SHORT-CIRCUIT SEMICONDUCTOR COMPONENT AND METHOD FOR OPERATING IT

This application claims priority to the German Application No. 10 2019 120 876.9, filed Aug. 1, 2019 and to the German Application No. 10 2019 124 695.4, filed Sep. 13, 2019, now pending, the contents of which are hereby incorporated by reference.

The present invention relates to a short-circuit semiconductor component according to the preamble of claim 1 and to a method for operating such a short-circuit semiconductor component.

Subsequent to certain cases of failures or incidents, all the components and, in particular, the power semiconductors in, for example, converter systems may be destroyed by excessive short-circuit and overload currents, which may amount to several 100 kA. The use of various protective devices for reliably preventing the destruction of the components in the systems, particularly of the semiconductor components, is known.

When a case of failure occurs, a defined, permanently low-resistance connection (short circuit) may be generated, for example, by a safety switch in the form of a short circuit device. In this case, the protective device can be triggered once and, having been triggered by an electrical or optical triggering signal, remains permanently short-circuited.

Nowadays, modern energy transmission applications and electrical high-performance drives are also required to short-circuit individual series-connected sub-modules in cases of failure, in order to continue to ensure the operation of the systems. Short-circuiting these sub-modules also serves for protecting the application against destruction and is therefore substantially intended for protecting this application.

For example, short-circuiting devices and quick-action grounding devices in high and medium voltage installations are an alternative application. Today, such devices are realized as mechanical, spring-powered switches. For example, they serve for preventing an installation from being overloaded/destroyed by an arcing fault by causing a rapid direct short circuit or rapid grounding. Among other things, high-voltage high-rupturing capacity fuses (Hochspannungs-Hochleistungssicherungen, HH-Sicherungen) can thus be caused to fuse and the short circuit to be reliably turned off in case of an overload of an installation in which the fuses would not yet react reliably (e.g. due to a more remote arcing fault).

Usually, mechanical switches having a switching time (from open to closed) of about 1 ms to 10 ms are used for short-circuiting. Since the sub-modules are short-circuited only in a case of failure, the switches are expected to be used rather infrequently (e.g. one switching action per 10 years). Consequently, mechanical switches are problematic with regard to a reliable switching action after a long period of non-use. Because of the movable parts in a mechanical switch, and if grease and oil are used, a reliable switching action can no longer be guaranteed after a corresponding long (inactive) period.

For example, DE 103 23 220 B4 discloses a shorting circuit for a faulty partial converter, in which, in case of a failure, an electronic semiconductor component either absorbs a short-circuit current or is activated depending on such a short-circuit current and is then permanently shorted. An active semiconductor switch, which, in particular, may be configured as a conventional thyristor, is proposed as an electronic semiconductor component. The latter is triggered in a case of failure, whereupon the short-circuit current flowing through the thyristor causes a local overheating of the semiconductor material, which destroys the short circuit thyristor. The latter then forms a permanent short circuit. The contacting of this short circuit thyristor is designed to be short-circuit-proof in such a way that no arc can form in it due to the large short-circuit current. Among other things, press-contacting is proposed for this purpose.

DE 103 33 798 A1 also describes a method for short-circuiting a faulty partial converter in which current-carrying IGBT power semiconductor switches (IGBT: Insulated Gate Bipolar Transistor) are turned on for a short time, in case of a failure, in such a way that they are shorted permanently. In order to ensure the semiconductor switches are shorted reliably, raising the gate-emitter voltage of the IGBT power semiconductor switches is proposed. Generally, IGBTs have a MOS-controlled area, wherein a conducting channel between the IGBT source and the IGBT drain or the IGBT emitter and the IGBT collector, which causes the IGBT to be turned on, is generated by means of a small voltage applied to the IGBT gate. However, the IGBT connections "gate" and "emitter" are always electrically insulated from each other by an insulator (oxide layer), which enables an "extreme" raising of the gate-emitter voltage in the first place. If a higher voltage exceeding the usual operating value by far is applied to the gate electrode, this results in a breakdown that is supposed to initiate the shorting of the IGBT.

Also, EP 3 001 525 A1 discloses a short-circuit switch with a semiconductor switch that can be controlled in order to short-circuit a voltage present between two conductors. The semiconductor switch is a conventional press-pack-type thyristor with planar contact electrodes on contact sides situated opposite one another. When the semiconductor component is mounted, its contact electrodes are contacted by means of planar connection electrodes which are resiliently pressed towards one another with high rigidity. In this way, the planar contacting of the semiconductor component is ensured by high flowing power currents even under high thermal stress. The thyristor is disposed in a mechanical press-pack structure forming a protective cover enveloping the thyristor. The thyristor is designed in such a way that, as a controllable semiconductor switch, it is irreversibly destroyed by a short-circuit current flowing though it during the short-circuiting, with the conductivity between its contact electrodes being maintained. The short-circuit current is supposed to be at least 50 times the rated current for which the thyristor is designed.

The use of a conventional thyristor as a short-circuit switch is disadvantageous in that it is not guaranteed at which current the thyristor is being destroyed and forms a defined short circuit, because the surge current value of a conventional thyristor varies to a great extent in the upward direction.

The realization of a "short-on-fail" state by targeted shorting, as described above, can be reliably ensured by a suitable module configuration, such as press-contacting, for example. In this case, the semiconductor component is located in a suitable housing, e.g. a ceramic cell or ceramic capsule, whose external current contacts, usually the cathode and anode connections, consist of thick copper stamps (or other conductive materials). A suitable pressure bond ensures that the two contact stamps are contacted with a sufficiently high pressure against the respective metallic contact electrodes of the semiconductor component in order to form a particularly low-level electrical and thermal transition between the semiconductor component and the copper stamps of the housing. If the location of the shorting is located within the pressed contact region, the area of destruction of the semiconductor component remains within the pressed contact surface, both during the case of failure, in which fusing and shorting occurs, and during the permanent current flow after the case of failure. Externally, the housing is not damaged or only to a small extent; the conversion of energy during and after the case of failure takes place within the semiconductor component and there remains limited to the press-contacted area. The point is that the electrical connection in the component is not interrupted by the case of failure, as may be the case in a solder bond component in which the current flows through bond wires. Here, a galvanic separation of the connections in the component occurs at high currents, due to a fusing of the bond wires or soldered connections. Because of the very high energy, this inevitably results in the complete destruction of the entire semiconductor component in a case of failure, which also constitutes a high level of danger to the installation in the vicinity of the component. The bond wires are relatively exposed within the housing surrounding the semiconductor component and are often also embedded in a gel, which is the reason for an explosive destruction due to an arc between the disconnected bond wires. In contrast, in the case of a press-contacted component, the energy conversion in the silicon or the fusing area or arc is limited within the area contacted by the anode-side and cathode-side contact disks, so that an explosion or destruction of the immediate vicinity of the component is largely avoided even at the highest current densities.

If a conventional thyristor is subjected to a load at its surge current limit, it partially or completely loses its blocking capacity for a short period of time, i.e. reversibly, due to the great large-scale heating of its cathode surface, until the blocking layer temperature has dropped back to the range permissible for continuous operation. The permissible surge current density at maximum current of a single 10 ms pulse which does not yet result in an irreversible destruction typically is between 1.0 and 1.5 kA/cm$^2$. If this limit is exceeded to a significant extent, the heating results in fused portions (shorting) within the cathode surface, the thyristor is destroyed and irreversibly loses its blocking capacity or controlling function. As long as the fused portions are located within the area contacted and pressed by the copper contact disks or copper stamps of the capsule and, at the same time, sufficiently distant from the edge region of the thyristor, both the capsule and the immediate vicinity remain largely intact.

However, a fundamental disadvantage of a conventional thyristor as a short-circuit device as described in DE 10 2008 049 678 A1 or DE 10 2009 045 216 A1 is its large cathode surface, which is designed for as small a conduction or forward loss as possible, or for maximum surge current capacity. Its diameter approximately corresponds to that of the contact disks of the copper stamp, or is regularly slightly larger (up to about 0.5 to 2 mm). If a high short-circuit current results in an intended shorting in the cathode surface, it is not ensured that that occurs sufficiently far away from the edge region of the thyristor. The radially outer region of the component that is not covered or pressed against by the contact discs of, for example, copper stamps, which usually press-contact the contact electrodes (particularly the cathode an anode connections) of the semiconductor component, may be considered the edge region. The shorted region is located somewhere within the cathode surface and may also extend into the edge region. In this case, a destruction of the ceramic housing and an escape of plasma may occur. Plasma could also escape in a center of the semiconductor component, for example if a gate electrode or an auxiliary thyristor structure (amplifying gate structure), which is also not covered or pressed against by the contact disks of the copper stamp press-contacting the semiconductor component, is disposed in the center of the semiconductor component.

Compared to the rest of the surface directly contacted or covered by the copper contact disks, the edge region of a thyristor is also much more susceptible to the occurrence of overvoltages. Such a failure, in conjunction with the short-circuit current that flows in that case, results in the destruction of the capsule due to the very high energy density, particularly at a high blocking voltage, as was already described above. Though the capacity to withstand such overvoltages could be improved considerably by various measures, this entails serious disadvantages. For example, a silicon starting wafer that is a lot thicker would significantly increase the blocking capacity, and thus, the probability of a failure at the edge caused by overvoltage could be largely avoided. However, due to the dynamic losses and forward losses in a conventional thyristor structure being too high in that case, this is not a viable possibility because the thyristor is then no longer able to satisfy the requirements placed on it, primarily very low forward losses and maximum surge current behavior as well as very low dynamic losses.

For example, if the thyristor fails while the blocking voltage $U_R$ is applied, e.g. due to an overvoltage or a blocking instability of the passivation of its edge contour, the location of failure is most frequently located in the edge region of the thyristor component, and thus outside the region directly contacted by the copper contact disks. A very high short-circuit current flows in the blocking direction, wherein the undisturbed region does not participate in the current flow, whereas fusing occurs at the failure location. An arc is generated inside the housing capsule or at the failure location, the fused material evaporates and hot plasma is generated, which, depending on the intensity, may result in the capsule being destroyed. Due to this explosive discharge, a rupture may occur in the vicinity of the fused portion in the ceramic capsule, from which hot plasma escapes in that case. Such an edge failure may also occur if a blocking voltage $U_D$ is applied.

Against this background, the present invention is based on the object of providing a short-circuit semiconductor component with which an electrical voltage applied to the semiconductor component can be reliably, safely and permanently (with long-term stability) short-circuited in accordance with a triggering or turn-on signal, without plasma explosively escaping from the semiconductor component in the process. Furthermore, the blocking losses in a blocking mode of operation of the semiconductor component are supposed to be so small that it can be operated without an active cooling system. Furthermore, a method for operating a short-circuit semiconductor component is to be provided.

This object is accomplished by a short-circuit semiconductor component having the features of claim 1 and a method for operating a short-circuit semiconductor component having the features of claim 24. Other particularly advantageous embodiments of the invention are disclosed by the dependent claims.

It must be noted that the features cited individually in the following description can be combined with each other in any technologically meaningful manner and represent other embodiments of the invention. The description, in particular in connection with the figures, additionally characterizes and specifies the invention.

According to the invention, a short-circuit semiconductor component comprises a semiconductor body, in which a rear-side base region of a first conduction type, e.g. of the p-type, an inner region of a second conduction type complementary to the first conduction type, e.g. of the n-type, and a front-side base region of the first conduction type are successively arranged in a vertical direction starting from a rear side with a rear-side center determined by its geometric center of gravity towards a front side, which is opposite to the rear side, with a front-side center determined by its geometric center of gravity. Furthermore, the rear-side base region is connected in an electrically conductive manner to a rear-side electrode (metallization, e.g. aluminum) with a lateral rear-side electrode width determined by its lateral extent, which is applied to the rear side. The front-side base region is connected in an electrically conductive manner to a front-side electrode (metallization, e.g. aluminum) with a lateral front-side electrode width determined by its lateral extent, which is applied to the front side. Moreover, according to the invention, at least one front-side turn-on structure is embedded in the front-side base region and at least partially covered by the front-side electrode and/or at least one rear-side turn-on structure is embedded in the rear-side base region and at least partially covered by the rear-side electrode. According to the invention, the respective turn-on structure is an emitter structure of the second conductive type, e.g. of the n-type, which is contacted in an electrically conductive manner to the electrode applied to the base region respectively embedding it and which can be turned on by means of at least one trigger structure which, via the semiconductor body, acts on it electrically and which can be activated in turn by means of an electrical turn-on signal supplied to it. Further, the trigger structure is configured and arranged in such a way that, in its activated state, it injects an electrical current surge with a predetermined energy input, e.g. about 2 Ws, into the semiconductor body between the trigger structure and the front-side and/or rear-side turn-on structure, which irreversibly destroys a first semiconductor junction, e.g. an n-p junction, formed between the respective turn-on structure and the base region embedding it and/or a second semiconductor junction, e.g. a p-n junction, formed between this base region and the inner region.

It is also noted that a conjunction "and/or" used hereinafter, which is placed between two features and links them to each other, should always be interpreted such that, in a first embodiment of the subject matter according to the invention, only the first feature may be provided, in a second embodiment of the subject matter according to the invention, only the second feature may be provided, and in a third embodiment of the subject matter according to the invention, both the first and the second feature may be provided.

Herein, a direction that is substantially perpendicular to the vertical extending direction of the semiconductor body is considered a lateral or radial extending direction in the semiconductor body. Accordingly, in the case of a semiconductor body configured, for example, as a cylinder (with a low height), the vertical extending direction corresponds to the direction of the cylinder height, and the lateral direction corresponds to the radial direction of the cylinder. Herein, the terms lateral and radial are used synonymously.

Further, it is to be noted that the front-side center and the rear-side center of the short-circuit semiconductor component may differ from each other, which is not an absolute necessity, however, and which is also usually not the case. Usually, the two centers define an axis of symmetry of the semiconductor body, starting from which the radius of the semiconductor body is determined. If a center is mentioned in the following in relation to a front-side component of the short-circuit semiconductor component, then this center is always to be understood to be the front-side center unless expressly stated otherwise. Equally, a relation between a center and a rear-side component of the semiconductor body is analogously to be understood to be the rear-side center, unless expressly stated otherwise.

It is to be understood that an emitter structure contacted in an electrically conductive manner to the front-side electrode is a front-side turn-on structure, in which the emitter structure of the second conduction type is embedded into the front-side base region of the first conduction type so as to adjoin the front side of the semiconductor body, in such a way that it is contacted in an electrically conductive manner at least in some portions by applying the front-side electrode to the front side of the semiconductor body. This applies mutatis mutandis to an emitter structure contacted in an electrically conductive manner to the rear-side electrode, which, correspondingly, is a rear-side turn-on structure, in which the emitter structure of the second conduction type is embedded into the rear-side base region of the first conduction type so as to adjoin the rear side of the semiconductor body, in such a way that it is contacted in an electrically conductive manner at least in some portions by applying the rear-side electrode to the rear side of the semiconductor body. The emitter structure is in this case preferably contacted to the respective front-side or rear-side electrode by direct contact between the respective components.

The lateral width of an overall structure, e.g. of a turn-on structure or electrode, is thus given by a distance of an inner side, which radially delimits the overall structure the farthest towards the inside, from an outer side, which radially delimits this overall structure the farthest towards the outside. This is immediately evident for structures of the semiconductor body that are spaced apart from their radial center ($r=0$), i.e. the geometrical center of gravity or center point of the front and/or rear side of the semiconductor body. In the special case that the overall structure has no distance from the radial center, i.e. extends with its radial inner side to the radial center, the lateral width of the overall structure corresponds to the distance of an outer side radially delimiting the overall structure towards the outside from the radial center. In other words, the lateral width in this case corresponds to the radius (measured from the radial center) of the overall structure, or also half its diameter.

Thus, the semiconductor body of the short-circuit semiconductor component according to the invention (without considering the turn-on structure) has, between its front-side electrode or front-side metallization and its rear-side electrode or rear-side metallization, a p-n-p or n-p-n structure which blocks the component reliably and with long-term stability in both directions or polarities for an electrical voltage present between the front-side electrode and the rear-side electrode. This state is herein referred to as a normal, non-short-circuited operational state of the short-circuit semiconductor component according to the invention.

However, if too high a current, which may amount to up to several 100 kA, causes an overload in case of an accident in an electrical installation to be protected by the short-circuit semiconductor component according to the invention, at least the first semiconductor junction (e.g. an n-p junction) formed between the turn-on structure and the base region embedding it and/or the second semiconductor junction (e.g. an p-n junction) formed between this base region and the inner region are irreversibly destroyed by the previous activation of the trigger structure and the current surge subsequently generated by this trigger structure (which is also referred to herein as a pre-destruction). Thus, the blocking effect of the two semiconductor junctions between the turn-on structure, the base region and the inner region is canceled.

If, directly after this pre-destruction, a sufficiently high main or load current flows between the outer metal connections of the semiconductor component, i.e. between the front-side and the rear-side electrode, this further increases the level of destruction, and the high current density causes a permanent, irreversible, low-resistance fusing or shorting (permanent short-circuit) between the two electrodes contacting the semiconductor body. The level or size of this shorting ultimately depends on the current density or the main current between the front- and rear-side electrodes. Afterwards, the short-circuit semiconductor component according to the invention is no longer capable of blocking. This state is herein referred to as a short-circuited operational state or short-circuit state of the short-circuit semiconductor component according to the invention.

The activation of the trigger structure as a consequence of feeding the predeterminable turn-on signal to the semiconductor body or the trigger structure results, in a targeted manner, in the one-off formation of a permanent, irreversible, electrically conductive, low-resistance connection between the front-side electrode and the rear-side electrode, i.e. in a short circuit.

In the process, the permanent short circuit is produced, after the pre-destruction of at least one of the two semiconductor junctions, by specifically carrying the short-circuit current on a locally delimited surface in the component, so that a subsequent fusing in the current-carrying area is the result, due to the high current density. In this process of fusing, which is also referred to as shorting, the materials of the outer metal connections (e.g. aluminum, molybdenum and/or copper) and the silicon of the semiconductor body fuse together. After the fusing process, a metallic zone with a high conductivity forms, which permanently short-circuits the outer metal connections and is also capable, in principle, of maintaining this short-circuit function under a current load over a longer period of time, e.g. until the next repair process.

Compared to a triggering or turning on of the turn-on structure which is, at first, merely non-destructive, a particular advantage of the inventive pre-destruction by the trigger structure is that the pre-destruction can be initiated at a point in time that only has to be close to the actual failure event. The subsequent large failure load current may then also arise at a later point in time, which may be some milliseconds after the activation of the trigger structure, for example.

In contrast, in a case of the turn-on structure being turned on in a "non-pre-destructive" (conventional) manner by the trigger structure, the conventional trigger pulse has to be generated immediately or directly prior to the failure load current, particularly within a time range of only very few microseconds. Because the failure load current, which may amount to hundreds of kiloamperes, can cause the intended destruction in the turn-on structure and generate a permanent short-circuit in the semiconductor structure only as long as the conventional trigger pulse, which is limited to a few tens of microseconds up to 100 µs (depending, for example, on a generator principle generating the turn-on signal), is still applied or active.

Thus, the short-circuit semiconductor component according to the invention permits a considerably larger spread in time between the generation of the turn-on signal (pre-destruction) and the complete shorting of the semiconductor body subsequently caused by the failure load current.

Furthermore, the switching times of conventionally about 1 ms to 10 ms are reduced to less than 100 µs by using the inventive semiconductor-based short-circuit switch. Because of the fact that, according to the invention, no movable mechanical parts are provided in the short-circuit switch and that additionally, the switching times are so short, the safety or reliability of the short-circuit semiconductor component is improved considerably.

Once again, it is emphasized that two circuits are always provided in the short-circuit semiconductor component according to the invention:
1) The trigger circuit causing pre-destruction, and
2) The load circuit between the outer metal connections of the semiconductor component, i.e. between the front-side and the rear-side electrode.

According to another aspect of the invention, also disclosed is a method for operating a short-circuit semiconductor component which has the features of the invention described herein. In particular, with regard to method-related definitions of terms and the effects and advantages of features of the method, the entirety of the explanations provided herein of corresponding definitions, effects and advantages regarding the device according to the invention are to apply. This means that disclosures contained herein regarding the device according to the invention may also be used, mutatis mutandis, for defining the method according to the invention unless expressly excluded herein. Disclosures contained herein regarding the method according to the invention may equally be used, mutatis mutandis, for defining the device according to the invention unless expressly excluded herein, too. Thus, a repetition of explanations of features that are basically the same, their effects and advantages with regard to the device according to the invention disclosed herein and the method according to the invention disclosed herein is largely omitted herein for the sake of a more compact description.

In the method for operating a short-circuit semiconductor component according to the invention, the latter comprises a semiconductor body, in which a rear-side base region of a first conduction type, an inner region of a second conduction type complementary to the first conduction type, and a front-side base region of the first conduction type are successively arranged in a vertical direction starting from a rear side with a rear-side center determined by its geometric center of gravity towards a front side, which is opposite to the rear side, with a front-side center determined by its geometric center of gravity, wherein the rear-side base region is connected in an electrically conductive manner to a rear-side electrode with a lateral rear-side electrode width determined by its lateral extent, which is applied to the rear side, and the front-side base region is connected in an electrically conductive manner to a front-side electrode with a lateral front-side electrode width determined by its lateral extent, which is applied to the front side, wherein at least one front-side turn-on structure is embedded in the front-side base region and at least partially covered by the front-side electrode and/or at least one rear-side turn-on structure is embedded in the rear-side base region and at least partially covered by the rear-side electrode, wherein the respective turn-on structure is an emitter structure of the second conductive type, which is contacted in an electrically conductive manner to the electrode applied to the base region respectively embedding it and which can be turned on by means of at least one trigger structure which, via the semiconductor body, acts on it electrically, wherein the trigger structure can be activated in turn by means of an electrical turn-on signal supplied to it.

In the method according to the invention, by activating the trigger structure by means of the turn-on signal, an electrical current surge with a predefined energy input is injected into the semiconductor body between the trigger structure and the front-side and/or rear-side turn-on structure in such a way that, thereby, a first semiconductor junction formed between the respective turn-on structure and the base region embedding it and/or a second semiconductor junction formed between this base region and the inner region is irreversibly destroyed.

According to an advantageous embodiment of the invention, the energy input is predetermined in a range between about 1 Ws to about 3 Ws, e.g. 2 Ws. Thus, the pre-destruction of at least one of the two semiconductor junctions can be reliably ensured.

The term "about" as used in connection with the disclosed invention specifies a tolerance range which the person skilled in the art working in the present field considers to be common. In particular, the term "about" is to be understood to mean a tolerance range of the quantity concerned of up to a maximum of +/−20%, preferably up to a maximum of +/−10%.

According to another advantageous embodiment of the invention, the semiconductor body, in a region into which the current surge is injected, which is situated between the trigger structure and the front-side and/or rear-side turn-on structure, has a resistance (greater than 0Ω) of at most about 10Ω, preferably 5Ω at most, or even less, in the radial direction. This means that an electrically relatively conductive connection exists between the trigger structure and the turn-on structure, so that consequently, it is not possible to introduce a high voltage between the trigger structure and the turn-on structure. Therefore, the energy input into the semiconductor body in the present case depends on the charge provided by the trigger structure and the size of the current surge associated therewith, which flows between the activated trigger structure on the one side and the respective turn-on structure on the other. This charge or the strength of the current surge, however, can be set and adjusted particularly well, as is explained herein.

Another advantageous embodiment of the invention provides that the front-side turn-on structure has a lateral front-side turn-on structure width determined by its lateral extent, and the rear-side turn-on structure has a lateral rear-side turn-on structure width determined by its lateral extent, wherein the ratio of the lateral turn-on structure width to the corresponding lateral electrode width of the respective electrode contacting the corresponding turn-on structure is less than 1, preferably less than ⅘, more preferably less than ¾, still more preferably less than ⅔, and further preferably smaller than ½.

The turn-on structure with a certain lateral turn-on structure width, which is formed as an emitter structure, is advantageous in that the current plasma can spread across the surface of the emitter structure before shorting starts, with the result that the shorting has a greater lateral width and thus a larger cross-section as a whole. The greater conduction cross-section of the shorted area in the semiconductor body obtained in this manner advantageously entails a reduction of the electrical resistance of the short-circuit region in the semiconductor body formed by the shorting. Accordingly, the short-circuit region is capable of carrying higher short-circuit currents with lower conduction losses. Advantageously, an active cooling system of the semiconductor component according to the invention can be omitted.

When considering the ratio between the lateral turn-on structure width and the respective lateral electrode width, then, according to the present invention, the lateral turn-on structure width of the front-side turn-on structure, provided that is present in the semiconductor body, is always compared with the lateral electrode width of the front-side electrode, and the lateral turn-on structure width of the rear-side turn-on structure, provided that is present in the semiconductor body, is always compared with the lateral electrode width of the rear-side electrode. Accordingly, reference is made herein to an association of the front-side turn-on structure with the front-side electrode and to an association of the rear-side turn-on structure with the rear-side electrode.

As was already explained above, the permanent short circuit is generated on a locally limited surface in the semiconductor component, which in the present case can be determined substantially by the respective ratio of the lateral front-side turn-on structure width to the lateral front-side electrode width (if a front-side turn-on structure is present in the semiconductor body) or of the lateral rear-side turn-on structure width to the lateral rear-side electrode width (if a rear-side turn-on structure is present in the semiconductor body), so that there, a subsequent fusing (shorting) is the result in the current-carrying area, due to the high current density. In this process of fusing, the materials of the outer metal connections (e.g. aluminum, molybdenum and/or copper) and the silicon of the semiconductor body fuse together. After the fusing process, a metallic zone with a high conductivity forms, which permanently short-circuits the outer metal connections and is also capable, in principle, of maintaining this short-circuit function under a current load over a longer period of time, e.g. until the next repair process.

Compared with a conventional thyristor, in which the ratio of the lateral turn-on structure width to the lateral electrode width is substantially 1 in order to be able to realize a maximum surge current and minimal conduction losses, the current-carrying capacity of the front- and/or rear-side turn-on structure in the short-circuit semiconductor component according to the invention, due to the ratio of less than 1 respectively defined herein, is limited in such a defined manner that the pre-destruction of the short-circuit semiconductor component according to the invention reliably results in its subsequent complete shorting. After shorting, the short-circuit semiconductor component is in a permanent, non-reversible, low-resistance current-carrying state between the front-side and the rear-side electrode, so that an electrical voltage present between these two electrodes can be short-circuited permanently and with long-term stability. In other words, the voltage drop between the front-side and the rear-side electrode of the short-circuit semiconductor component according to the invention in case of a short circuit is so low (low-resistance current-carrying state) that the electrical losses in the short-circuit semiconductor component according to the invention are low even in the case of a longer short-circuit operation, and that therefore, an active cooling system may advantageously be omitted.

In the sense of the present invention, the condition "less than 1" must always be interpreted in such a way that production-related dimensional deviations between the respective lateral turn-on structure width and the lateral electrode width of the electrode respectively associated with the turn-on structure concerned, which are within the production tolerances defined for the respective production process of the short-circuit semiconductor component according to the invention, do not fall under the condition "less than 1" used herein. In other words, according to the definition, a ratio of a lateral turn-on structure width to a lateral electrode width of the respective electrode is to be considered to be "less than 1" in the sense of the present invention only if the size of the two compared lateral widths differs to such an extent that this difference in size cannot reliably be ascribed to the production-related tolerance deviations of the respective feature, but is the result of targeted actions.

It was found that, with a given vertical thickness of the inner semiconductor region of the semiconductor body, the fusing current is substantial proportional to the surface of the front-side and/or rear-side turn-on structure and can thus be set. In addition, the lateral turn-on structure width of the respective turn-on structure, which is (considerably) smaller compared to the lateral electrode width of the respective electrode, permits a local limiting of the shorting in the short-circuit semiconductor component in such a way that the extent of the shorting in the lateral or radial direction can be limited to substantially the surface of the front- and/or rear-side turn-on structures. Thus, the region of the shorting can be kept sufficiently distant in any case from a radially outer edge region of the short-circuit semiconductor component according to the invention. Accordingly, shorting takes place exclusively in the inner region of the short-circuit semiconductor component covered by the front-side and the rear-side electrode, so that, during short-circuit operation, no mechanical destruction of the short-circuit semiconductor component in its edge region occurs which could result in plasma escaping from the short-circuit semiconductor component and thus, in a destruction of a housing that may possibly surround the short-circuit semiconductor component.

It may also be remarked here that, for any observed point of the short-circuit semiconductor component according to the invention, it should apply that the ratio of the lateral front-side turn-on structure width to the lateral front-side electrode width is less than 1 or that the ratio of the lateral rear-side turn-on structure width to the lateral rear-side electrode width is less than 1. If the short-circuit semiconductor component according to the invention is configured, for example, as a cylinder with a perfectly rotationally symmetric configuration of the front-side and/or rear-side turn-on structure and the corresponding electrode (front-side and/or rear-side), then the observation of the above-defined ratio at exactly one arbitrary point on the short-circuit semiconductor component directly applies also to all other points on the short-circuit semiconductor component. However, if the lateral turn-on structure width and/or the lateral electrode width, in the cylindrical short-circuit semiconductor component chosen as an example, changes depending on the position observed along the circumference of the short-circuit semiconductor component, i.e. the short-circuit semiconductor component is not configured in a rotationally symmetric manner with respect to the observed turn-on structure and/or the electrode associated therewith, then the ratio of the lateral turn-on structure width to the lateral electrode width may also change depending on the observed circumferential position. However, according to the above definition, in the sense of the invention, it is to be less than 1 at any observed point on the short-circuit semiconductor component.

Moreover, it is to be understood that in the sense of the present invention, in a case in which a turn-on structure substantially has no constant turn-on structure width in the radial direction, the largest turn-on structure width occurring in the radial direction is to be considered the turn-on structure width to be used for the comparison in the consideration of the ratio between the turn-on structure width and the electrode width of the electrode correspondingly associated with the turn-on structure.

Particularly preferably, the ratio of the lateral turn-on structure width to the lateral electrode width of the front-side or rear-side electrode correspondingly associated with, in each case, the front-side or rear-side turn-on structure is selected to be less than $4/5$, e.g. also less than $3/4$, $2/3$, $1/2$, $1/3$, $1/4$, $1/5$. In the short-circuit semiconductor component according to the invention, the lateral turn-on structure width of the front-side or rear-side turn-on structure is thus chosen to be much smaller than the lateral electrode width of the respective electrode. In this way, a fusing current reliably resulting in a shorting of the short-circuit semiconductor component according to the invention can be set to a value that is as small as desired. It is thus ensured that a relatively small fault or short-circuit current carried by the short-circuit semiconductor component according to the invention between the front-side electrode and the rear-side electrode reliably shorts the component in the desired manner and thus establishes the non-reversible, low-resistance current-carrying state (short-circuited operational state).

Another advantageous embodiment of the invention provides that the turn-on structure is completely covered by the front-side electrode and the rear-side electrode, which is to be understood to mean a coverage in the lateral (radial) direction. The complete front-side and rear-side coverage of the at least one turn-on structure offers the advantage that the possibility of plasma escaping from the semiconductor body due to the shorting is reduced even further, because the shorting in the short-circuit semiconductor component according to the invention can substantially be locally limited in such a way that it occurs in the region covered by both electrodes, as was already explained above. As a result, a destruction of a housing possibly surrounding the short-circuit semiconductor component during the shorting is reliably prevented because an escape of plasma from the short-circuit semiconductor component is prevented in this manner. Preferably, the coverage of the respective turn-on structure by the front-side or rear-side electrode in the radially outer edge region (i.e. in the direction towards the radial outer edge of the short-circuit semiconductor component according to the invention) may be in the range of at least a few millimeters, e.g. about 1 mm to 5 mm or greater.

Moreover, the at least one turn-on structure may preferably be disposed close to the center in the semiconductor body. This is to be understood to mean that the radial distance of an inner side, which radially delimits the turn-on structure the farthest radially towards the inside, from the corresponding center of the semiconductor body, i.e. the geometrical center of gravity or center point of the front and/or rear side of the semiconductor body (herein also referred to as a radial center), is smaller than the distance from an outer side, which radially delimits the turn-on structure the farthest towards the outside, to a radial outer edge of the semiconductor body. This measure primarily also further reduces the possibility of plasma escaping during the shorting of the short-circuit semiconductor component according to the invention in the edge region of the semiconductor body, because the shorting is limited to a region of the semiconductor body close to the center between the front-side and the rear-side electrode, which is covered by those electrodes. A destruction of a housing possibly surrounding the short-circuit semiconductor component as a consequence of shorting is thus also reliably prevented.

Another advantageous embodiment of the invention provides that the front-side electrode and the rear-side electrode cover the front-side or rear-side center, respectively, of the semiconductor body, and the turn-on structure is disposed in this center. The distance of an outer side radially outwardly delimiting the turn-on structure from a radial outer edge of the semiconductor body can thus be maximized, and thus, the edge region of the semiconductor body and, additionally, the region between the radial outer side of the turn-on structure and the radial outer edge of the semiconductor body, depending on the selected lateral electrode width of the front-side and rear-side electrode which, according to the invention, is always greater than the lateral turn-on structure width, can be reliably protected, by means of the coverage of the front side and the rear side of the semiconductor component, against an unwanted escape of plasma due to the shorting of the short-circuit semiconductor component.

Another advantageous embodiment of the invention provides that an electrically insulating insulator layer is disposed between the turn-on structure and the electrode contacting it in an electrically conductive manner, wherein the insulator layer extends in the radial direction across this turn-on structure and extends in the circumferential direction of the semiconductor body along an, in the radial direction inner, inner edge of this electrode.

It is to be understood that the insulator layer, with regard to its surface, does not have such a large extent that a complete electrical insulation of the electrode from the turn-on structure and the base region embedding the turn-on structure is provided. Rather, at least one region between the electrode and the turn-on structure as well as of the base region remains free of the insulator layer, so that an electrically conductive connection between the electrode and the turn-on structure as well as the base region continues to exist.

The insulator layer may preferably have a thickness of at least 10 nm to at most 100 nm, more preferably of at least 50 nm to at most 100 nm.

The insulator layer may preferably be a silicon dioxide layer.

Moreover, the insulator layer according to another advantageous embodiment of the invention may have openings spaced apart from each other in the radial direction, which establish a direct electrically conductive connection between the electrode and the base region abutting against it.

According to yet another advantageous embodiment of the invention, the trigger structure is a gate electrode, and the turn-on signal is the current surge injected by the trigger structure into the semiconductor body.

An exemplary gate configuration includes a gate spring wire contacting the gate electrode from the outside. With its inherent tension, the gate spring wire presses itself onto the gate connection of the semiconductor body.

It is conceivable that, instead of this spring gate configuration, another form may also be used which establishes more of a planar transition between the gate supply wire and the gate contact, for example, in order to keep the contact transition resistance as low as possible.

The transition or contact resistance towards the gate electrode is critical, particularly with respect to the current pulses in the range of up to several hundreds of amperes, if not kiloamperes, which are very high compared with the usual gate current (in the range of 10 A). The contact resistance towards the silicon has to be kept small and stable by means of a suitable configuration. Suitable contact materials or surface coatings have to be selected for this purpose. For example, these surfaces must not corrode.

The contact forces also have to be adjusted with particular accuracy in order to avoid too high a transition resistance at these strong current pulses.

If this is not accomplished, this may result in a failure directly at the transition of the gate supply wire to the gate metal (danger of plasma escaping, because this region is not in the pressed area).

In order to ensure the long-term stability of a low-resistance contact transition, surface coatings in the region of the transition of the gate supply wire to the gate metal on the semiconductor surface are an option. Suitably long-term stable or particularly corrosion-resistant surface coating materials for coating the gate supply wire are, for example, ruthenium or rhodium, if nickel plating is not sufficient. Other improvements are possible using noble-metal coatings, such as Au. Thus, not only can the gate wire be coated, but also the metal surface of the gate contact of the semiconductor. Adhesion promoters, such as titanium, may be used additionally in order to improve adhesion.

It may also be helpful if the (gate) metallization of the semiconductor is provided with a particularly thick (soft) silver layer, which helps reducing the contact resistance towards the usually hard or harder gate supply wire (also due to the spring action). In other words, the gate electrode, preferably on its vertically outer metallic contact side, may be coated with such a silver layer that is relatively thick, on the one hand, and, on the other hand, is considerably softer than the external gate electrode contacting wire (spring wire) contacting the silver layer.

Since these measures can be expensive, the goal has to be as simple a contact system as possible, i.e. without any additional elaborate coatings. This all the easier to realize the lower the current amplitude of the discharge current/surge current can be. Further measures described below (e.g. small diameter, small distance between the gate and the turn-on structure/electrode and a small circumference of the turn-on structure) result in the possibility of making the necessary discharge current/surge current, and thus also the energy input, to be as small as possible.

Yet another advantageous embodiment of the invention provides a capacitor with a capacitance predetermined in accordance with the predetermined energy input, which provides the turn-on signal in a charged state, wherein the capacitor can be electrically connected between the gate electrode and the front-side electrode and/or the rear-side electrode by means of an electronic switch.

For example, the capacitor may be charged via a special switch assembly, so that the capacitor energy comes from the load circuit present at the semiconductor component. Alternatively, the capacitor may also be charged via gate control electronics, or the capacitor may also be situated on the primary side of a trigger transformer.

In the case of conventional thyristor structures, the diameter of the gate center, i.e. from the middle (center) of the semiconductor component to the start of the cathode emitter (front-side turn-on structure), is in the range of 10 mm to 20 mm, typically perhaps at 15 mm in the case of larger thyristors with a component diameter>3". Because of this spatial extent, the discharge energy, and thus also the energy density, must be selected so as to be sufficiently large for being able to generate a reliable pre-destruction.

On the other hand, however, the destructive energy stored by the capacitor cannot be selected so as to be of any size. The energy stored in the capacitor is $(C \times U^2)/2 = Q^2/(2 \times C)$. In order to obtain a large current for the destruction, a sufficiently large capacitance has to be selected, e.g. 4 mF. For charging voltages of 30 V to 40 V, an energy of 1.8 Ws to 3.2 Ws can be reached therewith. Thus, the attainable current (ΔQ/Δt) can be estimated. Assuming a (discharge) time unit of 100 μs, and if the charge ΔQ stored in the capacitor is determined from the energy, this yields large current pulses/current surges in the range of 1.2 kA to 1.6 kA. Assuming that this current flows radially symmetrically from the gate contact on to the inner edge of the electrode (e.g. cathode) (assumption: current flows directly from the gate metal to the circular inner edge of the cathode metal, but not into gate fingers that may possibly be provided), this results in a line-specific current density at the start of the inner circular cathode emitter (typical circumference of the circular inner cathode edge: approx. 50 mm) of approx. 20 to 30 A/mm. Assuming a depth of 50 μm to 0.05 mm for the depth of the conductive base region, this yields a current density in the range of 500 A/mm$^2$ at the start of the inner cathode emitter. This value has to be so large in the end that the desired pre-destruction is produced there, i.e. in the region of the inner cathode emitter, wherein the very short duration of the current must also be taken into account. The shorter the duration of the current or the pulse length, the higher the applied current or charge have to be selected to be.

In a conventional thyristor structure, the region of the p-zone which is highly resistant relative to the metal and, additionally, one or several annular amplifying gates are located between the metal edge of the gate contact and the inner edge of the cathode emitter. Both result in an increased resistance in this region which, with this pulse-shaped current load, causes a correspondingly high voltage drop. However, this can result in a failure in the region of the amplifying gate or generate an unwanted pre-destruction in this region. However, this must be avoided at any cost, because this region is not located within the pressed region of the contact electrodes. A shorting at this location results in plasma being "blown out" from the gate feed (location in the ceramic capsule through which the gate wire is fed).

Therefore, the semiconductor component according to the invention preferably has the following features:
Smallest possible distance between the radially outer metal edge of the gate connection G and the radial inner edge of the turn-on structure (emitter structure) in order to prevent the destruction in the region between the gate connection and the turn-on structure, i.e. in a possibly non-pressed region;
Omission of amplifying gate stages;
As small a diameter as possible for the circular gate metal connection and the inner edge of the turn-on structure (e.g. only 1.75 mm to a few millimeters);
No use of long gate fingers, because the specific current density or energy density that is supposed to result in the destruction is reduced thereby, wherein the current-carrying surface is the product of the circumference and the depth of the base region (approx. 0.05 mm);
As small an inner diameter as possible of the emitter or the turn-on structure. This is also advantageous in that the energy input for the pre-destruction, and thus also the capacitance of the capacitor, can be reduced. Instead of circular turn-on structures, only ring segment-shaped turn-on structures may be used, for example;
Directing the discharge current/surge current in a targeted manner only onto a small location of the inner edge of the turn-on structure by arranging a highly resistant resistance region in the base region between the gate metal and the inner edge of the cathode metal; Thus, the discharge current/surge current primarily flows only between the gate metal and the turn-on structure or a small region of the turn-on structure, which results in an increased energy density there.

Particularly preferably, at least one region of the base region containing the emitter structure, which forms the operative electrical connection between the gate electrode and the emitter structure, may be configured in such a way that an electrical signal supplied to the gate electrode with a current intensity of at least about 1 A, preferably at least about 2 A and more preferably between about 5 A and about 10 A can be used for turning on/pre-destroying the emitter structure. This is to be understood to mean that the region of the base region embedding the turn-on structure between the trigger structure and the respective turn-on structure can be configured in such a way that the turn-on structure can be turned on, by means of the trigger structure, with an overdrive factor of at most 10, preferably at most 5, more preferably at most 3, wherein a minimum turn-on current causing the turning-on/pre-destroying of the turn-on structure is at least about 1 A, preferably at least about 2 A, and more preferably between at least about 5 A and, at most, about 10 A.

The trigger or turn-on current of a conventional thyristor depends on the specific sheet resistance of its cathode-side base region into which the cathode-side emitter is embedded, and, with respect to the process, has to be adjusted in such a way that the trigger or turn-on current values are typically within the mA range, particularly assume values of between 30 mA (125° C.) and 400 mA (room temperature) and, accordingly, lie within a relatively narrow range. It is thus ensured, for example, that conventional thyristors safely withstand the high turn-on loads when switching large currents with very high rates of rise of the current at the start of the turning-on process, if they are controlled by conventional trigger or turn-on current generators with precisely defined trigger or turn-on current curves (trigger or turn-on current amplitude and duration).

Because the short-circuit semiconductor component according to the invention is supposed to be shorted after being triggered once, a considerably higher minimum turn-on current is preferably chosen for the short-circuit semiconductor component, particularly in the ampere range, e.g. at least 1 A or at least 2 A, or even at least 5 A to about 10 A, because, on the one hand, the effort for inspecting the specific sheet resistance of the base region containing the emitter structure during the production of the short-circuit semiconductor component can thus be reduced considerably and, on the other hand, much lower requirements may be laid down for the trigger or turn-on current generators generating the electrical turn-on signal, so that less expensive control concepts are possible.

Moreover, it is to be understood that, despite the relatively high trigger or turn-on current selected in the inventive short-circuit semiconductor component according to this embodiment, the short-circuit semiconductor component according to the invention is still controlled only in a slightly overdriven manner, e.g. with an overdrive of 10 A/5 A=2. However, if a trigger or turn-on current is used in a conventional thyristor that is in the ampere range, e.g. in the range between 5 A and 10 A, instead of in the mA range as described above, this results in an overdriving of a conventional thyristor that is higher by one or two orders of magnitude, with an overdrive factor or, for example 10 A/100 mA=100. The large overdrive factor enables the conventional thyristor to turn on rapidly.

In the short-circuit semiconductor component according to the invention, an overdrive that is selected to be weak (with, however, a large trigger or turn-on current in the ampere range) promotes the desired failure of the component, i.e. the desired one-off, irreversible shorting. In particular, the specification of a maximum overdrive in the sense of the present embodiment ensures a minimum energy input via the trigger structure, which is required for the desired pre-destruction.

Furthermore, a large turn-on current yields further advantages. For example, a simple detection mechanism can be provided for checking the readiness of the short-circuit semiconductor component by means of a permanent test current between the connections of the gate electrode and the electrode contacting the emitter structure to be turned on/destroyed by the gate electrode (front-side or rear-side electrode), wherein the test current is in that case selected to be very much smaller than the turn-on current. Moreover, a large turn-on current also offers a higher level of EMC protection, e.g. with respect to false triggering caused by rapid changes of very high voltages and currents in the vicinity of the short-circuit semiconductor component, since the susceptibility to such false triggering processes increases with a decreasing trigger or turn-on current.

In addition to the above-described turn-on current intensities, turn-on current much smaller than 1 A can be set in the short-circuit semiconductor component according to the invention in special cases, e.g. turn-on current intensities of less than 1 A down to about 500 mA, or even less, down to about 100 mA.

According to another advantageous embodiment of the invention, the trigger structure is a breakdown structure, and the turn-on signal is the electrical voltage present between the front-side electrode and the rear-side electrode. The breakdown structure is characterized in that, depending on the electrical voltage applied to the outer electrodes of the short-circuit semiconductor component, which causes a corresponding voltage drop across the breakdown structure, it permits, upon reaching or exceeding a breakdown voltage determinable for the breakdown structure, a steep rise in current in the form of an avalanche current preferably not limited by a protective resistance, through which the pre-destruction of at least one of the two semiconductor junctions can be attained with the breakdown structure configured as a trigger structure.

For example, the breakdown structure may be configured as a BOD structure (BOD: Break Over Diode). Other breakdown structures, which functionally act in a similar way and which are known per se from conventional light-triggered thyristors (LTTs), can also be used, e.g. a breakdown structure having a common du/dt protection and/or a breakdown structure including a common circuit-commutated turn-off time protection with a local increase of carrier lifetime. Furthermore, the breakdown structure constitutes a further measure for avoiding a blocking failure in a radially outer edge region of the short-circuit semiconductor component in the case of an unpredictable overvoltage. In this case, the level of the breakdown voltage of the breakdown structure is adjusted in such a way that it assumes its lowest value of the entire semiconductor body precisely at the location of the breakdown structure and thus reliably prevents a breakdown in the edge region. For this purpose, the breakdown structure is disposed in the semiconductor body so as to be far away from the edge, in particular close to the center. For example, the breakdown structure may be configured in the form of a circumferentially closed structure which surrounds the center but is (slightly) spaced apart therefrom, such as an ring and/or polygon structure. In other cases, however, it may also be disposed directly in the center of the semiconductor body. Herein, the circumferential direction is to be understood to be an extending direction parallel to the front side or the rear side of the semiconductor body and substantially perpendicular to the radial or lateral direction of the semiconductor body.

In an embodiment of the invention that is particularly convenient to manufacture as regards its construction, a turn-on structure, which, for example due to a trigger structure disposed in the center of the semiconductor body, is disposed so as to surround this center and the trigger structure, spacing them apart, has a closed circumference. For example, the turn-on structure may be configured as a closed ring and/or polygon structure. Herein, the circumferential direction is to be understood to be the extending direction of the turn-on structure parallel to the front side or the rear side of the semiconductor body and substantially perpendicular to the radial or lateral direction of the semiconductor body.

According to yet another advantageous embodiment of the invention, the turn-on structure is spaced apart in the radial direction from the trigger structure and has at least one turn-on structure segment with a turn-on structure width, which extends in a circumferential direction of the semiconductor body and is smaller everywhere than a closed circumferential length in the circumferential direction through the turn-on structure segment. In other words, the turn-on structure in this exemplary embodiment is not circumferentially closed, as is the case, for example, in a closed ring and/or polygon structure. This means that the circumferential turn-on structure width of the at least one turn-on structure segment, which may correspond to, for example, only one ring segment, is smaller in any case than a circumferential turn-on structure width, which would correspond to a closed ring and/or polygon structure of the turn-on structure, and thus to a circumferential angle of the closed ring and/or polygonal turn-on structure of 360 degrees. Since a turn-on structure with a circumferentially closed polygon and/or ring structure, which is radially spaced apart from the center of the semiconductor body, has a certain minimum surface resulting from the production process because the lateral turn-on structure width, with respect to the process, cannot be manufactured to have less than a certain lateral minimum structure width, for example, which may be at least about 50 µm, for example, the surface of the turn-on structure that is effective in the fusing of the semiconductor body can be reduced still further by means of the present advantageous embodiment of the short-circuit semiconductor component according to the invention, whereby particularly small fusing currents resulting in the reliable shorting of the semiconductor body can also be realized. Accordingly, it would be possible, for example, to provide a minimal, single turn-on structure segment with a lateral turn-on structure width of about 50 µm and a circumferential turn-on structure width, i.e. a circumferential length, of also about 50 µm in the semiconductor body, which permits the design of a short-circuit semiconductor component according to the invention with a fusing current in the order of magnitude of a few mA.

According to yet another advantageous embodiment of the invention, at least two turn-on structure segments that are separate from each other are provided in the circumferential direction of the semiconductor body. Preferably, they are equidistantly spaced apart in order to obtain a substantially circumferentially symmetrical configuration of the short-circuit semiconductor component, which causes a more uniform current distribution in the semiconductor body both of the turn-on current for turning on or pre-destroying the turn-on structure and of the fusing current for producing the shorting in the semiconductor body, and thus a more uniform heat distribution, particularly during shorting, over the entire semiconductor body, i.e. a more uniformly distributed mechanical load.

Yet another advantageous embodiment of the invention provides that the electrical resistance in the base region containing the turn-on structure is increased at least in a portion of the radial interspace between the turn-on structure and the trigger structure (herein also referred to as the resistance region of the base region) with the exception of at least one forward channel electrically coupling the at least one of the turn-on structure segments with the trigger structure. As a result, the turn-on current flowing from the trigger structure to the turn-on structure can be directed in a targeted manner to the single turn-on structure segment, in order to reliably turn on or pre-destroy the latter if required, for initializing the shorting of the short-circuit semiconductor component according to the invention. By means of the turn-on current, which is directed in a targeted manner on to the at least one turn-on structure segment by means of the on-state channel, the overall turn-on current, which is required for turning on/pre-destroying the or all turn-on structure segments and is provided by the trigger structure, can advantageously be additionally reduced compared to a turn-on current distribution that would otherwise extend homogenously in all radial directions.

An increased resistance in the resistance region of the base region compared with the resistance value in the on-state channel is supposed to be understood to be such a difference in size of the resistances that safely cannot be ascribed to the production-related dimensional deviations of commonly accepted manufacturing tolerances, but is the result of targeted actions. For example, the resistance in the resistance region may thus be increased in a targeted manner by a concentration of the charge carriers of the same conduction type as that of the rest of the base region that is considerably smaller compared with the rest of the base region, and/or by introducing into the resistance region of the base region a so-called pinch resistor of a conduction type complementary to the base region conduction type, whereby the resistance in the resistance region of the base region is also increased in a targeted manner due to a reduction of the effective conduction cross-section.

If a merely small (annular) turn-on structure segment is used, the latter is supposed to be controller in case of a failure in order to generate a complete shorting therein. The problem with this structure is that the resistance between the metal edges of the gate contact and of the electrode contact is so small, due to the rather high specific conductivity of the base region, that a large part of the current that is actually supposed to destroy the turn-on structure flows into the entire metal contact of the electrode metallization and thus reduces the energy density of the discharge current pulse/surge current to such a great extent that a pre-destruction does not occur. Therefore, an additional resistor or a resistance region may be installed in the base region, as described herein.

As an alternative or addition to the additional resistance region, it is also conceivable that the very thin insulator layer in the nanometer range, which was already described above, is applied in the entire region of the electrode contact. For example, a full-surface SiO2 layer can be produced on the semiconductor surface (front side or rear side) of the semiconductor body. In that case, this insulator layer can be removed within the gate region or within the inner edge of the turn-on structure and in a small region of the turn-on structure by means of photostructuring, so that a direct contact between the silicon surface of the semiconductor body and the metallization of the electrode is produced only in those regions that are free of this insulator layer. Thus, the majority of the surface of the electrode metallization has no direct contact with the silicon/semiconductor body surface. In this manner, the current is "forced" to flow directly on to the segment-like turn-on structure region, which now also corresponds to the region not covered by the additional insulator layer. In this way, the additional resistance regions may also be omitted.

However, other embodiments are also possible with this insulator layer, as will be explained below.

Usually, the turn-on structure must not be covered radially inwards by the electrode metallization or the contact disk, because otherwise the turn-on current flows from the gate contact G directly via the base region to the electrode connection without the turn-on structure being turned on or triggered, because the electrode contact would in this case bridge or short-circuit the turn-on structure. This means that in all semiconductor components configured without the insulator layer, the turn-on structure protrudes radially inwardly underneath the electrode contact.

With the additional locally applied insulator layer described herein (a very thin thermal oxide layer (e.g. SiO2) is preferably produced at the end of all high-temperature steps for manufacturing the semiconductor body, which is then structured by photolithographic processes), the electrode contact or the contact disk may now reach up to the radially inner inner edge of the turn-on structure without the latter being bridged. Thus, the region of the pre-destruction is always located underneath the pressed contact region. This measure constitutes a further improvement. Whether it is ultimately necessary depends on whether the radially inward protrusion of the turn-on structure or of the emitter underneath the electrode contact towards the gate region has a critical effect. In the worst case, the emitter layer protrudes towards the gate contact from underneath the electrode contact to such an extent that this results in a pre-destruction and in that, in the end, plasma can escape towards the outside towards the gate supply contact (pressure wave "blows" out towards the gate contact).

If the insulator layer is applied over a large surface area or only at a location where the turn-on structure is supposed to trigger or the pre-destruction is to be produced, and the failure load current subsequently produces the shorting at this location, there is no direct electrical contact transition there between the metallization of the respective electrode and the semiconductor surface—this is either the base region or a partial area of the turn-on structure configured as an emitter. This could result in a breakdown between the insulator layer and the metallization, because the blocking current, in the insulated region in the semiconductor body, encounters a long way to the next directly coupled contact region. As a result, large transversal (lateral) voltages parallel to the semiconductor surface occur in the base region underneath the insulator layer, which may then result in an electrical breakdown. To prevent this, the insulator layer should have the openings or recesses described herein at certain intervals, similar to a short-circuit structure in the large-surface turn-on structure. Then, the blocking current can flow to the corresponding electrode connection if a blocking voltage is applied, without too large electrical voltages occurring in the associated base region. These may be annular recesses or also short-circuit holes, each of which has to be of sufficient size in order to prevent the lateral voltage drops, which are unwanted in the base region and caused by the blocking current. If the lateral width of an insulator layer configured as an insulator ring is not too wide, such breaks may also be omitted.

Moreover, with the additional insulator layer, the lateral position of the turn-on structure may be shifted to any extent away from the inner edge of the electrode contacting the base region towards the component center, or towards the outside. This may be of importance if there is a danger that, in the case of a failure event with a current in the 100 kA range, the shorting can expand into the non-press-contacted region towards the gate connection (danger of blowout in the region of the gate wire feed).

The formation of the insulator layer by means of a thermal oxide, e.g. SiO2, is advantageous in that it can be deposited with conventional diffusion processes at the very end of the high-temperature steps or prior to the deposition of the metal layers, i.e. through a thermal oxidation in an oxygen atmosphere at high temperatures in the range of 800° C.-900° C. However, if this would be disadvantageous with respect to the adhesion of the metallization for various process-related reasons, a different insulator layer, e.g. Si3N4 (silicon nitride) may also be deposited. Such insulator layers can also be deposited from the gas phase with suitable processes such as LPCVD (Low-Pressure Chemical Vapor Deposition) at temperatures far below 1000° C. As a pre-treatment to metal deposition, chemical etching materials are used for reliably removing the natural oxide layer (in the range of 20 nm to 40 nm) on the Si surface, e.g. a buffered HF etching mixture. In contrast to a thermal oxide, a nitride layer is resistant to HF-based etching solvents.

What is important for all deposited insulator layers is that their thicknesses, compared with the thickness of the metal layer of the electrode, is not selected to be too large in order to avoid a step at the edge of the insulator layer. Therefore, an insulator layer thickness in the range from 50 nm to 100 nm is to be chosen. Compared with the large thickness of the electrode metallization, which is in the range of typically 10 µm to 30 µm, the step at the transition to the insulator layer is then negligible.

The insulator layer is to be applied only locally, but always in such a way that the electrical contact between the conductive Si surface of the semiconductor body and the electrode metallization becomes locally very highly resistant or is completely avoided, but, as described above, there must be a (still) sufficient direct electrical contact between the electrode and the corresponding base region.

Since a breakdown structure configured, as described above, as a trigger structure or turn-on structure draws its turn-on signal from the electrical voltage applied to the outer two electrodes of the semiconductor body, and thus no further external, e.g. optical or electrical, turn-on signal has to be supplied to the short-circuit semiconductor component if the turn-on structure or the trigger structure associated with a turn-on structure is only configured as a breakdown structure, then a diode housing that has no additional connection for an additional external turn-on signal can be used, particularly advantageously, for accommodating a short-circuit semiconductor component configured in this manner. In such a case, the breakdown structure may particularly preferably be disposed in the center of the semiconductor body, wherein the front- and rear-side electrodes may extend completely across the center and thus across the turn-on structure, because no recess for supplying the external turn-on signal need be provided.

According to another advantageous embodiment of the invention, the turn-on structure has at least one turn-on structure finger extending radially outwards from the rest of the turn-on structure in the lateral direction (also referred to as a finger structure of the turn-on structure). In other words, the at least one turn-on structure finger protrudes radially outwards from the rest of the turn-on structure. As was already explained above, the minimal fusing current integral at which the shorting of the short-circuit semiconductor component is supposed to occur is substantially determined by the lateral turn-on structure width of the respective turn-on structure, e.g. by a lateral turn-on structure width of an emitter structure or a lateral breakdown structure width of a breakdown structure, and equivalently, by the surface of the turn-on structure that is effective during the fusing of the semiconductor body. In other words, the small ratio, which is intended according to the invention, of the lateral turn-on structure width of the corresponding turn-on structure to the lateral electrode width of the associated electrode applied to the base region including the turn-on structure, causes a fusing current which is as small as desired and which reliably results in a shorting of the short-circuit semiconductor component, so that a relatively small fault or short-circuit current carried by the short-circuit semiconductor component between the front-side and the rear-side electrodes reliably shorts the short-circuit semiconductor component in the desired manner and thus establishes the non-reversible, low-resistance current-carrying state (short-circuited operational state).

On the other hand, the effective surface of the turn-on structure, e.g. of an emitter structure or a breakdown structure, and thus also the entire surface of the semiconductor body should generally be adapted to the strength of the short-circuit current to be permanently absorbed by the short-circuit semiconductor component in case of a short circuit, in order to prevent, if the surface of the turn-on structure is too small, an explosive start of the fusing process right at the beginning of the flow of the current, resulting in a mechanical destruction of the entire short-circuit semiconductor component, which would constitute a risk to the surroundings. A larger surface of the turn-on structure may have a favorable effect on the size of the lateral extent of the shorted region, wherein a laterally wider extent of the shorted region, due to a greater resulting conduction cross-section, advantageously entails a reduction of the electrical resistance of the short-circuit region in the semiconductor body formed by the shorting. The finger structure of the turn-on structure advantageously permits a compromise to be made between the contrasting demands for a surface of the turn-on structure that is as small as possible in order to reduce the short-circuit or fusing current required for reliable shorting, and a sufficiently large surface for safely carrying the short-circuit current without having to take the risk of a mechanical destruction of the short-circuit semiconductor component, because in the case of the fingered turn-on structure, the current-carrying region of the short-circuit semiconductor component turned on by the turn-on signal is able to spread over a greater circumference.

Moreover, the finger structure helps keeping the fusing region away from the center of the short-circuit semiconductor component. This is advantageous particularly if a trigger structure supplied with an external turn-on signal (e.g. optically or electrically) for turning on the turn-on structure or the short-circuit semiconductor component is located in the center of the semiconductor body. In such a case, the region in which the turn-on signal is supplied to the trigger structure is not covered by the electrode (e.g. cathode or anode electrode) which provides the electrical main connection for the short-circuit semiconductor component and which is applied to the base region having the turn-on structure, so that plasma could escape during shorting from the region of the non-covered front and/or rear side, and could consequently lead to the housing surrounding the short-circuit semiconductor component being damaged, thus endangering the surroundings.

Another advantageous embodiment of the invention provides that, if at least one trigger structure and a turn-on structure with a finger structure as described above are provided, the trigger structure has at least one trigger structure finger, which corresponds to or follows the contour or shape of the at least one turn-on structure finger. A uniform distance, e.g. in the lateral or radial direction and/or in the vertical direction, between the trigger structure and the turn-on structure can thus be ensured over the entire extent of the fingered turn-on structure, so that the trigger structure can act, in the sense of the invention, on the turn-on structure in a uniform manner over the entire extent thereof.

According to another preferred embodiment of the invention, the at least one turn-on structure finger has a maximum lateral, i.e. radial, finger length which is smaller than 4/5 of the lateral electrode width of the electrode applied to the base region having the turn-on structure. Thus, the maximum radial finger length may also be less than 3/4, 2/3, 1/2, 1/3, 1/4, 1/5 of the lateral electrode width, for example. If a trigger structure is provided which also has a finger structure and, as described above, corresponds to or follows the finger structure of the turn-on structure, the at least one trigger structure finger may also have a finger length corresponding to the finger length of the respective turn-on structure finger.

According to yet another advantageous embodiment of the invention, a thickness of the inner region in the vertical direction is greater than 400 μm, more preferably greater than 600 μm, and still more preferably greater than 800 μm or 900 μm, or even 1000 μm. In general, it is found that the danger of an edge failure of the short-circuit semiconductor component in the case of an overvoltage can be avoided by means of an inner region of the semiconductor body that is much thicker compared with a conventional thyristor. There is practically no maximum thickness for the inner region, as is the case in a conventional thyristor, because there are no conduction or dynamic losses for the short-circuit semiconductor component according to the invention that set an upper limit to the thickness of the inner region. For a required voltage class of, for example $V_{DRM}/V_{RRM}$=2.2 kV, a conventional thyristor having a thickness of $W_{n1}$ in the range of about 320 μm and a specific silicon resistance of 85 Ω·cm would have to be used. In contrast, a thickness $W_n$ of about 850 μm may be selected for the short-circuit semiconductor component of the present invention. A specific resistance 270 Ω·cm would result in more than double the symmetrical blocking capacity ($V_{DRM}/V_{RRB}$=5.2 kV) for the semiconductor structure of the semiconductor body according to the invention. Even blocking capacities>10 kV (medium-voltage grids) are possible given a corresponding design of the thickness of the inner region. Together with a setting for the lifetime by means of a high irradiation dosage for the electron irradiation, the blocking current may be adjusted to be very small. Thus, the blocking capability of the short-circuit semiconductor component may be set to be very much higher than the maximum overvoltage occurring during use of the short-circuit semiconductor component, and this without any disadvantageous effects both on the short-circuit semiconductor component and its application. As small a blocking current as possible is of great advantage for the short-circuit semiconductor component according to the invention because blocking voltage is virtually permanently applied to it in use, so that blocking currents that are as small as possible can be obtained and accompanying blocking losses can be kept as small as possible, so that the short-circuit semiconductor component can be operated without an active cooling system. The occurrence of a failure in the edge region of the short-circuit semiconductor component, which is critical with respect to the housing breaking current, is also substantially eliminated by means of this measure.

According to yet another advantageous embodiment of the invention, the front-side electrode and the rear-side electrode are each press-contacted in an electrically conductive manner by means of a metallic contact disk. In this case, the respective contact disk may preferably have the same lateral width as the corresponding electrode, so that the contact disk covers the corresponding electrode completely. The contact disks may be firmly connected to the corresponding metal electrode of the semiconductor body, e.g. by means of an alloy, or only rest thereon loosely. The contact disks may be configured as pure molybdenum disks or consist of a combination of a molybdenum and a copper disk, wherein molybdenum is preferably in direct contact with the semiconductor body metallization. Advantageously, the present invention ensures, as described above, that the region of the shorting produced between the front-side and the rear-side electrode of the short-circuit semiconductor component in the case of a short circuit is always located in the region of the short-circuit semiconductor component press-contacted by the metallic contact disks.

The thickness of the molybdenum disk or the combination of molybdenum and copper is preferably between 1 mm and 5 mm. In this case, it is to be understood that the thickness of the contact disks can be adapted to the strength of the short-circuit current flowing through the short-circuit semiconductor component. During shorting in the case of a short circuit operation, the silicon of the semiconductor body and the metal regions of the contact disks fuse together in such a way that a metallic zone is formed. Depending on the case of application or the strength of the maximum short-circuit current to be permanently conducted, the thickness of the contact disks is designed in such a way that the sides of the contact disks facing away from the respective electrodes of the semiconductor body substantially exhibit no all-too great change subsequent to the occurrence of fused portions. In particular, a press-contact, which ensures an electrically conductive, low-resistance and thermal coupling, is to be maintained, in the case of a short-circuit operation of the short-circuit semiconductor component, between the contact disks contacting the metallizations of the semiconductor body and respective contact stamps, e.g. copper stamps, of a housing accommodating the short-circuit semiconductor component, which are pressed against the contact disks with a sufficient surface pressure, so that the generation of an arc outside the region press-contacted by the contact disks after the short-circuit semiconductor component is triggered is reliably prevented. In no case is the fusing region supposed to escape through the (copper) contact stamps to the outside during the shorting.

It is to be understood that the above-described different types of turn-on structures may be combined in any way within a single short-circuit semiconductor component according to the invention, particularly if more than one turn-on structure is provided in the short-circuit semiconductor component. Mutatis mutandis, the above-described different types of trigger structures can also be combined with each other in a single short-circuit semiconductor component according to the invention, if more than one trigger structure is provided in the short-circuit semiconductor component. The above-described different types of trigger structures can also be combined with the different types of turn-on structures in any way.

Thus, the short-circuit semiconductor component according to the invention can be turned on, for example, by means of one or several electrical turn-on signals, with corresponding turn-on structures being provided in the semiconductor body. The turn-on signals may be supplied to the short-circuit semiconductor component only on one side, e.g. on the front side of the semiconductor body, or also on both sides, i.e. on the front and rear sides of the semiconductor body, with corresponding trigger structures being provided on the respective sides of the semiconductor body.

Furthermore, the short-circuit semiconductor component according to the invention may include one or several breakdown structures as trigger structures or turn-on structures, wherein several existent breakdown structures may be designed for the same or respectively different breakdown voltages.

The breakdown structures serving as a trigger structure, e.g. a BOD structure, but also a breakdown structure having a du/dt protection, and a breakdown structure with a circuit-commutated turn-off time protection with a local increase of carrier lifetime, may be arranged within an amplifying gate structure, i.e. laterally spaced from the front- or rear-side electrode and, accordingly, outside a region electrically contacted by these electrodes. The arrangement within an amplifying gate structure is not an absolute necessity, however. The breakdown structures serving as both trigger structure and turn-on structure may also be disposed vertically underneath the front- or rear-side electrode, e.g. in the base region electrically contacted by the respective electrode.

Moreover, the trigger and turn-on structures described herein can be provided only on one side, i.e. only in the front-side or the rear-side base region, or also on both sides, i.e. in both base regions of the semiconductor body of the short-circuit semiconductor component according to the invention.

Figure 2:
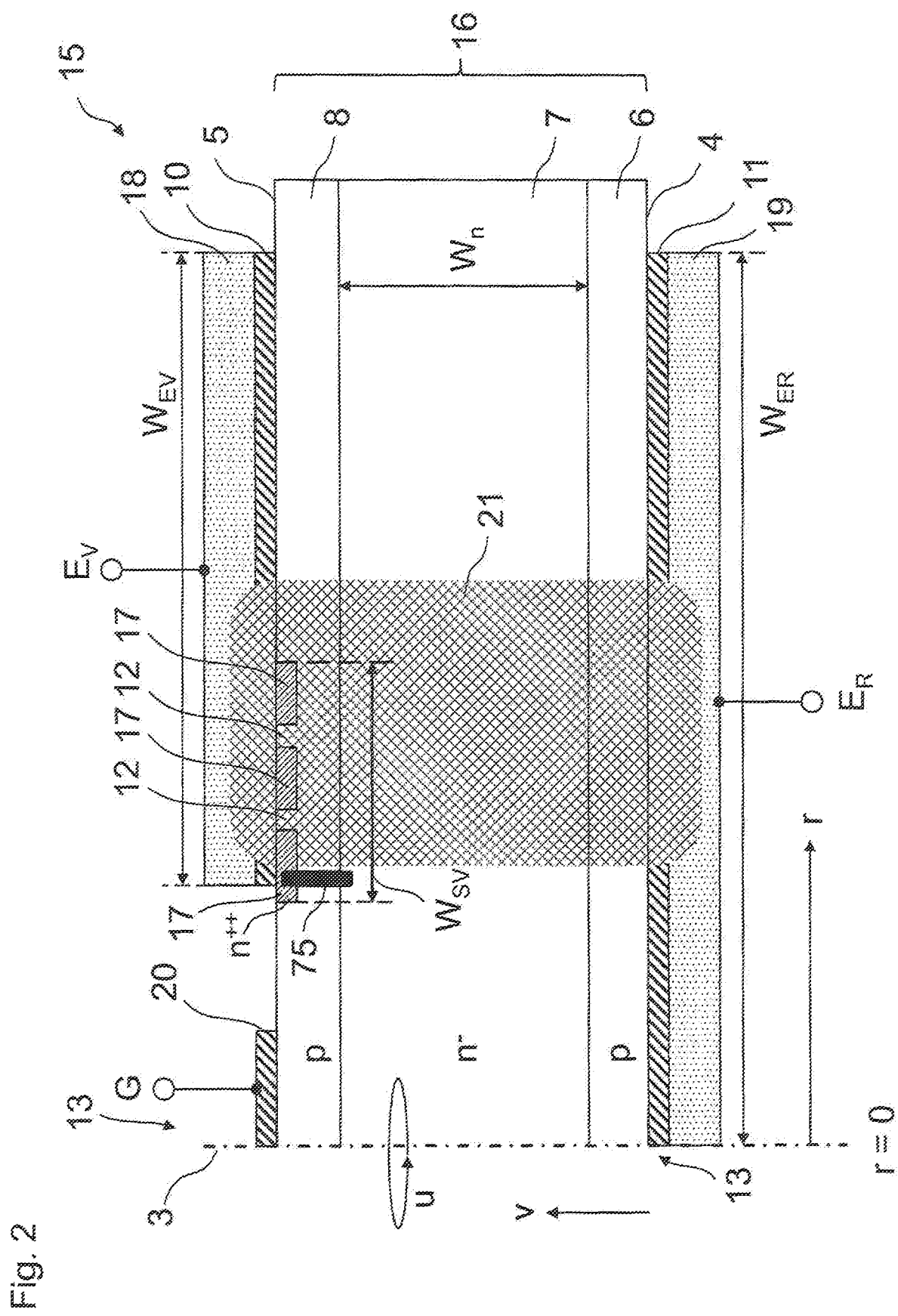
Figure 3:
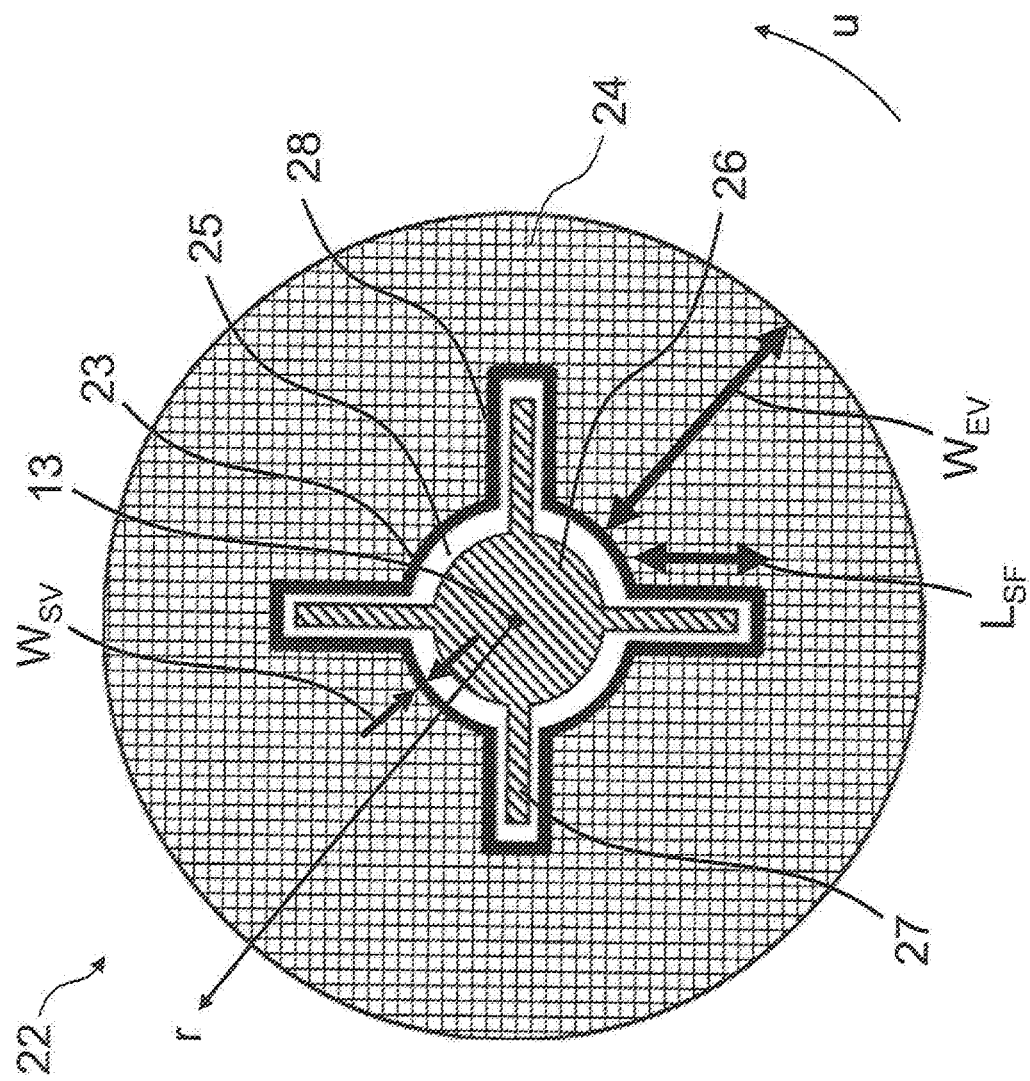
Figure 4:
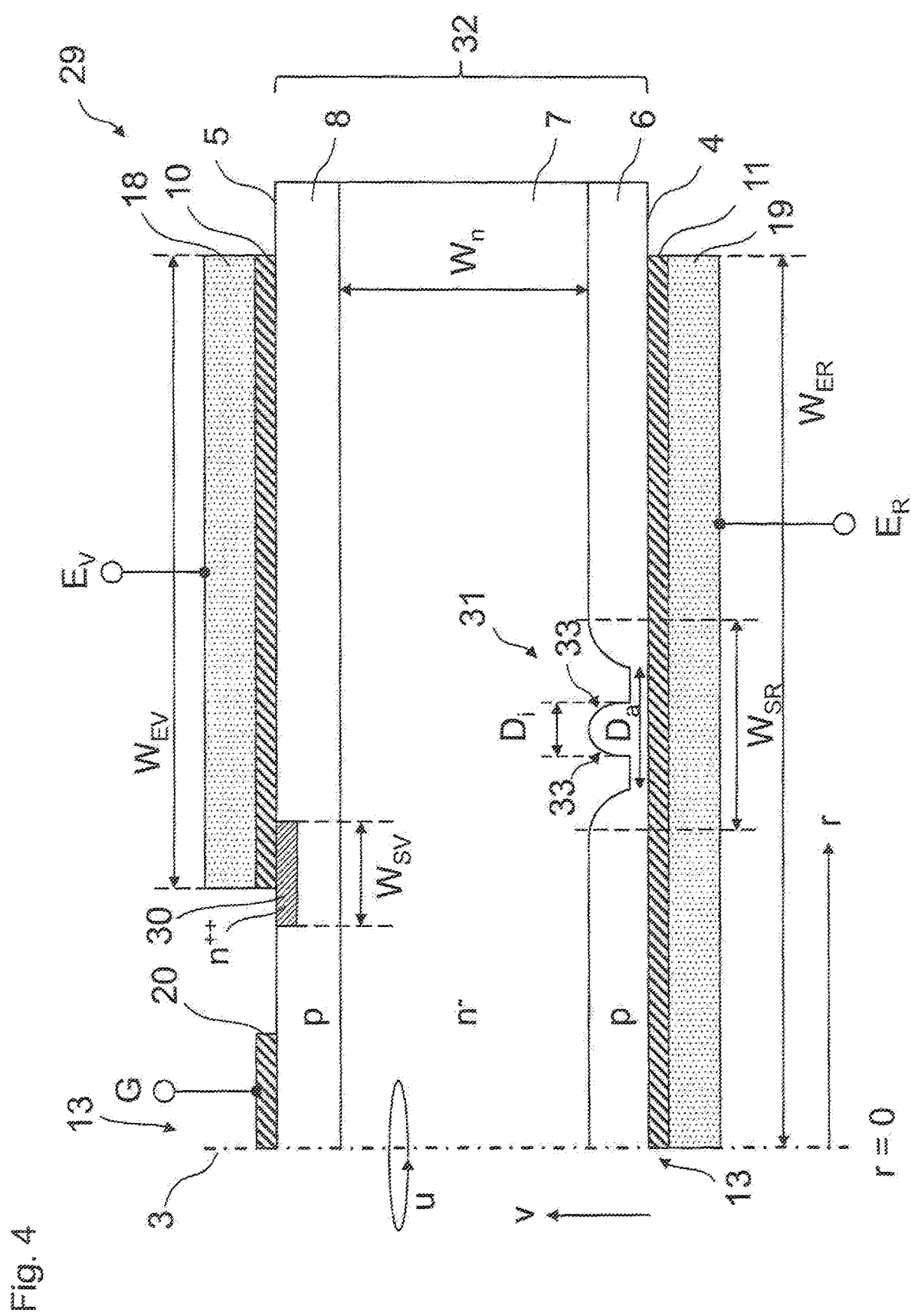
Figure 5:
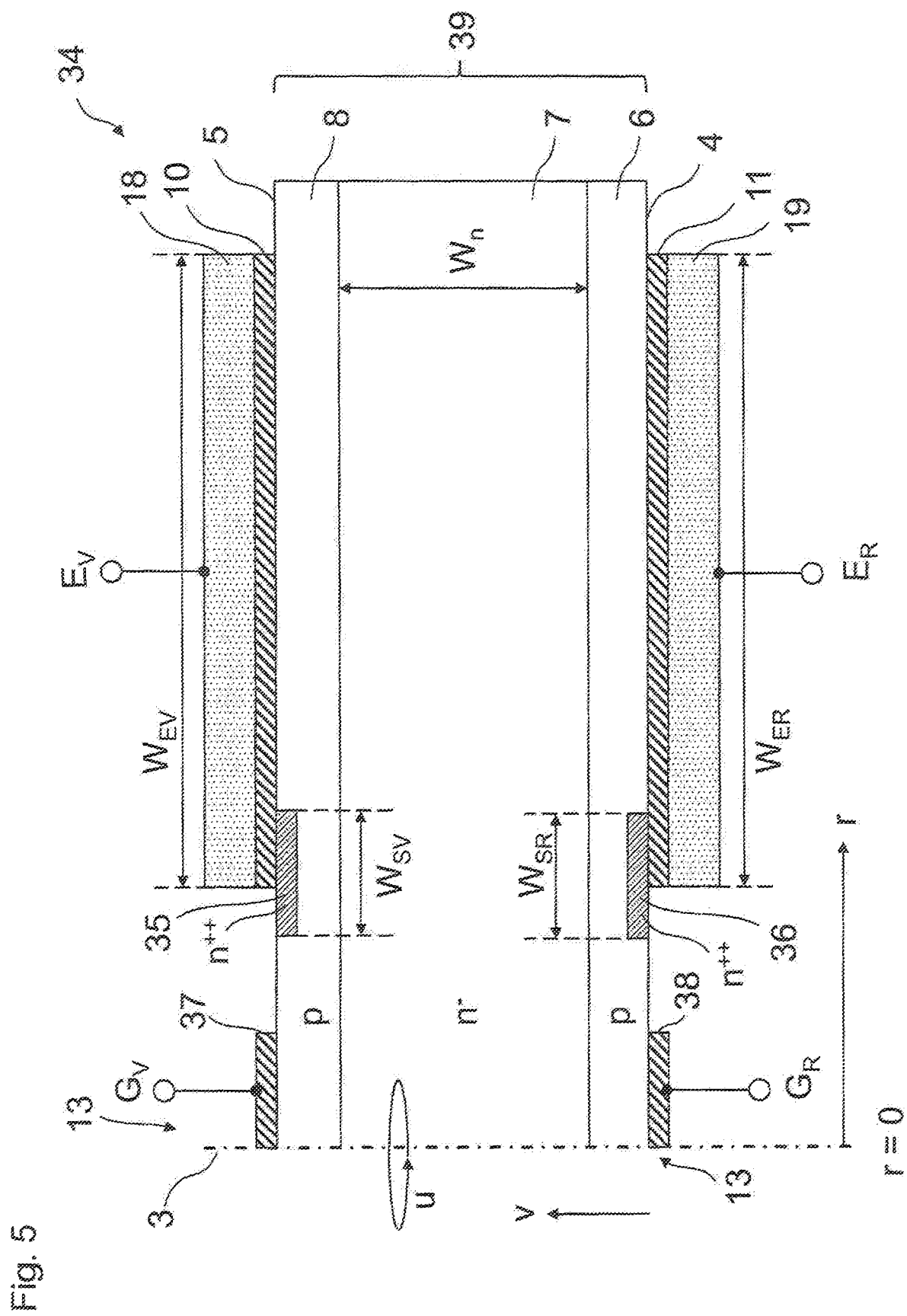
Figure 6:
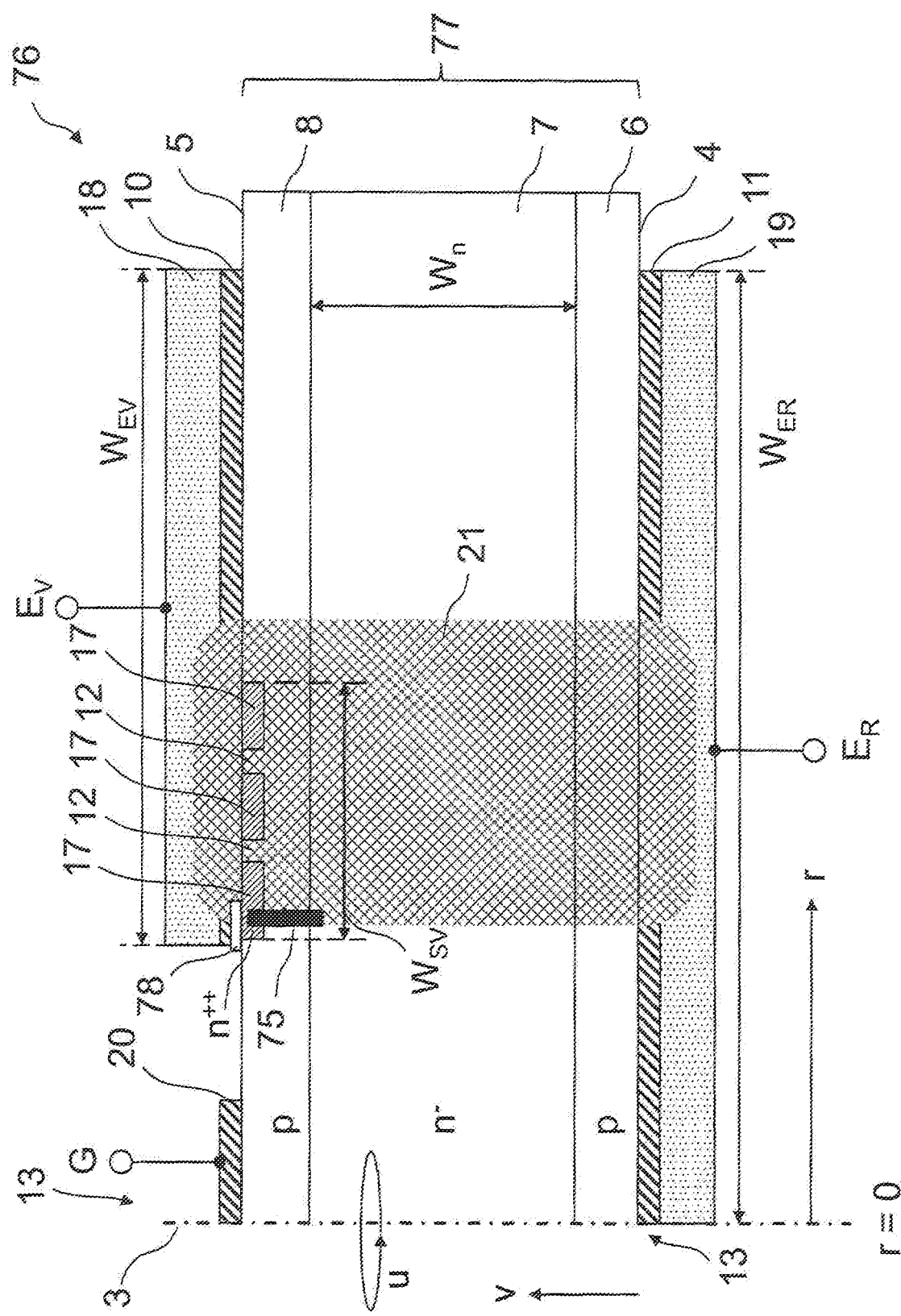
Figure 7:
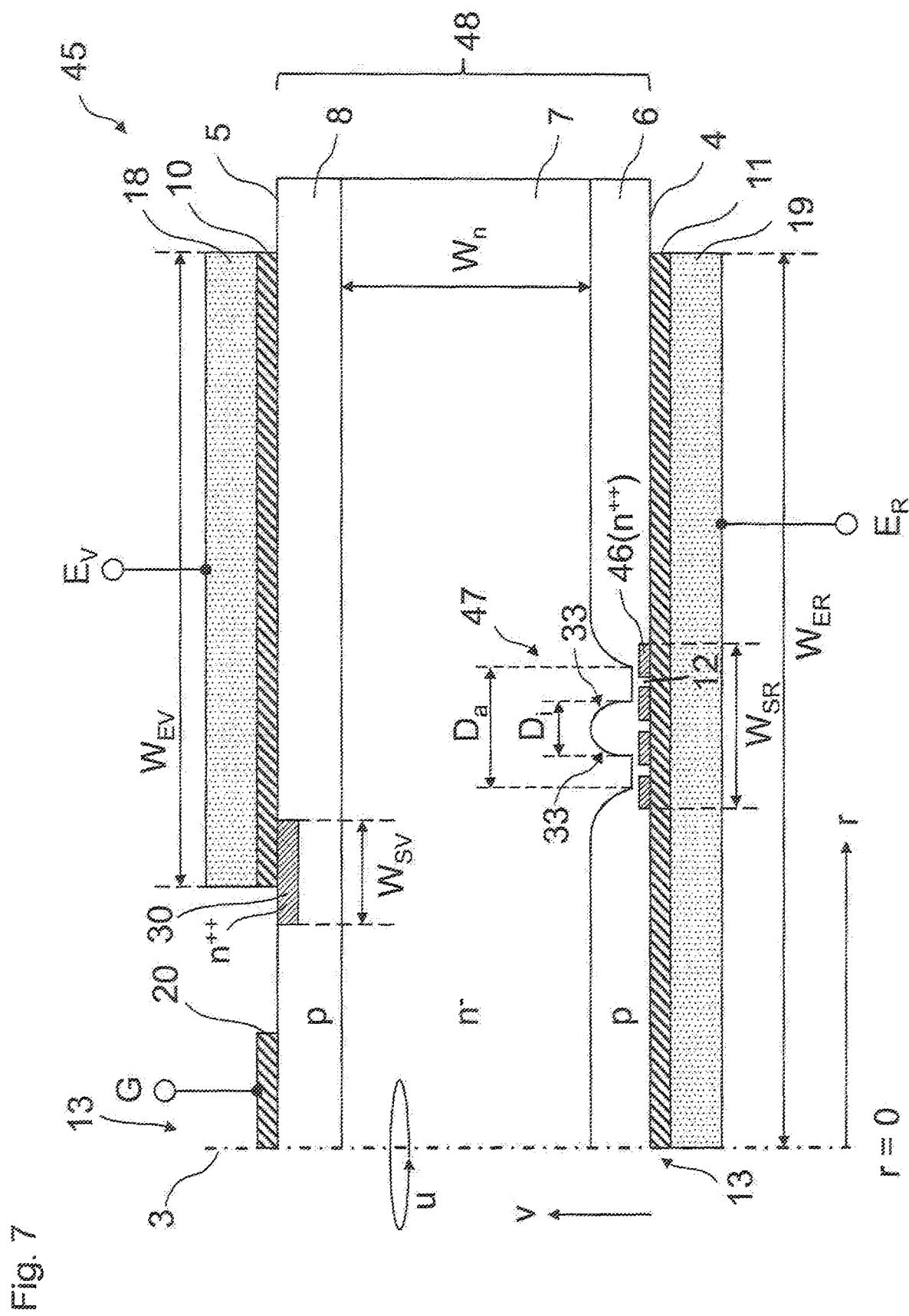
Figure 8:
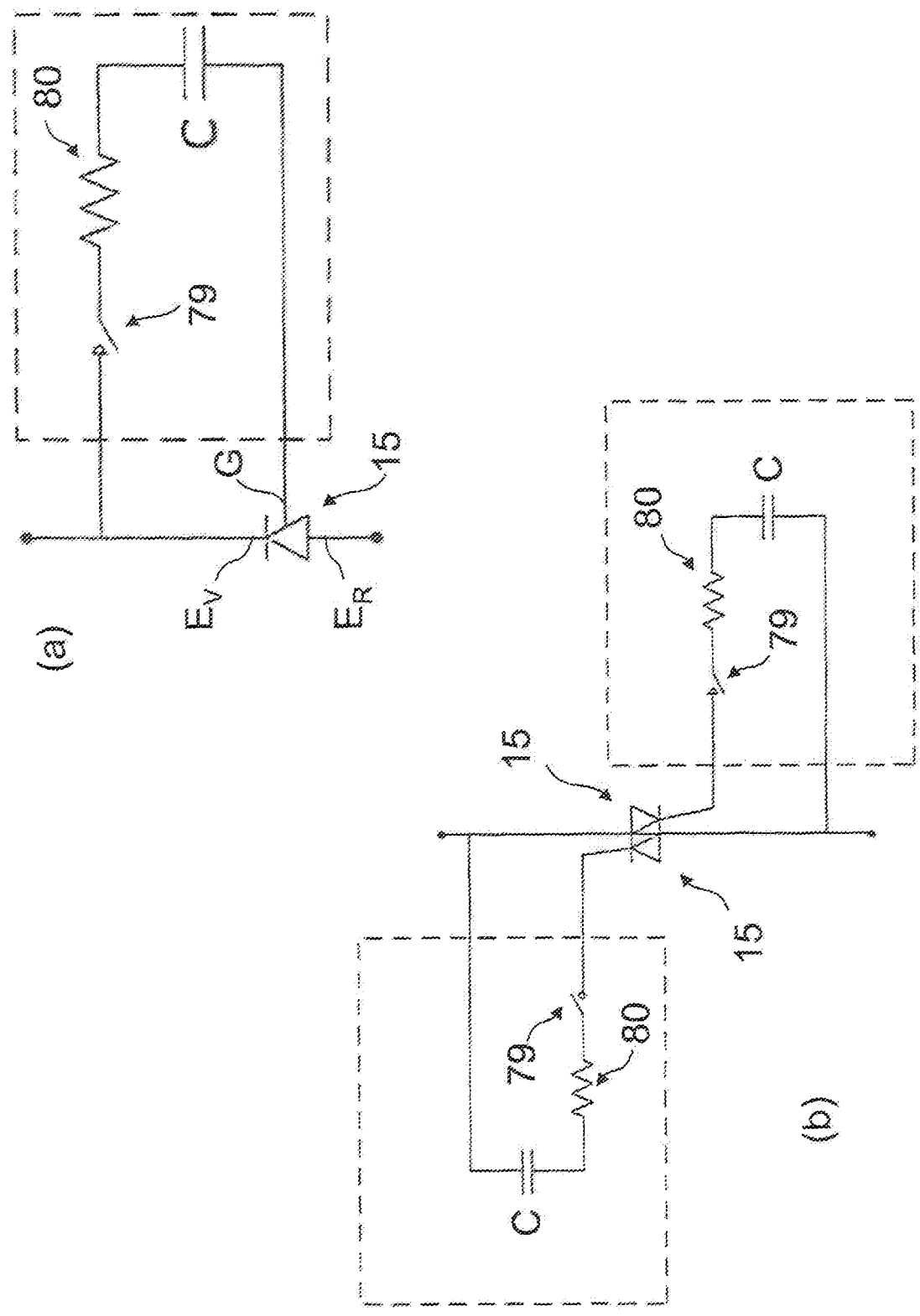
Figure 9:
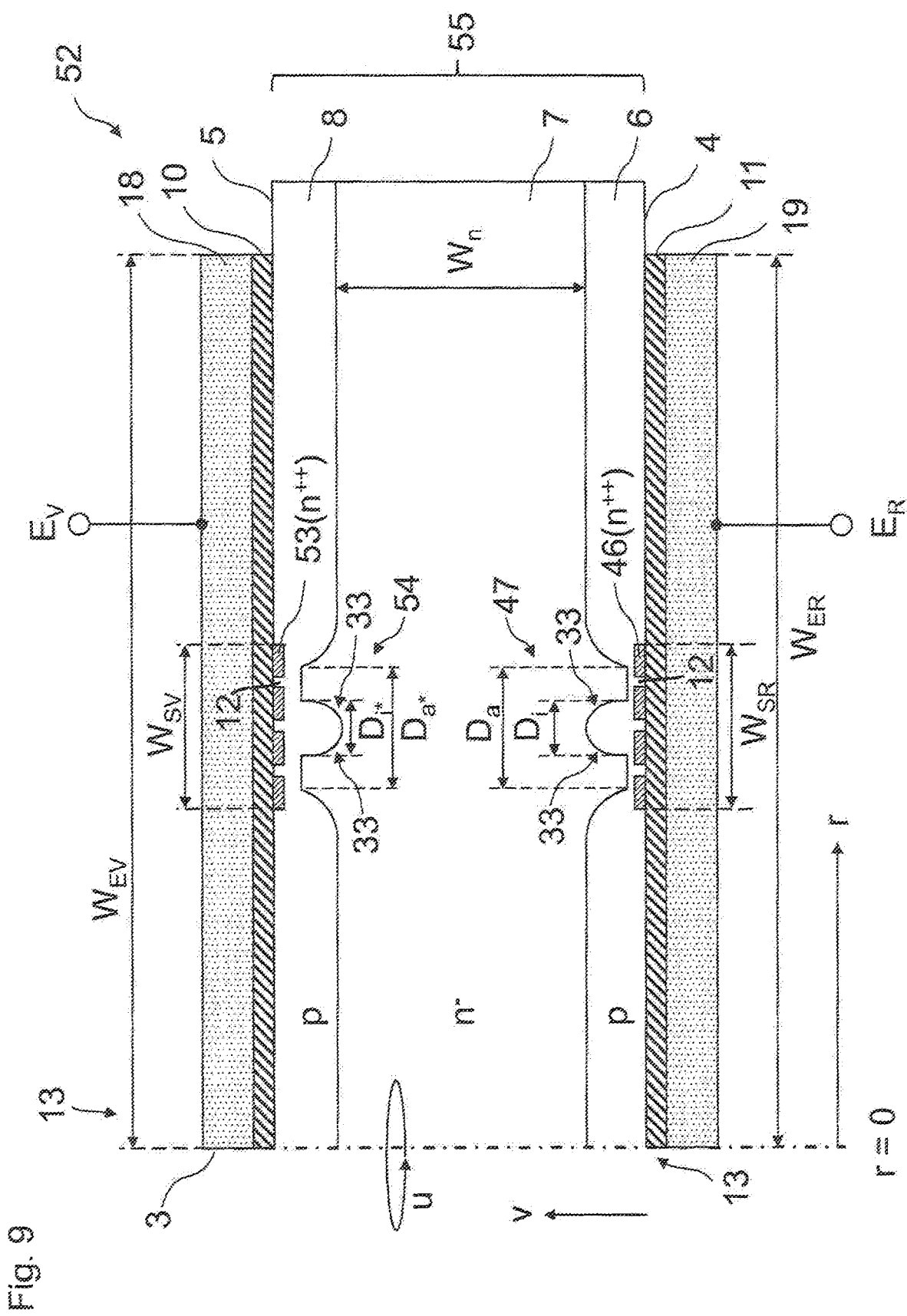
Figure 10:
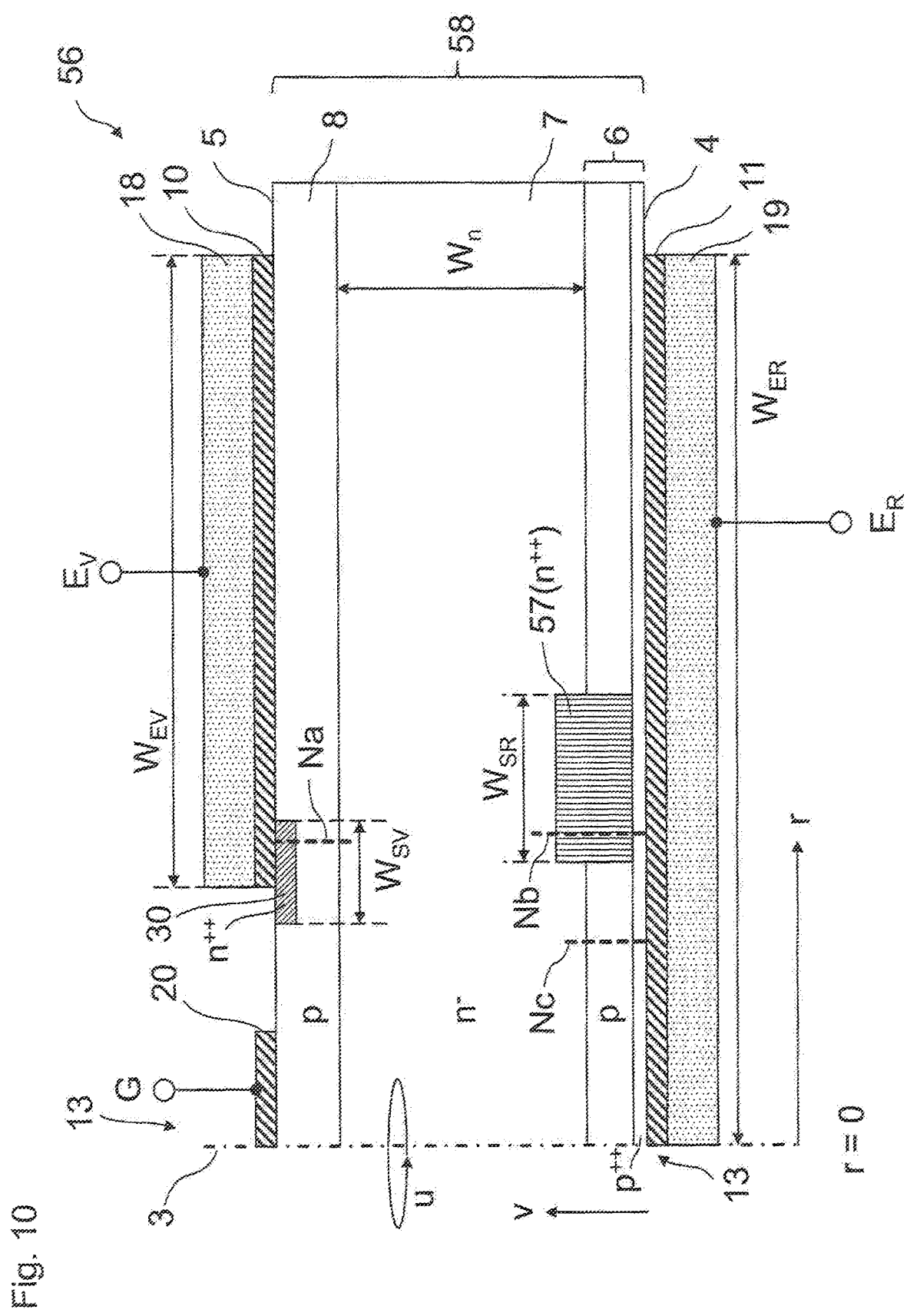
Figure 11:
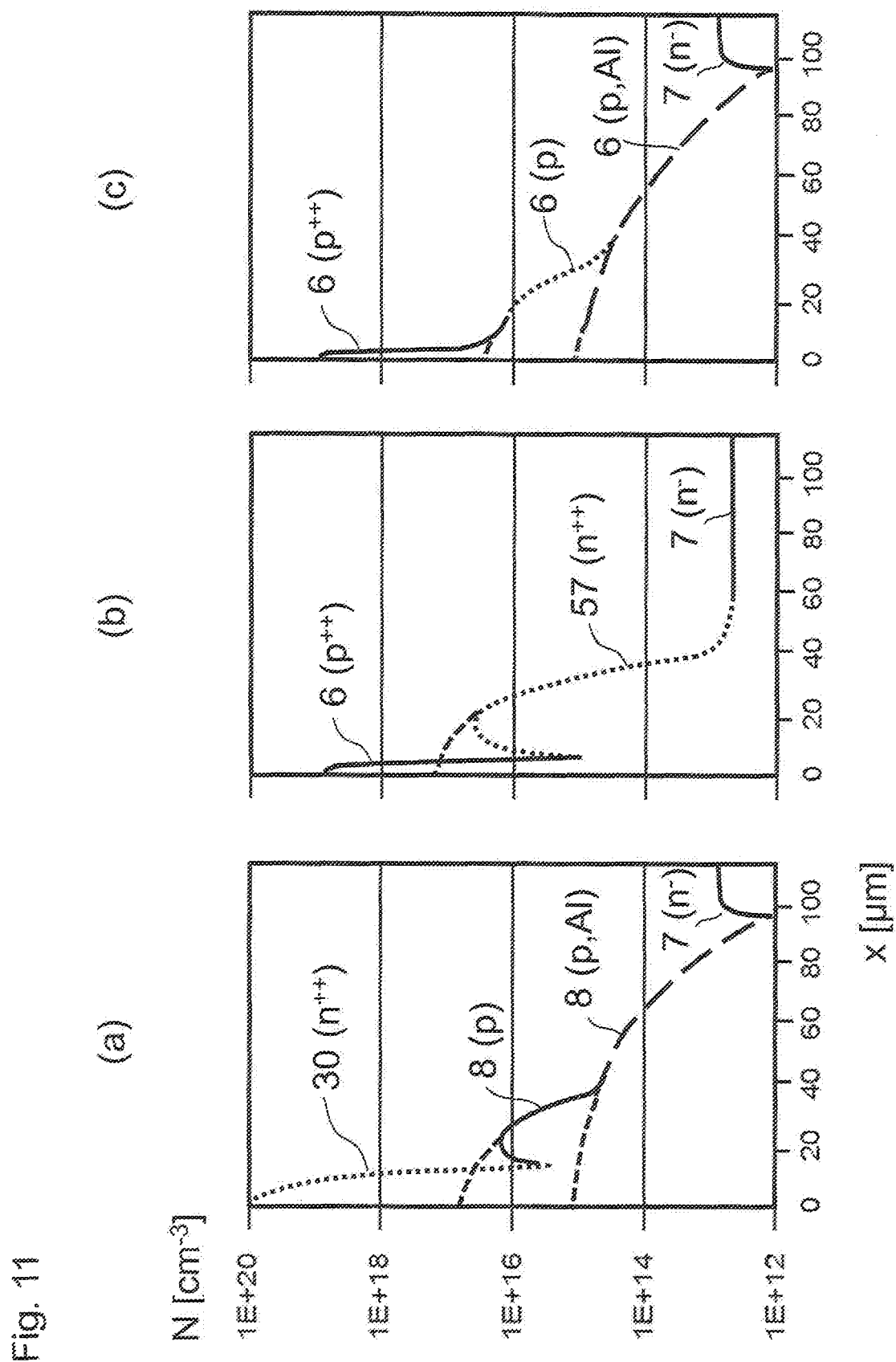
Figure 12:
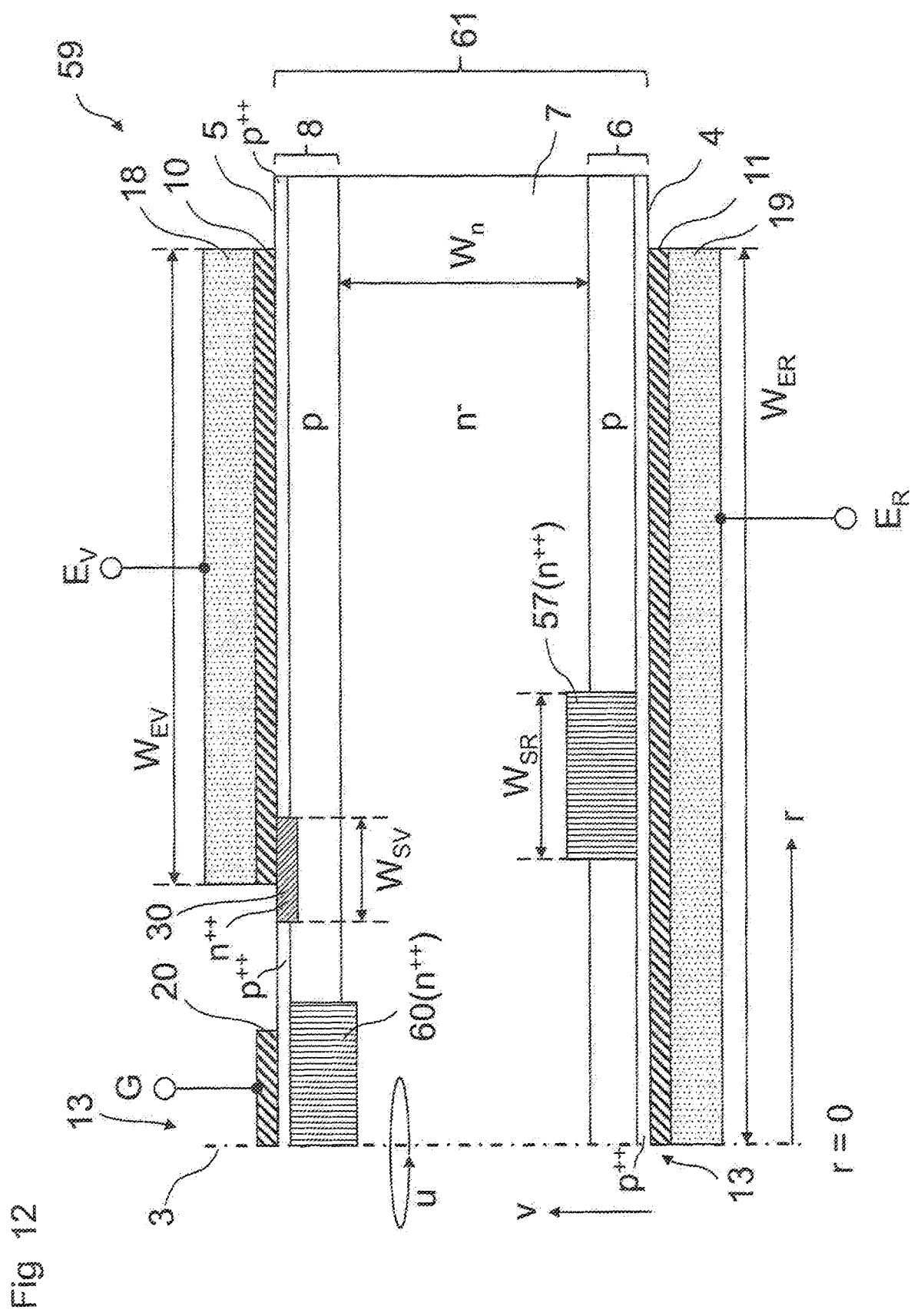
Figure 13:
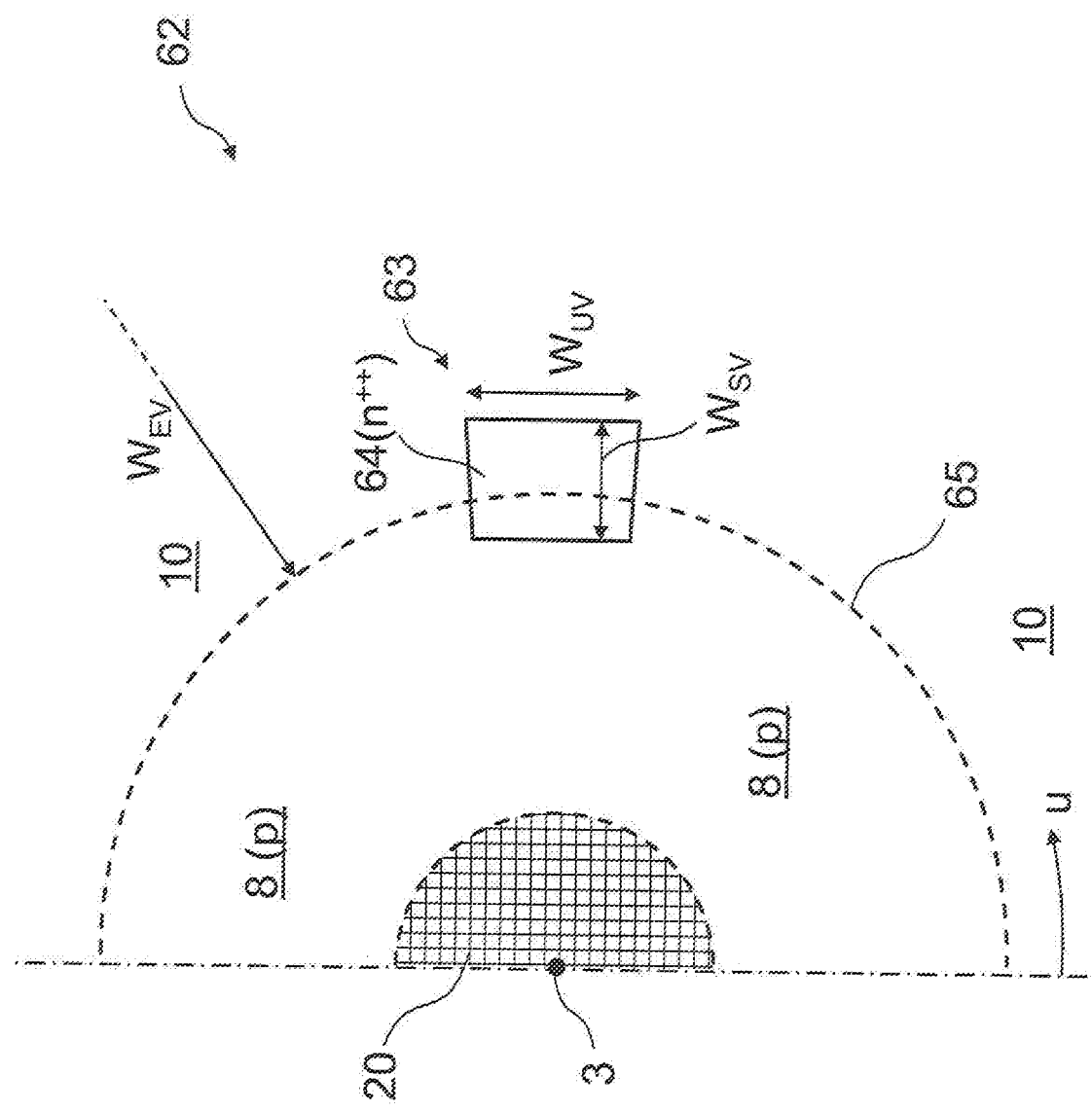
Figure 14:
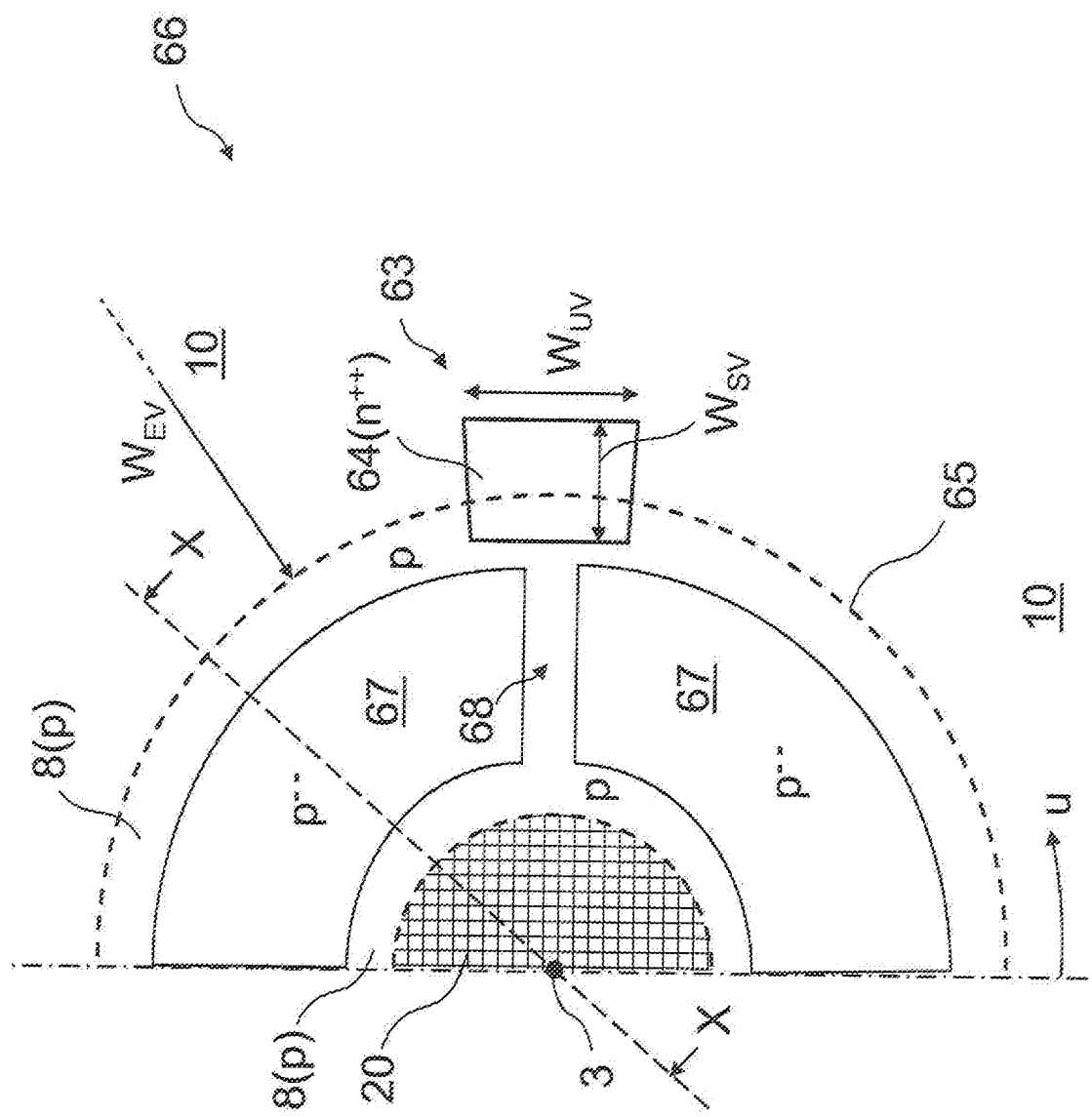
Figure 15:
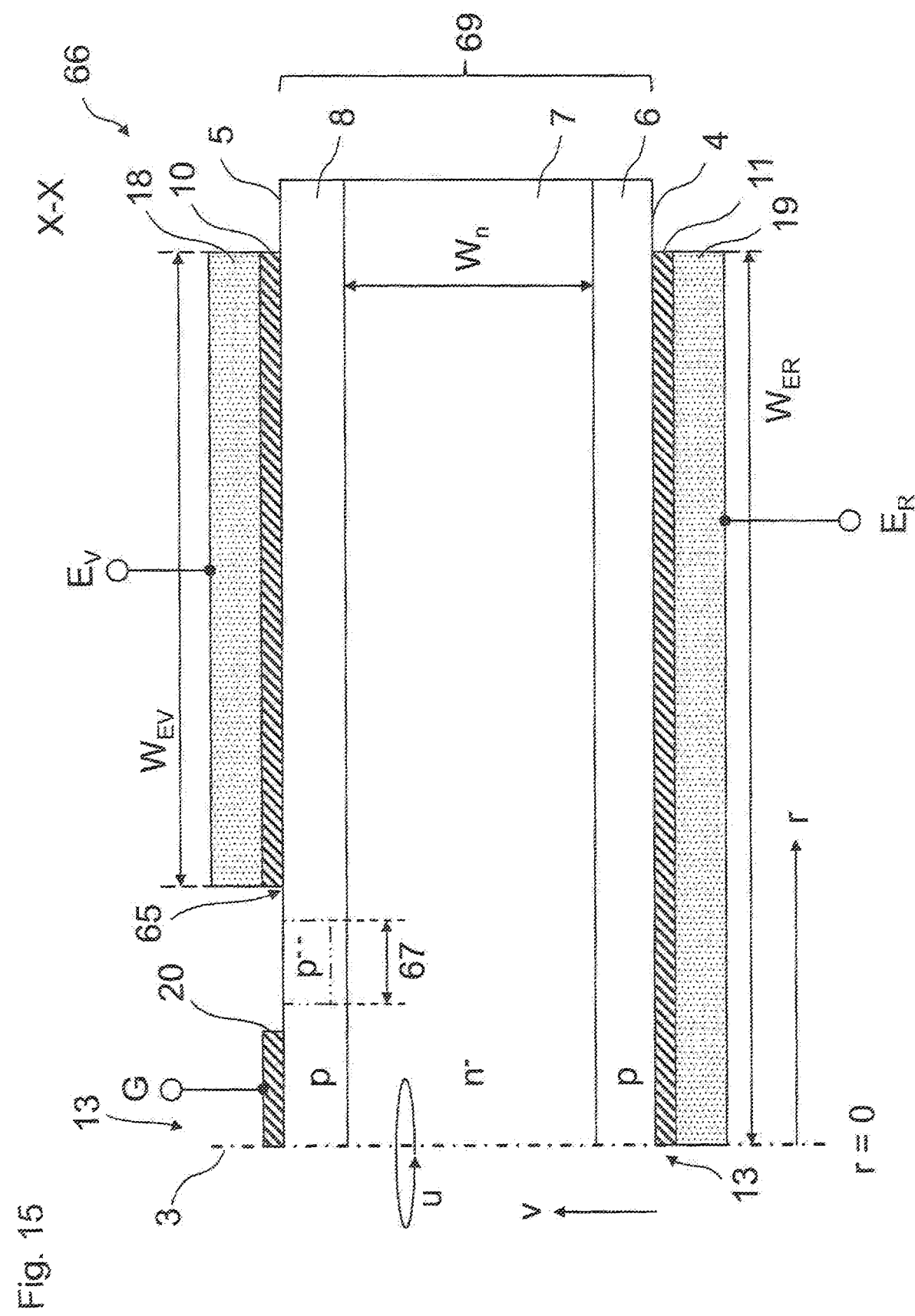
Figure 16:
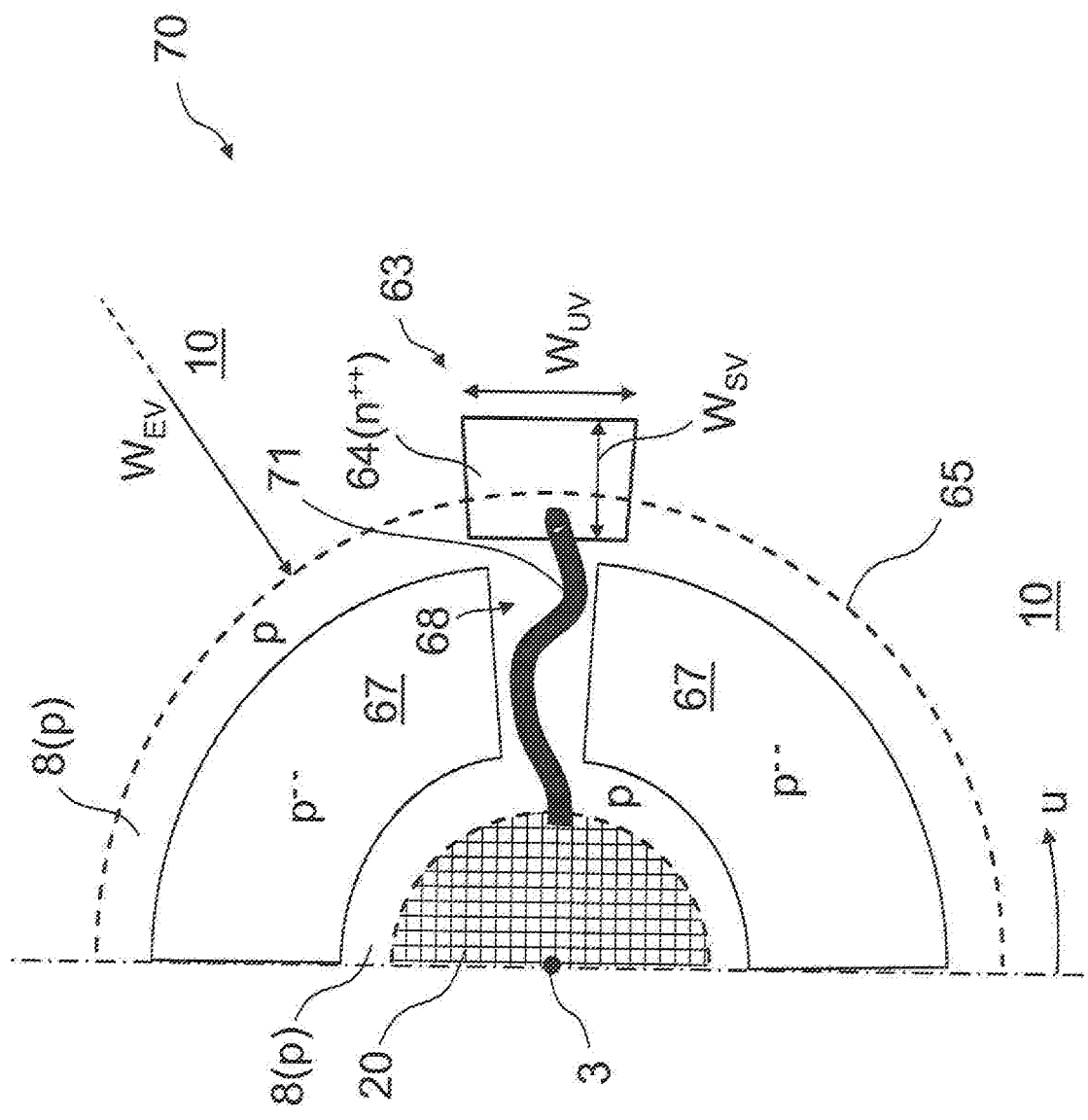
Figure 17:
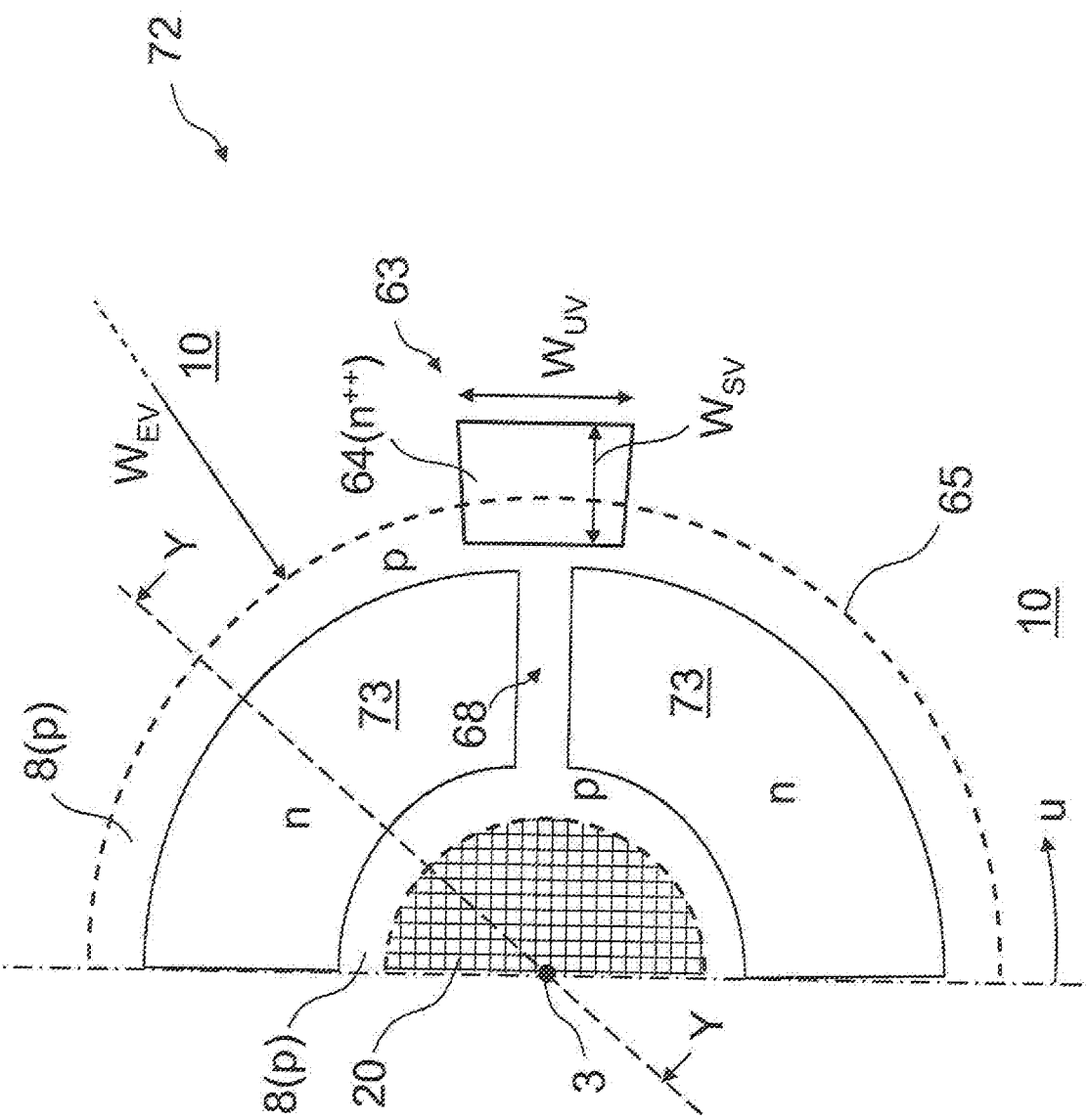
Figure 18:
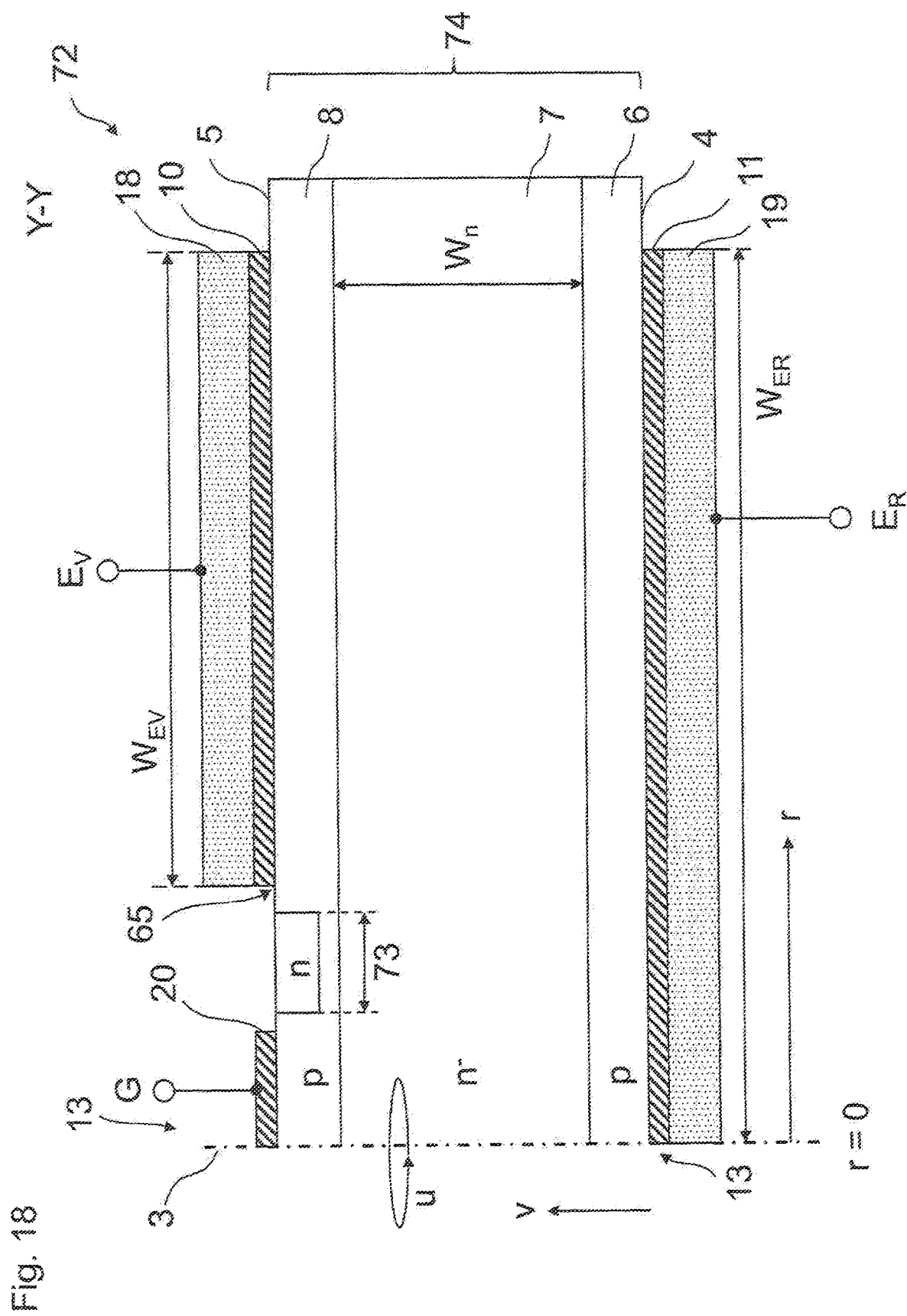

In summary, the definitions of terms used herein are listed below in an overview:
I. Turn-on structure:
  A structure for generating a shorting in the semiconductor body of the short-circuit semiconductor component according to the invention, in order to establish, subsequent to it being turned on or pre-destroyed, a low-resistance electrically conductive state (short circuit) between the external electrical main connections (cathode/anode), which are electrically connected to the short-circuit semiconductor component and, in case of normal operation (non-short circuit), are electrically separated from each other by the semiconductor body.
  Possible embodiment as:
    a. Emitter structure
    b. Breakdown structure (e.g. in the form of a BOD, du/dt, circuit-commutated turn-off time protection structure)
II. Turn-on signal:
Signal for initiating the turning on or pre-destruction of a turn-on structure.
  Possible embodiment as:
    a. Separate electrical signal externally supplied to the semiconductor body according to the invention
    b. Electrical voltage/operating voltage applied to the electrical main connections (cathode/anode) of the short-circuit semiconductor component according to the invention
III. Turn-on current:
  A current obtained from the turn-on signal and supplied to a turn-on structure configured as an emitter structure for triggering or turning on the former.
IV. Fusing current:
  A current causing a shorting in the semiconductor body.
V. Trigger structure:
  Optional auxiliary structure for forwarding to a turn-on structure the turn-on signal, which is always supplied to the auxiliary structure.
  Possible embodiment as:
    a. Gate electrode—Supplied turn-on signal: II.a
    b. Breakdown structure (e.g. in the form of a BOD, du/dt, circuit-commutated turn-off time protection structure)—Supplied turn-on signal: II.b Other advantages and features of the invention become apparent from the following description as well of exemplary embodiments of the invention, which shall be understood not to be limiting and which will be explained below with reference to the drawing. In this drawing, the Figures schematically show:

FIG. 1 a vertical section through a prior art thyristor,

FIG. 2 a vertical section through an exemplary embodiment of a short-circuit semiconductor component according to the invention with a turn-on structure and a trigger structure, FIG. 3 a plan view of another exemplary embodiment of a short-circuit semiconductor component according to the invention with a fingered turn-on structure, FIG. 4 a vertical section through another exemplary embodiment of a short-circuit semiconductor component according to the invention with two turn-on structures and a trigger structure, FIG. 5 a vertical section through yet another exemplary embodiment of a short-circuit semiconductor component according to the invention with two turn-on structures and two trigger structures, FIG. 6 a vertical section through yet another exemplary embodiment of a short-circuit semiconductor component according to the invention with a turn-on structure and a trigger structure, FIG. 7 a vertical section through another exemplary embodiment of a short-circuit semiconductor component according to the invention with two turn-on structures and two trigger structures, FIG. 8 two circuit diagrams in each case of one exemplary embodiment of a wiring of the short-circuit semiconductor component of FIG. 2, FIG. 9 a vertical section through yet another exemplary embodiment of a short-circuit semiconductor component according to the invention with two turn-on structures and two trigger structures, FIG. 10 a vertical section through another exemplary embodiment of a short-circuit semiconductor component according to the invention with two turn-on structures and a trigger structure, FIG. 11 in each of the views (a), (b) and (c), a concentration profile through the short-circuit semiconductor component of FIG. 10 along the concentration profile lines Na, Nb and Nc shown therein, FIG. 12 a vertical section through another exemplary embodiment of a short-circuit semiconductor component according to the invention with two turn-on structures and two trigger structures, FIG. 13 a partial plan view of yet another exemplary embodiment of a short-circuit semiconductor component according to the invention with a turn-on structure, which is open in a circumferential direction of the semiconductor body and has a turn-on structure segment, and a trigger structure, FIG. 14 a partial plan view of yet another exemplary embodiment of a short-circuit semiconductor component according to the invention with a turn-on structure, which is open in a circumferential direction of the semiconductor body and has a turn-on structure segment, and a trigger structure, FIG. 15 a vertical section through the short-circuit semiconductor component of FIG. 14 along the line of cut X-X, FIG. 16 a partial plan view of yet another exemplary embodiment of a short-circuit semiconductor component according to the invention with a turn-on structure, which is open in a circumferential direction of the semiconductor body and has a turn-on structure segment, and a trigger structure, FIG. 17 a partial plan view of yet another exemplary embodiment of a short-circuit semiconductor component according to the invention with a turn-on structure, which is open in a circumferential direction of the semiconductor body and has a turn-on structure segment, and a trigger structure, FIG. 18 a vertical section through the short-circuit semiconductor component of FIG. 17 along the line of cut Y-Y, In the different figures, parts that are equivalent with respect to their function are always provided with the same reference numerals, so that they are also only described once, as a rule.

FIG. 1 shows a vertical section through a prior art thyristor 1. The thyristor 1 has a semiconductor body 2 substantially having the shape of a very flat cylinder, whose base surfaces extend perpendicularly to a vertical direction v. Every direction perpendicular to the vertical direction v is herein referred to as a radial or lateral direction, wherein the lateral direction is denoted with the reference sign r in FIG. 1.

The semiconductor body 2 is formed from a semiconductor material, e.g. silicon, and has semiconductor regions doped in a p-conducting and n-conducting manner, which determine the electrical properties of the thyristor in a manner known per se. The thyristor 1 and/or the semiconductor body 2 are formed to be rotationally symmetric with respect to a center axis 3 extending in the vertical direction v.

In the semiconductor body 2 of the depicted prior-art thyristor 1, a p-doped rear-side base region 6, an n-doped inner region 7 and a p-doped front-side base region 8 are successively arranged in the vertical direction v starting from a rear side 4 towards a front side 5 located opposite the rear side 4.

An n-doped front-side emitter 9 is embedded into the p-doped front-side base region 8, adjacent to the front side 5 of the semiconductor body 2, wherein the front-side emitter 9 has a total lateral emitter width $W_{S1}$ determined by its lateral extent. Herein, the lateral overall structure width of the emitter 9 is understood to mean the distance of an inner side, which radially delimits the depicted emitter structure 9 the farthest towards the inside, from an outer side, which radially delimits the depicted emitter structure 9 the farthest towards the outside. The emitter 9 in the conventional thyristor 1 shown in FIG. 1 has a circumferentially closed ring structure which concentrically encloses the center axis 3, wherein the semiconductor body 2 or the thyristor 1 is formed substantially as a cylinder which is rotationally symmetric with respect to the center axis 3.

Furthermore, it is apparent from FIG. 1 that the n-doped front-side emitter 9 is electrically conductively connected to a metallization layer 10 (e.g. aluminum) which is applied to the front side 5, and which forms a front-side electrode 10 of the thyristor 1, wherein the front-side electrode 10 in the depicted example of the conventional thyristor 1 may also be referred to as a cathode electrode, which has a cathode connection K. The front-side electrode 10 has a total lateral front-side electrode width $WE_1$ determined by its lateral extent. The p-doped rear-side base region 6 is electrically conductively connected to a metallization layer 11 (e.g. aluminum) which is applied to the rear side 4, and which forms a rear-side electrode 11 of the thyristor 1, wherein the rear-side electrode 11 in the depicted example of the conventional thyristor 1 may also be referred to as an anode electrode, which has a anode connection A.

As is also apparent in FIG. 1, the n-doped front-side emitter 9 is interspersed, in a manner known per se, with short-circuits 12 (also referred to as cathode short-circuit), which are configured like columns and doped in a manner complementary to the front-side emitter 9, and which electrically connect the p-doped front-side base region 8 directly to the front-side electrode 10.

Moreover, it is apparent from FIG. 1 that the thyristor 1 has, in a center 13 (r=0) of the semiconductor body 2 defined by the geometrical center of gravity of the front side 5, a trigger structure in the form of a gate electrode 14, by means of which, depending on an electrical trigger or turn-on signal (gate current), an electrically conducting, low-resistance connection can be produced in a manner known per se between the front-side electrode 10 (here: cathode) and the rear-side electrode 11 (here: anode). Incidentally, a center 13, which corresponds to the lateral position of the front-side center 13 due to the symmetrical configuration of the semiconductor body 2, is also defined by the geometrical center of gravity of the rear side 4 of the semiconductor body 2, which is why the two centers are provided with the same reference numeral 13. The two centers 13 define the course of the center axis 3 (also referred to as axis of symmetry).

For example, if a positive potential is present between the rear-side electrode 11 and the front-side electrode 10, the n-p-n-p structure of the thyristor 1 blocking in the blocking direction ($U_D$) is triggered or turned on by the gate current (positive current direction from the gate 14 to the front-side electrode 10). During the turn-on process, the current plasma spreads, starting from the side of the highly n-doped front-side emitter 9 facing towards the center 13, radially or laterally outwards over the entire front-side electrode region $W_{E1}$ with a speed of about 0.1 mm/µs, until, depending on the diameter of the thyristor 1, the entire front-side electrode region $W_{E1}$ carries the current after about 1 to 4 ms, and a high load current flows between the front-side electrode (cathode) 10 and the rear-side electrode (anode) 11. Then, the forward voltage present in the conductive state of the thyristor 1 assumes its lowest value. Only when the current flowing through the thyristor 1 reaches the value zero again is it "extinguished" and changes into the blocking state ($U_R$ or negative potential between the rear-side electrode 11 and the front-side electrode 10). An intact, conventional thyristor structure as it is shown in FIG. 1 can be switched an arbitrary number of times between these two states.

The blocking voltage of the thyristor 1 is calculated from the minimum thickness $W_{n1}$ and the specific resistance ρ of the n-doped inner region 7, whereas its minimum surface of the n-doped front-side emitter 9 determines the strength of the admissible surge current and the forward losses (conduction losses). In this case, the thickness $W_{n1}$ cannot be chosen arbitrarily, for example in order to increase the blocking capacity, because this affects the surge current and the conduction losses negatively. Accordingly, the surface of the emitter 9 and the silicon thickness $W_{n1}$ are precisely tailored to the respective application of the conventional thyristor 1.

As is further apparent from FIG. 1, the lateral width $W_{S1}$ of the front-side emitter 9 is substantially equal to the lateral width $W_{E1}$ of the front-side electrode 10. As a result, the ratio of the lateral front-side emitter width $W_{S1}$ to the lateral front-side electrode width $W_{E1}$ substantially equals 1 or is even slightly greater than 1 in the conventional thyristor 1.

FIG. 2 shows a vertical section through an exemplary embodiment of a short-circuit semiconductor component 15 according to the invention. The short-circuit semiconductor component 15 has a semiconductor component 16 in which, similar to the conventional thyristor 1 shown in FIG. 1, a p-doped rear-side base region 6, an n-doped inner region 7 and a p-doped front-side base region 8 are successively arranged in the vertical direction v starting from the rear side 4 towards the front side 5 located opposite the rear side 4.

As is apparent from FIG. 2, the rear-side base region 6 is connected in an electrically conductive manner to the rear-side electrode 11 with a total lateral rear-side electrode width $W_{ER}$ determined by its lateral extent, which is applied to the rear side 4, and the front-side base region 8 is connected in an electrically conductive manner to the front-side electrode 10 with a lateral front-side electrode width $W_{EV}$ determined by its lateral extent, which is applied to the front side 5.

A front-side turn-on structure 17 with a lateral front-side turn-on structure width $W_{SV}$ determined by its lateral extent is embedded into the p-doped front-side base region 8, adjacent to the front side 5 of the semiconductor body 16. In the exemplary embodiment shown in FIG. 2, the front-side turn-on structure 17 is configured as an n-doped front-side emitter structure 17, which may be configured as a circumferentially closed ring and/or polygon structure, for example. As is apparent from FIG. 2, the emitter structure 17 is connected in an electrically conductive manner to the metallization layer 10 (e.g. aluminum) applied to the front side 5. As is also apparent, the front-side electrode 10 covers the front-side emitter structure 17 at least partially. In particular, FIG. 2 shows, at least in terms of orders of magnitude, that the coverage of the turn-on structure 17 by the front-side electrode 10 in the outer edge region, i.e. in the direction towards the radial outer edge of the short-circuit semiconductor component 15 (r>0) may be at least in the millimeter range, e.g. at least about 1 mm to 5 mm, or even greater. As is shown in FIG. 2, the emitter structure 17, at the radial inner side of the metallization layer 10 facing towards the center 13, protrudes slightly therefrom. In the exemplary embodiment shown in FIG. 2, the n-doped front-side emitter structure 17 is also interspersed with the short-circuits 12, which are configured like columns and doped in a manner complementary to the emitter structure 17 and which electrically connect the p-doped front-side base region 8 to the front-side electrode 10.

The form of the short circuits 12 may vary, depending on the strength of the desired short-circuit effect. Circular or polygonal, e.g. hexagonal, small point-shaped recesses within the contiguous emitter structure surface of the entire emitter structure 17 determined by the lateral front-side emitter structure width $W_{SV}$ are customary, wherein the short circuits 12 may have dimensions in the order of magnitude of about 100 μm. However, other forms of such short circuits 12 are possible, e.g. strip-like breaks or annular breaks that divide the emitter structure 17 into individual concentric rings. The width of such breaks is typically in the range of about 100 μm.

Compared to the conventional thyristor 1 shown in FIG. 1, the short-circuit effect of the short circuits 12 in the short-circuit semiconductor component 15 according to the invention can also be increased to a very large extent by means of a targeted design, e.g. by the short-circuit openings of the short circuits 12 being formed considerably larger than in the conventional thyristor 1 shown in FIG. 1, and/or by the density of the short circuits 12 relative to the emitter structure surface of the emitter structure 17 being selected so as to be considerably larger, i.e. the distance of adjacent short circuits 12 from one another being selected so as to be considerably smaller, than in the conventional thyristor 1. As a result, the surface area-specific surge current in kA/cm² in the short-circuit semiconductor component 15 according to the invention can be reduced even further (in contrast to the conventional thyristor 1, in which the surge current is known always to be maximized), in order to reliably ensure the shorting of the semiconductor body 16 in the case of a short circuit as described herein.

The two p-n or n-p junctions in the semiconductor body 16 arranged in the above-described manner produce a short-circuit semiconductor component 15 that blocks in both voltage polarities.

One difference between the short-circuit semiconductor component 15 shown in FIG. 2 and the conventional thyristor 1 shown in FIG. 1 is the ratio of the lateral turn-on or emitter structure width $W_{SV}$ to the lateral electrode width $W_{EV}$, which is significantly smaller than 1 in the short-circuit semiconductor component 15 and may preferably be selected so as to be less than ½ or even smaller which, however, is not an absolute necessity.

Moreover, it is apparent from FIG. 2 that the front-side electrode 10 and the rear-side electrode 11 are each contacted, in particular press-contacted, in an electrically conductive manner by means of a metallic front-side and rear-side contact disk 18 and 19, respectively. The contact disks 18 and 19 may be configured as pure molybdenum disks or consist of a combination of a molybdenum and a copper disk, wherein molybdenum is preferably in direct contact with the respective electrode 10 or 11 of the semiconductor 16. The thickness of the contact disks 18 and 19 is preferably between 1 and 5 mm.

Furthermore, FIG. 2 shows a front-side trigger structure 20 of the short-circuit semiconductor component 15, which is configured as a gate electrode 20 and which contacts the front-side base region 8 in an electrically conductive manner, and which can be activated depending on an electrical turn-on signal supplied to the gate electrode 20 via its gate connection G and, as a consequence thereof, can turn on or pre-destroy the front-side turn-on or emitter structure 17, which is electrically operatively connected to the gate electrode 20 via the front-side base region 8. After the turn-on or emitter structure 17 has been turned on/pre-destroyed, it produces, on a one-off basis, a permanent, irreversible, electrically conductive, low-resistance connection between the front-side electrode 10 and the rear-side electrode 11. In operation, the gate electrode 20 is contacted via an electrically conductive wire (not shown) pressed in place by spring action.

As was already mentioned above and is apparent from FIG. 2, the emitter structure 17, at the radial inner side of the metallization layer 10 facing towards the center 13, protrudes slightly therefrom. Here, this is necessary in order not to short-circuit the emitter structure 17. In the event of such a short circuit, the current of the turn-on signal supplied via the trigger structure or gate electrode 20 would be able to flow directly from it to the electrode 10, which, however, could at least partially affect the desired function of the turn-on or emitter structure 17 in a negative manner.

Furthermore, during operation, the short-circuit semiconductor component 15 is usually accommodated in a hermetically sealed ceramic capsule (not shown) or plastic capsule configured as a housing. In order to supply the external electrical turn-on or gate signal, a metal tube is attached to the ceramic/plastic capsule, which is connected to the metallized gate region 20 via the wire for coupling in the external turn-on signal. Moreover, the ceramic/plastic capsule has two copper contact stamps, which rest directly on the contact disks 18 or 19 of the front-side electrode 10 or the rear side electrode 11 on both sides of the short-circuit semiconductor component 15. This short-circuit semiconductor component 15 located in the ceramic/plastic capsule is electrically connected to the outside via a corresponding mechanical pressure bond, which presses the two copper contact stamps together with a sufficiently high surface pressure, while, for control by means of the turn-on signal, the metal tube located in the ceramic/plastic capsule is connected, outside the capsule, to an electrical line via a suitable plug-in connection or firm solder joint.

The main function of the short-circuit semiconductor component 15 is that, with a single pulse of the turn-on or gate signal with a sufficient current level, i.e. if the trigger structure is activated by means of the turn-on signal, a predefined energy input is injected into the semiconductor body between the trigger structure and the front-side turn-on structure, and that thereby, a first semiconductor junction formed between the respective turn-on structure and the base region embedding it, in the present case between the n-emitter and the p-base region, and/or a second semiconductor junction formed between this base region and the inner region is irreversibly destroyed, which is illustrated in FIG. 2 by a pre-destruction region 75 depicted therein. Then, the semiconductor body 16 is destroyed by the fault current flowing through the electrode connections $E_V$ and $E_R$ in such a way that a fused portion or shorting 21 forms in the vicinity of the initially triggered region of the semiconductor body 16, whose size or radial/lateral extent depends, inter alia, also on the size of the short-circuit current flowing between the connections $E_V$ and $E_R$. After the fused material has cooled off, a metallic region forms, which is composed of the fused silicon of the semiconductor body 16 and the metal of the contact disks 18 or 19 and provides a permanently reliably conductive, low-resistance electrical connection (short circuit) between the two main connections $E_V$ and $E_R$. The strength of the fusing current is determined by a maximum surface, which is to be designed in accordance with the short circuit current to be permanently absorbed, for the n-doped front-side emitter structure 17, wherein the goal is as small a ratio $W_{SV}/W_{EV}$ as possible for small fusing currents, and the lateral width $W_{EV}$ of the metal contact disk 18 or of the front-side electrode 10 is set, in accordance with the strength of the short-circuit current, in such a way that the spatial extent of the shorted region 21 does not reach into an outer edge region of the short-circuit semiconductor component 15. In order to continue to prevent an edge failure caused by a possible overvoltage, the thickness $W_n$ of the n-doped inner region 7 determining the blocking capacity of the short-circuit semiconductor component 15 may be chosen so as to be of almost any size, wherein the specific resistance of the inner region 7 is also correspondingly adapted to the desired level of the blocking capacity.

Thus, in the short circuit component 15 shown in FIG. 2, an electrical turn-on signal is generated once in the case of an accident, which is applied to the gate electrode 20 in the center 13 of the semiconductor body 16 via the electrical supply line to the gate connection G. As a consequence, the n-p-n-p structure 75 of the semiconductor body 16 is pre-destroyed, whereupon current flows between the front-side electrode 10 and the rear-side electrode 11, which leads to fusing 21 in the current-carrying region of the semiconductor body 16. Then, the short-circuit semiconductor component 15 is in a permanent, non-reversible, low-resistance current-carrying state.

The current-carrying capacity of the n-doped front-side emitter structure 17 is very much limited compared with the n-doped cathode-side emitter 9 of the conventional thyristor 1 shown in FIG. 1, because it is determined by the ratio of the lateral emitter structure width $W_{SV}$ of the n-doped front-side emitter structure 17 to the total width $W_{EV}$ of the surface contacted by the metallization or front-side electrode 10 and the contact disk 18.

The position of the n-doped front-side emitter structure 17 close to the center 13 of the semiconductor body 16 keeps the shorted region 21 in the vicinity of the initial triggering and prevents the plasma from escaping from the region of the semiconductor body 16 contacted by the front-side electrode 10 and the contact disk 18 and getting into the radially outer edge region. The structure of the exemplary embodiment of the short-circuit semiconductor component 15 shown in FIG. 2 thus ensures that the shorting 21 always remains within the region covered by the electrode 10 and the contact disk 18, i.e. within the electrode width $W_{EV}$.

FIG. 3 shows a plan view of another exemplary embodiment of a short-circuit semiconductor component 22 according to the invention with a fingered turn-on structure 23. In FIG. 3, a front-side electrode 24 can be seen which is applied to the front side of the semiconductor body 25 with a configuration according to the invention. A gate electrode 26 configured as a trigger structure which, as can be seen in FIG. 3, is radially spaced apart from the front-side electrode 24, is applied to the semiconductor body 25 in the center 13 of the short-circuit semiconductor component 22. As is also apparent from FIG. 3, the gate electrode 26 in the depicted short-circuit semiconductor component 22 has four trigger structure or gate fingers 27 that extend radially outward from the rest, i.e. the central region, of the gate electrode 26. The front-side electrode 24 has recesses corresponding to the gate fingers 27, so that the gate fingers 27 are able to extend radially outward, spaced apart from the electrode 24. In accordance with the recesses of the electrode 24, the turn-on structure 23, in this case an emitter structure, which is electrically contacted by the electrode 24, located underneath the electrode 24 and at least partially covered by the latter, and is embedded into the semiconductor body 25, has an extent following the contour of the electrode recesses.

The emitter structure 23 and its extent is indicated in FIG. 3 by a contour of the electrode recesses drawn with broad lines. Clearly, the lateral emitter structure width $W_{SV}$ thus corresponds substantially to the width of the contour drawn into FIG. 3. In cross section, the emitter structure 23 may, for example, by configured in a similar manner to the emitter structure 17 from FIG. 2 and also include the short circuits 12. However, this is not an absolute requirement.

In FIG. 3, it is apparent that the emitter structure 23 has, in the lateral direction r, four turn-on structure fingers 28 that extend radially outwards from the rest of the emitter structure 23 close to the center, i.e. from a region of the emitter structure 23 close to the center. In the exemplary embodiment of the short-circuit semiconductor component 22 shown in FIG. 3, the turn-on or emitter structure 23 is configured in a line-shape and so as to follow the contour of the electrode recesses. Such a line-shaped turn-on structure 23 may preferably have a lateral structure width $W_{SV}$ (see FIG. 2) of about 500 μm. As a result, the turn-on or emitter structure 23 shown in FIG. 3 is configured in part as a circumferentially closed ring structure and in part as a circumferentially polygon structure (emitter finger 28) extending radially outwards from the ring structure.

It is to be understood that the finger structure of the turn-on structure 23 and the corresponding finger structure of the trigger structure 26, in this case the gate electrode 26, may of course have many other conceivable designs. For example, the number of the turn-on structure fingers 28 or trigger structure fingers 27 is not limited to the number four shown in FIG. 3. More or fewer fingers may be provided. The extent of the fingers 28 or 27 is also not limited to the straight extent of the exemplary embodiment illustrated in FIG. 3. The extent may also be curved, for example. Furthermore, it is conceivable that from each finger 28 or 27, one or several branched-off finger sections may additionally extend from each finger 28 or 27 shown in FIG. 3, and that thus, fingers are formed that are branched off once or several times.

It is apparent from the illustration of FIG. 3 that the trigger structure 26 has trigger structure fingers 27 corresponding, i.e. following, the shape or contour of the turn-on structure fingers 28. Due to a uniform distance, in this case particularly in the lateral direction, between the trigger structure 26 and the turn-on structure 23, which is produced over the entire extent of the fingered turn-on structure 23, this embodiment ensures a uniform electrical effect of the trigger structure 26 on the turn-on structure 23.

The fingered turn-on structure 23 provides the fundamental advantage that the turned-on or triggered region of the short-circuit semiconductor component 22 may spread across a greater circumference. A lateral extent of the turn-on structure finger 28 from the rest of the turn-on structure 23 close to the center, i.e. a radial finger length $L_{SF}$ of the turn-on structure, is preferably selected to be less than $W_{EV}/2$. In the exemplary embodiment of the short-circuit semiconductor component 22 shown here, this also applies to the radial finger length of the trigger structure fingers 27. This measure helps to keep the fusing region 21 (see FIG. 2) away from, on the one hand, the center 13 of the semiconductor body 22 and thus from the gate electrode 26 and, on the other hand, also sufficiently far away from the radial outer edge of the short-circuit semiconductor component 22. Since the central region 13 in the exemplary embodiment of the short-circuit semiconductor component 22 shown in FIG. 3 is not covered by the electrode 24, and is therefore also not contacted or covered by the thick contact disk 18 (FIG. 2), plasma in the center 13 could be directed on to the electrical supply line to the gate connection G and on to the metal tube in the ceramic/plastic capsule (not shown), damaging the capsule. This is reliably prevented by the exemplary embodiment of the short-circuit semiconductor component 22 shown in FIG. 3 because the shorting 21 (FIG. 2) is always triggered within the region of the emitter structure 23 covered by the electrode 24 in the case of a short circuit.

FIG. 4 shows a vertical section through another exemplary embodiment of a short-circuit semiconductor component 29 according to the invention with two turn-on structures 30 and 31 and the trigger structure 20 (gate electrode). As is apparent from FIG. 4, the short-circuit semiconductor component 29 has in a semiconductor component 32 an n-doped front-side turn-on or emitter structure 30, whose lateral emitter structure width $W_{SV}$, compared to the lateral front-side electrode width $W_{EV}$, is selected to be considerably smaller still than in the short-circuit semiconductor component 15 from FIG. 2. It is also apparent from FIG. 4 that the emitter structure 30 in this exemplary embodiment does not have any short circuits 12, as shown in FIG. 2, which is not an absolute necessity, however. The turn-on or emitter structure 30 can be configured as a circumferentially closed ring and/or polygon structure, which surrounds the trigger structure 20 at a certain radial distance. The emitter structure 30, at the radial inner side of the electrode 10 facing towards the center 13, also protrudes slightly therefrom, as was already described in connection with the emitter structure 17 in FIG. 2.

In addition to the trigger structure 20 formed by the gate electrode 20 and disposed in the center 13 of the semiconductor body 32, the semiconductor body 32 also has a second turn-on structure 31 in the form of a breakdown structure 31, which in this exemplary embodiment is configured as a circumferentially closed, annular BOD structure. Depending on the operating voltage present at the electrode connections $E_V$ and $E_R$, the short-circuit semiconductor component 29 can also be turned on by means of the breakdown structure 31; in the exemplary embodiment shown, at a negative polarity applied to the rear-side electrode 11 opposite the front-side electrode 10. In addition, it additionally serves for avoiding a blocking failure in the radially outer edge region of the short-circuit semiconductor component 29 in the case of an unpredictable overvoltage present at the electrode connections $E_V$ and $E_R$.

As is apparent from FIG. 4, the breakdown structure 31 is located on the side of the semiconductor body 32 opposite the front-side emitter structure 30 and thus constitutes a rear-side turn-on structure 31 of the short-circuit semiconductor component 29. In this case, the level of the breakdown voltage of this breakdown structure 31 is adjusted in such a way that it assumes its lowest value of the entire semiconductor body 32 precisely at the location where it is disposed and thus also reliably prevents a breakdown in the outer edge region of the semiconductor body 32. The radius of curvature of the p-n transition, i.e. its geometrical curvature, in a region marked with the reference numeral 33 in FIG. 4, together with the specific resistance and the ratio of the diameters $D_i$ (inner diameter) and $D_a$ (outer diameter) or the lateral turn-on structure width $W_{SR}$ of the breakdown structure 31, determines the level of the breakdown voltage in a manner known per se, as it is described in DE 42 15 378 C1, for example. In the event an overvoltage occurs in the blocking direction $U_R$ (negative polarity at the rear-side electrode connection $E_R$), a steep increase of the blocking current flowing between the main connections $E_V$ and $E_R$ is produced in the region 33 above a certain voltage. In this case, the current density reaches values so high that, in the end, a local melt channel is produced between the two main connections $E_V$ and $E_R$. The blocking capacity of the n-p-n-p structure breaks down, and the short-circuit current results in shorting in the region of the BOD structure 31. Generally, higher breakdown voltages or very high blocking voltages reaching into the kV range can be technically controlled very well with breakdown structures of the type of the breakdown structure 31.

Because the breakdown structure 31 in the exemplary embodiment of the short-circuit semiconductor component 29 shown in FIG. 4 is a rear-side turn-on structure embedded into the rear-side base region 6, to which, in turn, the rear-side electrode 11 is applied, the ratio of the lateral rear-side turn-on structure width $W_{SR}$ of the breakdown structure 31 to the lateral rear-side electrode width $W_{ER}$ of the rear-side electrode 11 must also satisfy the condition according to the invention, $W_{SR}/W_{ER}<1$, which is obviously the case in the short-circuit semiconductor component 29 shown in FIG. 4.

As is apparent from FIG. 4, the lateral turn-on structure width $W_{SR}$ of the breakdown structure 31 is localized at the lateral region of the base region 6 in which the geometry of the p-n transition formed between this base region 6 and the inner region 7 is significantly changed compared to the geometry of the rest of the p-n transition, i.e. the p-n transition outside the region defined by the lateral rear-side turn-on structure width $W_{SR}$. In this case, it is to be understood, in particular, that a changed geometry of this p-n transition in the sense of the present invention is present only if, reliably, this change cannot be ascribed to the production-related tolerance deviations during the production of the base region 6 and the inner region 7 but is the result of targeted actions.

The breakdown structure 31 of the short-circuit semiconductor component 29 shown in FIG. 4 has a ring shape surrounding the center 13 of the semiconductor body 32 and, accordingly, is radially spaced from the center 13. In particular, the breakdown structure or rear-side turn-on structure 31 in the exemplary embodiment of the short-circuit semiconductor component 29 shown in FIG. 4 is completely covered by the front-side electrode 10 and the rear-side electrode 11. The complete front and rear-side coverage of the breakdown structure 31 is advantageous in that an escape of plasma from the semiconductor body 29 is reliably prevented by the local delimitation of the shorting in the region around the breakdown structure 31 covered on both sides by the electrodes 10 and 11.

In principle, however, the breakdown structure 31 functioning as a turn-on structure may also be disposed in the center 13 of the semiconductor body 32, as is also described, for example, in DE 42 15 378 C1. In such a case, which is not shown in FIG. 4, the breakdown structure 31 would preferably be covered, both on the front side 5 of the semiconductor body 32 and on its rear side 4, by the respective electrodes 10 and 11, in order to obtain the same effect with regard to the escape of plasma as described above. In other words, a short-circuit semiconductor component with at least one turn-on structure disposed in the center, particularly a breakdown structure configured as a turn-on structure, would not require any trigger structure disposed there, such as the gate electrode 20 with a gate connection G shown in FIG. 4. Since the breakdown structure 31 draws the turn-on signal from the voltage present at the electrode connections $E_V$ and $E_R$, an additionally supplied external turn-on signal can be omitted.

Here, it may be noted that the breakdown structure 31 shown in FIG. 4 as a BOD structure may also be replaced with any other breakdown structure with a similar effect known per se, provided that, as a turn-on structure, it is configured to initiate the shorting of the corresponding short-circuit semiconductor component in accordance with a turn-on signal which, in the case of a breakdown structure integrated into the semiconductor body, implicitly always results from the electrical voltage present at the outer electrodes 10 and 11. Similar other breakdown structures are, for example, a breakdown structure having a du/dt protection known per se, or breakdown structure including a circuit-commutated turn-off time protection with a local increase of carrier lifetime known per se. Yet another breakdown structure, which is an alternative for the breakdown structure 31, will be described below in conjunction with the explanation of FIGS. 10 and 11.

FIG. 5 shows a vertical section through yet another exemplary embodiment of a short-circuit semiconductor component 34 according to the invention with two turn-on structures 35, 36 and two trigger structures 37, 38. The two turn-on structures 35 and 36 are each configured as n-doped emitter structures that are respectively embedded in the front-side or rear-side base region 8 or 6 of a semiconductor body 39. The turn-on or emitter structures 35, 36 can be configured as circumferentially closed ring and/or polygon structures. As is clearly apparent from FIG. 5, the two emitter structures 35 and 36 each protrude slightly over the radial inner edge, which faces towards the respective center 13, of the respective electrode 10 or 10. The two trigger structures 37 and 38 are each configured as gate electrodes 37, 38 with one front or rear-side gate connection $G_V$ or $G_R$ each, wherein the front-side gate electrode 37 is disposed in the center 13 of the front-side base region 8 so as to electrically contact the latter, and the gate electrode 38 is disposed in the center 13 of the rear-side base region 6. In the exemplary embodiment of the short-circuit semiconductor component 34 shown in FIG. 5, both turn-on structures 35, 36 have the same lateral turn-on structure width $W_{SV}$ or $W_{SR}$, which, however, is not an absolute requirement. In the short-circuit semiconductor component 34, the lateral electrode widths $W_{EV}$ and $W_{ER}$ of the front or rear-side electrodes 10 and 11 also have the same size, which is also not an absolute requirement. Consequently, the short-circuit semiconductor component 34 has a completely symmetrical structure with respect to the vertical direction. The lateral electrode widths $W_{EV}$ and $W_{ER}$ may be considerably larger than the corresponding lateral turn-on structure widths $W_{SV}$ or $W_{SR}$ so that the conditions $W_{SV}/W_{EV}<1$ and $W_{SR}/W_{ER}<1$ also apply with regard to this short-circuit semiconductor component 34, which, however, is not an absolute requirement. Accordingly, the short-circuit semiconductor component 34 can be turned on both via an electrical turn-on signal supplied to the front-side gate connection $G_V$ as well as via an electrical turn-on signal supplied to the rear-side gate connection $G_R$.

FIG. 6 shows a vertical section through yet another exemplary embodiment of a short-circuit semiconductor component 76 according to the invention. The semiconductor component 76 substantially corresponds to the structure of the short-circuit semiconductor component 15 shown in FIG. 2, wherein the semiconductor component 76 additionally has an insulator layer 78 between the front-side electrode 10 and the front side 5 of the semiconductor body 77 or the contact surface of the turn-on/emitter structure 17. It is apparent that the insulator layer 78 extends in the radial direction r across this turn-on structure 17 and extends in the circumferential direction u along an, in the radial direction r inner, inner edge of this electrode 10. In the present case, the insulator layer 78 is a silicon dioxide layer manufactured in a thermal process during the manufacture of the semiconductor body. It preferably has a thickness of at least 50 nm to at most 100 nm.

FIG. 7 shows a vertical section through another exemplary embodiment of a short-circuit semiconductor component 45 according to the invention with two turn-on structures 30 and 46 and two trigger structures 20 and 47. In a semiconductor body 48, the rear-side turn-on structure 46 is embedded, as an n-doped emitter structure 46 with short circuits 12 and a lateral rear-side turn-on structure width $W_{SR}$, into the rear-side base region 6, adjacent to the rear side 4, and contacted in an electrically conductive manner and completely covered by the rear-side electrode 11. The turn-on or emitter structure 46 can be configured as a circumferentially closed ring and/or polygon structure. The rear-side trigger structure 47, which is configured as a breakdown structure, e.g. as a BOD structure, is disposed in the same lateral region of the turn-on structure 46, but offset therefrom in the vertical direction v. As was already explained in connection with FIG. 4, when the breakdown voltage set for the breakdown structure 47, which is directly dependent on the electrical voltage that is present at the outer electrodes 10 and 11 and serves as a turn-on signal, is reached or exceeded, a steep, locally limited current increase sets in in the region 33 used in the example of the short-circuit semiconductor component 45 shown in FIG. 7 for turning on the rear-side emitter structure 46 or for pre-destroying the pre-destruction region 75 shown in FIG. 2 or 6, whereby the shorting of the short-circuit semiconductor component 45 is ultimately initiated. Providing the emitter structure 46 as a turn-on structure which is turned on or pre-destroyed by the breakdown structure 47 offers the advantage of a lateral expansion of the shorted region compared with the turn-on structure 31 shown in FIG. 4, which is configured as a breakdown structure, in which the melt channel emanating from the breakdown structure 31 towards the shorting is locally narrowly limited. Because of the lateral expansion of the melt channel, the emitter structure 46 helps having the shorting process progress more "softly". Due to the reduced conduction resistance, a cross-sectionally larger shorting region in the semiconductor body 48 also permits a permanent conduction of greater short-circuit currents with lower conduction losses.

In a view (a), FIG. 8 shows a first circuit diagram of an exemplary embodiment of a wiring of the short-circuit semiconductor component 15 from FIG. 2, and in another view (b), a circuit diagram of another exemplary embodiment of a wiring of the short-circuit semiconductor component 15 from FIG. 2.

In FIG. 8(a), a capacitor C with a capacitance predetermined in accordance with the predetermined energy input can be seen, which provides the turn-on signal in a charged state, wherein the capacitor C in the present case can be electrically connected between the gate electrode 20 or the gate connection G and the front-side electrode 10 or the front-side electrode connection $E_V$ by means of an electronic switch 79. In this case, the semiconductor switch 15 works as a unidirectional switch. The semiconductor switch 15 has to carry the current only in a single direction; the other current direction may be ensured by a press-contacted diode (not shown) disposed antiparallel to the semiconductor switch 15, for example.

In FIG. 8(b), the circuit assembly of FIG. 8(a) appears twice, wherein the two are then connected in an antiparallel manner. In this way, using two semiconductor switches 15 that are, as such, unidirectional, a structure can be produced which, as a whole, is bidirectional and in which, preferably, one gate controlling unit (corresponds to the capacitor C and the electronic switch) is respectively allocated to each semiconductor switch 15. The bidirectional design or antiparallel connection of the two semiconductor switches 15 can thus carry the current in both directions.

As an alternative for the bidirectional antiparallel connection of the two unidirectional semiconductor switches 15 as shown in FIG. 8(a), a directly bidirectionally operating semiconductor switch may be used, e.g. the semiconductor switch 34 from FIG. 5. In any case, it is preferred if both unidirectional semiconductor components or the one bidirectional semiconductor component are accommodated in a housing.

FIG. 8 further shows an impedance 80, which represents the parasitic resistance or an inductance in the gate electrode circuit. The smaller the impedance, the stronger the current surge or energy input available for the pre-destruction.

FIG. 9 shows a vertical section through yet another exemplary embodiment of a short-circuit semiconductor component 52 according to the invention with two turn-on structures 46 and 53 and two trigger structures 47 and 54. The turn-on structure 46, which was already shown in FIG. 7 and is configured as an emitter structure, and the rear-side trigger structure 47, which is electrically operatively connected therewith and configured as a breakdown structure, are embedded into the rear side of a semiconductor body 55. On the front side, the front-side turn-on structure 53 configured as an n-doped emitter structure is similarly embedded into the front-side base region 8, adjacent to the front side 5, and electrically contacted by the front-side electrode 10. The front-side emitter structure 53 is associated with the front-side trigger structure 54, which is also configured as a breakdown structure and which turns on or pre-destroys the emitter structure 53 in the event of a breakdown. The mode of action of the combination of the front-side emitter structure 53 with the front-side breakdown structure 54 corresponds to the combination of the rear-side emitter structure 46 with the rear-side breakdown structure 47, and was already explained in connection with the description of FIG. 7. Both turn-on or emitter structures 46, 53 and both trigger structures 47, 54 can be configured, respectively, as circumferentially closed ring and/or polygon structures.

The turn-on or trigger structures 46, 53, 46, 54 of the short-circuit semiconductor component 52 may be arranged exactly centrally, i.e. in the respective center 13, without being limited thereto.

FIG. 10 shows a vertical section through another exemplary embodiment of a short-circuit semiconductor component 56 according to the invention with two turn-on structures 30 and 57 and a trigger structure 20. In addition to the front-side turn-on structure 30 known from FIG. 4, the rear-side turn-on structure 57 is embedded in the form of yet another configuration of a breakdown structure into a semiconductor body 58. It is clearly apparent in FIG. 10, in particular, that the rear-side turn-on structure 57 is locally limited, in particular locally limited in the radial direction r, and thus has a lateral structure width $W_{SR}$ that is significantly smaller than the lateral electrode width $W_{ER}$ of the associated rear-side electrode 11, as is the case in all lateral turn-on structure widths disclosed herein, relative to the corresponding lateral electrode widths of the respective electrodes of the short-circuit semiconductor component according to the invention.

It is further apparent from FIG. 10 that the rear-side base region 6 has a flat $p^{++}$-region, which faces towards the rear side 4 and is highly p-doped compared with the region facing towards the inner region 7. In a lateral portion corresponding to the lateral turn-on structure width $W_{SR}$, an $n^{++}$-region, which is much more highly n-doped compared with the n-doped inner region 7 and which reaches into the inner region 7 in the vertical direction v, is embedded into the usually p-doped region of the rear-side base region 6. The $n^{++}$-region does not reach the rear side 4 of the semiconductor body 58 to which the rear-side electrode 11 is applied, because the highly doped $p^{++}$-region of the base region 6 spaces the inserted $n^{++}$-region from the rear side 4 contacted by the electrode 11. The concentration of the $p^{++}$-region of the rear-side base region 6 is selected so as to be higher than the concentration of the $n^{++}$-region interrupting the p-region of the base region 6 in order to prevent a short circuit between the inner region 7 and the rear-side electrode 11.

A breakdown voltage can also be set in a targeted manner for the breakdown structure 57 shown in FIG. 10, e.g. by the selection of the doping concentration of the weakly n-doped inner region 7 and/or the highly doped $n^{++}$-region 57 and/or the p-doped base region 6, particularly of its highly doped $p^{++}$-region, which spaces the breakdown structure 57 from the rear side 4 of the semiconductor body 58, wherein the breakdown voltage of the breakdown structure 57 decreases the higher the concentration of its $n^{++}$-region and/or the $p^{++}$-region of the base region 6 is selected to be. In this way, breakdown voltages in the range far below 10 V up to the maximum possible blocking capacity of the semiconductor body 58 can be set. Breakdown structures of the type of the breakdown structure 57 are technically particularly advantageous with regard to setting relatively small blocking voltages in the range of a few tens of volts to about 100 V.

FIG. 11, in each of the views (a), (b) and (c), shows a concentration profile through the short-circuit semiconductor component 56 of FIG. 10 along the concentration profile lines Na, Nb and Nc shown therein. Accordingly, FIG. 11a shows the concentration profile along the profile line Na shown in FIG. 10, FIG. 11b shows the concentration profile along the profile line Nb, and FIG. 11c shows the concentration profile along the profile line Nc. In the respective concentration profiles of FIGS. 11a, 11b and 11c, the penetration depth x in µm of the respective dopant is plotted along the respective abscissa. The ordinates each represent the concentration N per $cm^{-3}$ of the respective dopant.

FIG. 11a shows the concentration profile along the profile line Na shown in FIG. 10, which extends from the front side 5 of the semiconductor body 58 through the front-side turn-on or emitter structure 30 and the front-side base region 8 into the inner region 7. Starting from x=0, the flat profile, i.e. a profile with a low penetration depth (in this case less than about 20 µm) of the, for example phosphorus-doped, $n^{++}$-emitter structure 30 with a high concentration (up to about $1E20\ cm^{-3}$) can be seen in FIG. 11a in the form of a dotted curve. This is followed, with an increasing penetration depth x (from about 20 µm to about 40 µm), by the concentration profile of the p-base region 8, which is doped with boron, for example, in the shape of a continuous curve. In the short-circuit semiconductor component 56 shown in FIG. 10, the first boron-doped p-region of the base region 8 is preceded by an aluminum-doped (Al) second p-region of the base region 8 with a significantly lower concentration (e.g. between about 1E13 to about $1E15\ cm^{-3}$), as is apparent from the concentration profile of FIG. 11a with reference to the dashed curve. However, this Al-profile in the base region 8 is not an absolute requirement. As the penetration depth x increases further (in this case starting at about 100 µm) over the course of the concentration profile of FIG. 11a, the base region 8 is followed by the profile of the weakly n-doped inner region 7 with a substantially constant concentration (in this case about $1E13\ cm^{-3}$).

FIG. 11b shows the concentration profile along the profile line Nb shown in FIG. 10, which extends from the rear side 4 of the semiconductor body 58 through the rear-side base region 6 and the rear-side turn-on breakdown structure 57 into the inner region 7. At first, FIG. 11b shows, starting from x=0, the very flat profile of the, for example boron-doped, $p^{++}$-region of the base region 6 with a high concentration of preferably about $5E18\ cm^{-3}$ and a penetration depth of preferably about 5 to 20 µm in the form of a continuous curve. This is followed, with an increasing penetration depth x, by the concentration profile of the, for example phosphorus- or arsenic-doped, $n^{++}$-turn-on or breakdown structure 57, which is shown in FIG. 11b as a dotted curve. It is clearly apparent in FIG. 11b that the concentration N of the highly doped $n^{++}$-breakdown structure 57 is significantly smaller than the concentration N of the $p^{++}$-region of the base region 6 preceding it on the rear side. As the penetration depth x increases further, the concentration profile of the breakdown structure 57 transitions into the curve of the weakly $n^-$-doped inner region 7.

FIG. 11c shows the concentration profile along the profile line Nc shown in FIG. 10, which extends from the rear side 4 of the semiconductor body 58 through the rear-side base region 6 into the inner region 7. At first, FIG. 11c shows, starting from x=0, the very flat profile of the, in this case boron-doped, $p^{++}$-region of the base region 6 with a high concentration of preferably about $5E18\ cm^{-3}$ and a penetration depth of preferably about 5 to 20 µm in the form of a continuous curve. This is followed, with an increasing penetration depth x, by the concentration profile of the rest of the p-doped base region 6 with a significantly lower concentration N (in this case less than $1E16\ cm^{-3}$), which is shown in FIG. 11c as a dotted curve. Preceding it in the direction of the inner region 7, the rear-side base region 6, just like the front-side base region 8 (see FIG. 11a), also has a weakly aluminum-doped (Al) p-region of the base region 6 with a concentration of about $1E15\ cm^{-3}$ in a penetration depth x of up to about 100 µm, as is shown with a dashed curve in FIG. 11c. However, this Al-doped p-region of the base region 6 is not an absolute requirement. Again, this region of the base region 6 is followed by the weakly $n^-$-doped inner region 7, as is shown in FIG. 11b.

It is particularly preferred to provide the front- and/or rear-side base regions 8 or 6 with a penetration depth or thickness of at least 50 µm, e.g. of about 100 µm, in the area of the concentration profile lines Na and Nc indicated in FIG. 10, as is also apparent from FIGS. 11a and 11c.

As was already mentioned with respect to the description of FIG. 10, the adjustable breakdown voltage of the breakdown structure 57 in the blocking direction is determined by the additionally introduced amount of donor atoms forming the $n^{++}$-breakdown structure 57 shown in FIG. 10. The higher this concentration, the lower the breakdown voltage. The level of concentration of the $p^{++}$-region of the p-doped rear-side base region 6 at the transition towards the $n^{++}$-breakdown structure 57 and the course of the concentration of the $p^{++}$-profile of the base region 6 at the transition towards the $n^{++}$-breakdown structure 57 (see FIG. 11b) also determine the breakdown voltage: the flatter the gradient of the concentration profile at the transition from the $p^{++}$-region of the base region 6 to the $n^{++}$-region of the breakdown structure 57, the greater the blocking capacity if conditions are otherwise unchanged. Subsequent to the diffusion of the flat, highly doped $p^{++}$-region of the base region 6, for example, the blocking capacity of the breakdown structure 57 can be adjusted by means of the drive-in time of the $p^{++}$-region, because as the drive-in time increases, the concentration gradient at the transition from the $p^{++}$-region of the base region 6 to the $n^{++}$-region of the breakdown structure 57 becomes flatter, which increases the breakdown voltage. Thus, a very flat (low penetration depth x) and very highly doped $p^{++}$-profile of the base region 6 has to be produced for very small breakdown voltages of the breakdown structure 57. For example, an assumed breakdown voltage of about 30 V thus results in a mean concentration of the $n^{++}$-region of the breakdown structure 57 of about 5E16 $cm^{-3}$.

The blocking capacity of the breakdown structure 57 can be adjusted across a broad range. It reaches its limit, however, if the concentration becomes very small and comes close to the concentration of the weakly $n^-$-doped inner region 7, which, for example for high-blocking semiconductor components, may have a concentration N of less than 1E14 $cm^{-3}$. In contrast, the breakdown voltage of the breakdown structure 57 can be adjusted very well if its blocking capacity differs very clearly from the maximum possible blocking capacity of the short-circuit semiconductor component 56 determined by the silicon thickness $W_n$ and the concentration N of the weakly doped inner region 7, that is, if it is less than 100 V, wherein the demanded blocking capacity of the short-circuit semiconductor component 56 is then significantly higher than 1000 V, i.e. if the ratio of the maximum possible blocking capacity of the short-circuit semiconductor component 56 to the set blocking capacity of the breakdown structure 57 is in a range of about 50 to about 100.

The breakdown structure 57 described in FIG. 10 may be used as a turn-on structure and/or trigger structure in the short-circuit semiconductor component according to the invention in the same manner as the other breakdown structures described herein. The turn-on or breakdown structure 57 of the short-circuit semiconductor component 56 can be configured as a circumferentially closed ring and/or polygon structure.

FIG. 12 shows a vertical section through another exemplary embodiment of a short-circuit semiconductor component 59 according to the invention with two turn-on structures 30 and 57 and two trigger structures 20 and 60. In a semiconductor body 61, in addition to the embodiment of the short-circuit semiconductor component 56 shown in FIG. 10, the front-side breakdown structure configured as a trigger structure 60 is disposed, in the vertical direction v, underneath the front-side trigger structure 20 configured as a gate electrode 20. Structurally, the trigger structure 60 has the same configuration as the rear-side turn-on structure 57, as is apparent from FIG. 12. In order to embed the breakdown structure 60 into the front-side base region 8, the latter, like the rear-side base region 6, is divided into a highly doped flat $p^{++}$-region facing towards the front side 5 and a common p-region facing towards the inner region 7, so that the $p^{++}$-region, in the vertical direction v, is disposed between the gate electrode 20 and the $n^{++}$-region of the breakdown structure 60. The front-side emitter structure 30 is embedded into the front-side base region 8, adjacent to the front side 5, and electrically conductively contacted by the front-side electrode 10.

Accordingly, in the short-circuit semiconductor component 59 shown in FIG. 12, the front-side turn-on structure 30 may be turned on both by an electrical turn-on signal externally supplied to the gate connection G, but also by the trigger structure 60 if the blocking voltage, which is applied thereto and determined by the main electrodes 10 and 11, exceeds the breakdown voltage predetermined for the breakdown structure 60. In this case, the breakdown current at the breakdown structure 60 increases to the extent that it turns on or pre-destroys the turn-on structure 30 embedded into the same base region 8, which ultimately results in the desired shorting of the short-circuit semiconductor component 59.

As in the case of the pre-destruction regions 75 between the two semiconductor junctions shown schematically in FIGS. 2 and 6, it must be understood, also for the short-circuit semiconductor component 59 of FIG. 12, that the pre-destruction of the turn-on structure 30 caused by the trigger structures 20 and/or 60 always takes place spatially separate from the respective trigger structure 20 or 60 (radially farther outward). This ensures that the shorting always occurs within the region of the semiconductor body 61 covered (in particular, pressed) by the respective electrode (in the present case 10). In order to ensure this, the trigger current generated by the respective trigger structure 20 and/or 60 may optionally be additionally limited, e.g. by providing a corresponding resistance region in order to reliably prevent a pre-destruction as a consequence of too high a trigger current in the gate region/gate electrode 20 or center 13.

In the case shown in FIG. 12 of the combination of the two trigger structures 20 and 60 disposed in the same base region (in this case the front-side base region 8), it must be understood that the triggering or turn-on sensitivity of the turn-on structure (in this case the emitter structure 30), which is associated with and downstream of these two trigger structures 20 and 60, is adapted to the turn-on current that can be made available by the trigger structures 20 or 60, with the smallest turn-on current that can be made available by a trigger structure being the determining factor. In other words, due to the presence of the trigger structure, which is configured as a breakdown structure 60 and which typically supplies turn-on currents only in the mA-range, in the range of considerably below 1 A, preferably about 50 mA, the turn-on structure 30 in the example shown in FIG. 12 is designed for a minimum turn-on current, starting from which the turn-on structure 30 is reliably turned on, so that the blocking current generated by the breakdown structure 60 in the case of a breakdown can reliably turn on or pre-destroy the turn-on structure 30 without being destroyed itself. This could happen if the triggering or turn-on sensitivity of the turn-on structure 30 were selected to be too high. In that case, the emitter structure 30 could be triggered by a turn-on signal in the range of about 1 A supplied via the gate electrode 20, but the breakdown structure 60 disposed underneath the gate electrode 20 would be destroyed in the process, because it would be overloaded given a turn-on current of 1 A introduced via the gate electrode 20. Since the trigger structure 60 is not located in the region of the semiconductor body 61 covered by the electrode 10 and the contact disk 18, such a destruction of the trigger structure 60 could result in plasma escaping from the region of the non-covered center 13, which is reliably prevented, however, by the above-described design of the turn-on structure 30 or its turn-on sensitivity in the exemplary embodiment of the short-circuit semiconductor component 59 shown in FIG. 12.

If, for example with respect to the process, the manufacture of the configuration of the breakdown structure 60 for a certain blocking voltage level (particularly, for example, for breakdown voltages in the kV range) of the short-circuit semiconductor component 59 could only be accomplished with a particularly great technical effort, or if it were unsafe, a breakdown structure 31 as shown, for example, in FIG. 4 can be used instead of the breakdown structure 60 of the short-circuit semiconductor component 59 shown in FIG. 12. As was already explained there, this breakdown structure 31 offers special advantages for adjusting even very high blocking voltages/breakdown voltages up to the kV range.

FIG. 13 shows a partial plan view of yet another exemplary embodiment of a short-circuit semiconductor component 62 according to the invention with a turn-on structure 63, which is open in a circumferential direction u of the semiconductor body and has at least one turn-on structure segment 64 (a ring segment in the present case), and a trigger structure 20. Only the front-side base region 8 of the semiconductor body can be seen in the plan view of FIG. 13. The illustration of FIG. 13 does not show the front-side electrode 10, but only its radial inner edge 65, in order to be able to see the turn-on structure 63, which is disposed underneath the electrode 10 and configured as an emitter structure. It is apparent from FIG. 13 that the emitter structure 63 or the emitter structure segment 64 in this exemplary embodiment has a radial distance from the trigger structure or gate electrode 20. As is also apparent, the turn-on structure 63 is not closed in the circumferential direction u of the semiconductor body in this case, i.e. the turn-on structure 63 of the short-circuit semiconductor component 62 shown in FIG. 13 does not have a closed ring and/or polygon structure. The turn-on structure segment 64 has the lateral emitter structure width $W_{SV}$ and a circumferential emitter structure width $W_{UV}$ extending in the circumferential direction. The circumferential emitter structure width $W_{UV}$ is smaller than a circumferential turn-on structure width, which would correspond to a closed ring and/or polygon structure of the turn-on structure, and thus to a circumferential angle of the closed ring and/or polygonal turn-on structure of 360 degrees.

In the exemplary embodiment of the short-circuit semiconductor component 62 shown in FIG. 13, the turn-on current for turning on or pre-destroying the turn-on structure 63 is set to a range around 2 A, preferably between about 1 A and about 5 A. $W_{SV}$ can now be selected so as to be so large that the turn-on structure 63 does not cause any problems with respect to the process, i.e. can be realized with a sufficient width $W_{SV}$. If $W_{SV}$ is selected so as to be too small, there is the problem that the radially inner electrode edge 65 does not cover the emitter structure 64, which in this case is highly n-doped, with sufficient reliability and accuracy, wherein the circumferential structure width $W_{UV}$ is less critical in this case. With the exemplary embodiment shown in FIG. 13, relatively small fusing currents can be realized in a particularly advantageous manner, due to dimensions $W_{SV}$ and $W_{UV}$ that, compared to a closed ring and/or polygon structure, are relatively small, wherein the turn-on current required for turning on/pre-destroying the turn-on structure 63 may reach rather large values in the range of preferably about 1 A to about 5 A with the advantages already described herein.

It must be understood that a short-circuit semiconductor component 62 depicted as in FIG. 13 may also have more than one turn-on structure 63, which in that case are distributed in the circumferential direction u of the semiconductor body, preferably equidistantly from one another, in order to obtain a circumferentially substantially symmetrical configuration of such a short-circuit semiconductor component with the advantages already described herein.

FIG. 14 shows a partial plan view of yet another exemplary embodiment of a short-circuit semiconductor component 66 according to the invention with the turn-on structure 63 already shown in FIG. 13, which has at least one turn-on structure segment 64 (a ring segment in the present case), and a trigger structure 20. The illustration of FIG. 14 does not show the front-side electrode 10, but only its radial inner edge 65, in order to be able to see the turn-on structure 63, which is disposed underneath the electrode 10 and configured as an emitter structure.

As is apparent from FIG. 14, a $p^{--}$-portion 67, which has a considerably lower level of p-doping compared with the customarily p-doped base region portion and which, compared with the rest of the base region 8, constitutes a considerably higher electrical resistance, is provided in the short-circuit semiconductor component 66 in the p-doped front-side base region 8 into which the turn-on structure 63 is embedded. The dopant concentration of this resistance portion 67 preferably is about $1E15$ cm$^{-3}$ to about $1E16$ cm$^{-3}$ at a penetration depth of preferably about 60 to 120 μm. This resistance portion 67 has an on-state channel 68 opposite the turn-on structure segment 64, which is formed by the ordinarily doped rest of the p-region of the base region 8 and electrically couples the turn-on structure segment 64 to the trigger structure or the gate electrode 20 directly via the p-region of the base region 8.

The effect of the embodiment of the short-circuit semiconductor component 66 shown in FIG. 14 is that, on the one hand, very small fusing currents resulting in shorting can be realized by means of the segment-like configuration of the turn-on structure 63, as is also the case in the short-circuit semiconductor component 62 shown in FIG. 13, and, on the other hand, the turn-on current flowing from the trigger structure 20 to the turn-on structure 63 is directed in a targeted manner on to the turn-on structure segment 64 in order to reliably turn it on or destroy it for initiating the shorting, if required. As a result, the targeted design of the short-circuit semiconductor component 66 with turn-on currents which, in contrast to what is the case in the short-circuit semiconductor component 62 shown in FIG. 13, are in the mA-range, e.g. at about 150 mA, is possible.

Incidentally, the channel 68 may have different shapes, e.g. also a trapezoidal shape in which the channel 68 tapers from the trigger structure 20 towards the turn-on structure segment 64, in order to achieve an even more targeted guidance of the turn-on current flowing through this channel 68 on to the turn-on structure segment 64 and thus keep the turn-on current flowing past the turn-on structure segment 64 as small as possible.

FIG. 15 shows a vertical section through the short-circuit semiconductor component 66 shown in FIG. 14 along the line of cut X-X shown in FIG. 14. It is apparent that in a semiconductor body 69, particularly in the front-side p-doped base region 8, the $p^{--}$-resistance portion 67 extends laterally between the trigger structure or gate electrode 20 and the inner edge 65 of the front-side electrode 10. The turn-on structure segment 64 cannot be seen in the vertical section X-X.

FIG. 16 shows a partial plan view of yet another exemplary embodiment of a short-circuit semiconductor component 70 according to the invention, which substantially corresponds to the exemplary embodiment of the short-circuit semiconductor component 66 shown in FIG. 14, wherein the turn-on structure segment 64 of the short-circuit semiconductor component 70 in FIG. 16 is electrically directly connected to the trigger structure or the gate electrode 20 via a shunt resistor 71 in the form of an n-doped (e.g. phosphorus-doped) strip-shaped area disposed in the channel 68. Preferably, the width of this shunt resistor 71 may be set to about 55 μm. In this way, the required turn-on current for turning on/pre-destroying the turn-on structure 63 can be increased again slightly, compared with the short-circuit semiconductor component 66 of FIG. 14, e.g. to about 400 mA and preferably to a range of about 400 mA to about 1000 mA, with otherwise identical dimensions.

The serpentine shape of the shunt resistor 71 shown in FIG. 16 makes it possible to vary a length of the shunt resistor 71 in a desired manner in order thus to adjust the turn-on current almost arbitrarily within the above-mentioned range. The length of the serpentine shunt resistor 71 shown in FIG. 16 within the channel 68 may be set to a value of, for example, from a range around about 200 µm, i.e. 150 µm to about 250 µm, for example.

With its radially inner end, the shunt resistor 71 is electrically directly connected to the gate electrode 20. In the short-circuit semiconductor component 70 shown in FIG. 16, the opposite radially outer end of the shunt resistor 71 leads directly into the emitter structure segment 64.

Instead of being arranged in the on-state channel 68, as is shown in FIG. 16, the shunt resistor 71 could also be placed across the resistance portion 67. In this case, the radially outer end of the shunt resistor 71 would be electrically directly connected to the front-side electrode 10, e.g. at the electrode edge 65.

FIG. 17 shows a partial plan view of yet another exemplary embodiment of a short-circuit semiconductor component 72 according to the invention with a turn-on structure 63, which is open in a circumferential direction u of the semiconductor body and has at least one turn-on structure segment 64 (a ring segment in the present case), and a trigger structure 20. The illustration of FIG. 17 substantially corresponds to the illustration of FIG. 14, with the exception that in the short-circuit semiconductor component 72 shown in FIG. 17, an n-doped resistance portion 73, which is also referred to as a pinch resistor 73, is inserted into the p-doped front-side base region 8.

FIG. 18 shows a vertical section through the short-circuit semiconductor component 72 shown in FIG. 17 along the line of cut Y-Y shown in FIG. 17. It is apparent in this view that the resistance portion 73 is formed by a pinch resistor which, as an n-region which is inserted into a semiconductor body 74, and especially into the front-side base region 8 from the front side 5 and adjacent to the latter, significantly reduces the effective conduction cross-section of the front-side base region 8 between the trigger structure 20 and the front-side electrode 10, whereby the pinch resistor 73 causes an increase of the surface area-specific resistance in this area of the base region 8. The effects of this increase of resistance were already described above with regard to FIGS. 14 to 16.

It must be understood that the embodiments of the turn-on structure 63 described in connection with FIGS. 13 to 18, with individual turn-on structure segments 64 in combination with the local increase of resistance in the base region 8 between the trigger structure 20 and the turn-on structure segment 64, can be combined in any manner with all other turn-on structures and/or trigger structures described herein, thus containing further advantageous embodiments of the invention not shown in the Figures. For example, two radially spaced-apart turn-on structures, which are electrically insulated from one another, may be provided, e.g. at least one turn-on structure segment 63 as shown in FIGS. 13 to 18, which is surrounded by a fingered turn-on structure, which is disposed radially further outwards and closed in a ring and/or polygon shape, e.g. similar to that shown in FIG. 3. Thus, the shorted region within the region of the semiconductor body covered by the front- and/or rear-side electrodes, which is produced after the short-circuit semiconductor component has been turned on, can be advantageously expanded in the radial direction, with the advantages already described herein.

The above-described short-circuit semiconductor component according to the invention is not limited to the embodiments disclosed herein, but in each case also includes embodiments having the same effects, which result from technically viable other combinations of the features of the short-circuit semiconductor component described herein. In particular, an n-p-n sequence of layers, which is inverse to the p-n-p structure of the semiconductor body shown in the exemplary embodiments, is also conceivable. In this case, the weakly n-doped inner semiconductor region consists of a weakly p-doped inner region, and each of the front- and rear-side base regions of an n-doped layer, etc. The conduction types of the turn-on structures described herein would also have to be inverted in such a case.

In a preferred embodiment, the short-circuit semiconductor component according to the invention is used as a contact or personnel protection device, as well as for plant protection.

LIST OF REFERENCE NUMERALS

1 Prior art thyristor
2 Semiconductor body
3 Center axis
4 Rear side
5 Front side
6 Rear-side base region
7 Inner region
8 Front-side base region
9 Front-side emitter
10 Front-side electrode
11 Rear-side electrode
12 Short circuit
13 Front and rear-side center
14 Gate electrode
15 Short-circuit semiconductor component
16 Semiconductor body
17 Front-side turn-on structure/emitter structure
18 Front-side contact disk
19 Rear-side contact disk
20 Trigger structure, gate electrode
21 Shorting
22 Short-circuit semiconductor component
23 Fingered turn-on structure/emitter structure
24 Front-side electrode
25 Semiconductor body
26 Trigger structure, gate electrode
27 Trigger structure finger/gate finger
28 Turn-on structure finger of 23
29 Short-circuit semiconductor component
30 Front-side turn-on structure/emitter structure
31 Rear-side turn-on structure/breakdown structure
32 Semiconductor body
33 Critical radius of curvature
34 Short-circuit semiconductor component
35 Front-side turn-on structure/emitter structure
36 Rear-side turn-on structure/emitter structure
37 Front-side trigger structure/gate electrode
38 Rear-side trigger structure/gate electrode
39 Semiconductor body
40
41
42
43
44
45 Short-circuit semiconductor component
46 Rear-side turn-on structure/emitter structure
47 Rear-side trigger structure/breakdown structure
48 Semiconductor body
49
50
51
52 Short-circuit semiconductor component 53 Front-side turn-on structure/emitter structure
54 Front-side trigger structure/breakdown structure
55 Semiconductor body
56 Short-circuit semiconductor component
57 Rear-side turn-on structure/breakdown structure
58 Semiconductor body
59 Short-circuit semiconductor component
60 Front-side trigger structure/breakdown structure
61 Semiconductor body
62 Short-circuit semiconductor component
63 Front-side turn-on structure/emitter structure
64 Turn-on structure segment/emitter structure segment
65 Radial inner edge
66 Short-circuit semiconductor component
67 Resistance portion
68 On-state channel
69 Semiconductor body
70 Short-circuit semiconductor component
71 Shunt resistor
72 Short-circuit semiconductor component
73 Resistance portion/pinch resistor
74 Semiconductor body
75 Pre-destruction between first and second semiconductor junctions
76 Short-circuit semiconductor component
77 Semiconductor body
78 Insulator layer
79 Electrical switch
80 Parasitic resistance or inductance in the gate circuit
A Anode connection
Al Aluminum
C Capacitor
$D_a$ Outer diameter of BOD structure
$D_a^*$ Outer diameter of BOD structure
$D_i$ Inner diameter of BOD structure
$D_i^*$ Inner diameter of BOD structure
$E_V$ Front-side electrode connection
$E_R$ Rear-side electrode connection
G Gate connection
$G_V$ Front-side gate connection
$G_R$ Rear-side gate connection
K Cathode connection
$L_{SF}$ Radial finger length of turn-on structure
N Dopant concentration
Na Concentration profile line (a)
Nb Concentration profile line (b)
Nc Concentration profile line (c)
r Radial/lateral direction
R Limiting resistance
u Circumferential direction
v Vertical direction
x Penetration depth
$W_{E1}$ Prior-art lateral electrode width
$W_{ER}$ Lateral rear-side electrode width
$W_{EV}$ Lateral front-side electrode width
$W_n$ Thickness of inner region
$W_{n1}$ Thickness of inner region according to prior art
$W_{S1}$ Lateral emitter width according to prior art
$W_{SR}$ Lateral rear-side turn-on structure width
$W_{SV}$ Lateral front-side turn-on structure width
$WU_V$ Circumferential front-side turn-on structure width
X-X Line of cut of vertical section
Y-Y Line of cut of vertical section

The invention claimed is:
1. A short-circuit semiconductor component comprising:
a semiconductor body, the semiconductor body including a rear-side base region of a first conduction type, an inner region of a second conduction type complementary to the first conduction type, and a front-side base region of the first conduction type successively arranged in a vertical direction starting from a rear side of the semiconductor body;
a rear-side center determined by its geometric center of gravity towards a front side, which is opposite to the rear side;
a front-side center determined by its geometric center of gravity,
wherein the rear-side base region is connected in an electrically conductive manner to a rear-side electrode, the rear-side electrode having a lateral rear-side electrode width ($W_{ER}$),
wherein the front-side base region is connected in an electrically conductive manner to a front-side electrode, the front-side electrode having a lateral front-side electrode width ($W_{EV}$),
wherein at least one front-side turn-on structure is embedded in the front-side base region, the at least one front-side turn-on structure at least partially covered by the front-side electrode and/or at least one rear-side turn-on structure is embedded in the rear-side base region, the at least one rear-side turn-on structure at least partially covered by the rear-side electrode,
wherein one or both of the at least one front-side turn-on structure and the at least one rear-side turn-on structure is an emitter structure of the second conductive type, the emitter structure of the at least one front-side turn-on structure is contacted in an electrically conductive manner to the front-side electrode, the emitter structure of the at least one rear-side turn-on structure is contacted in an electrically conductive manner to the rear-side electrode, the emitter structure is configured to be turned on by at least one trigger structure, the at least one trigger structure is activated by an electrical turn-on signal supplied to it,
wherein the at least one front-side turn-on structure has a lateral front-side turn-on structure width ($W_{SV}$) determined by its lateral extent, and the at least one rear-side turn-on structure has a lateral rear-side turn-on structure width ($W_{SR}$) determined by its lateral extent, wherein a ratio of the lateral front-side turn-on structure width ($W_{SV}$) to the corresponding lateral front-side electrode width ($W_{EV}$) is less than 1 and/or a ratio of the lateral rear-side turn-on structure width ($W_{SR}$) to the corresponding lateral rear-side electrode width ($W_{ER}$) is less than 1,
characterized in that
the at least one trigger structure is configured to inject an electrical current surge into the semiconductor body between the at least one trigger structure and the at least one front-side and/or at least one rear-side turn-on structure to irreversibly destroy a first semiconductor junction formed between the at least one front-side turn-on structure and the front-side base region and/or a second semiconductor junction formed between the front-side base region and the inner region, or to irreversibly destroy a rear-side first semiconductor junction formed between the rear-side turn-on structure and the rear-side base region and/or a rear-side second semiconductor junction formed between the at least one rear-side base region and the inner region, wherein the front-side electrode and the rear-side electrode each comprise a contact disk that contacts the semiconductor body, and wherein the contact disks of the front-side electrode and the rear-side electrode each comprise molybdenum.

2. The short-circuit semiconductor component according to claim 1,
characterized in that
the energy input is predetermined in a range between about 1 Ws to about 3 Ws.

3. The short-circuit semiconductor component according to claim 1,
characterized in that
the semiconductor body, in a region into which the current surge is injected, which is situated between the trigger structure and the front-side and/or rear-side turn-on structure, has a resistance of less than about 10Ω in the radial direction.

4. The short-circuit semiconductor component according to claim 1,
wherein the ratio of the lateral front-side turn-on structure width ($W_{SV}$) to the corresponding lateral front-side electrode width ($W_{EV}$) of the respective electrode contacting the corresponding turn-on structure is less than ⅘, or the ratio of the lateral rear-side turn-on structure width ($W_{SR}$) to the corresponding lateral rear-side electrode width ($W_{ER}$) of the respective electrode contacting the corresponding turn-on structure is less than ⅘.

5. The short-circuit semiconductor component according to claim 1,
characterized in that
the at least one front-side turn-on structure is completely covered by the front-side electrode and the at least one rear-side turn-on structure is completely covered by the rear-side electrode.

6. The short-circuit semiconductor component according to claim 1,
characterized in that
the at least one front-side turn-on structure, is covered at least 5 mm in a radial direction by the front-side electrode contacting it.

7. The short-circuit semiconductor component according claim 1,
characterized in that
the front-side electrode and the rear-side electrode cover the front-side or rear-side center, respectively, of the semiconductor body, the at least one front-side turn-on structure is disposed in the center of the front-side electrode and the at least one rear-side turn-on structure is disposed in the center of the rear-side electrode.

8. The short-circuit semiconductor component according to claim 1,
characterized in that
an electrically insulating insulator layer is disposed between the at least one front-side turn-on structure and the front-side electrode, wherein the electrically insulator layer extends in a radial direction across the at least one front-side turn-on structure and extends in the circumferential direction along an, in the radial direction inner, inner edge of the front-side electrode.

9. The short-circuit semiconductor component according to claim 8,
characterized in that
the insulator layer has a thickness of at least 10 nm to at most 100 nm.

10. The short-circuit semiconductor component according to claim 8,
characterized in that
the insulator layer is a silicon dioxide layer.

11. The short-circuit semiconductor component according to claim 8,
characterized in that
the insulator layer has openings spaced apart from each other in the radial direction, which establish a direct electrically conductive connection between the front-side electrode and the front-side base region abutting against it.

12. The short-circuit semiconductor component according to claim 1,
characterized in that
the trigger structure is a gate electrode, and the turn-on signal is the current surge injected by the trigger structure into the semiconductor body.

13. The short-circuit semiconductor component according to claim 12,
characterized in that
a capacitor with a capacitance predetermined in accordance with the predetermined energy input is provided, which provides the turn-on signal in a charged state, wherein the capacitor can be electrically connected between the gate electrode and the front-side electrode and/or the rear-side electrode by means of an electronic switch.

14. The short-circuit semiconductor component according to claim 12,
characterized in that
the gate electrode is coated with a silver layer on its, in the vertical direction outer, metallic contact side.

15. The short-circuit semiconductor component according to claim 1,
characterized in that
the trigger structure is a breakdown structure, and the turn-on signal is the electrical voltage present between the front-side electrode and the rear-side electrode.

16. The short-circuit semiconductor component according to claim 1,
characterized in that
the at least one front-side turn-on structure is spaced apart in a radial direction from the trigger structure and has at least one turn-on structure segment with a turn-on structure width ($W_{UV}$), which extends in a circumferential direction of the semiconductor body and is smaller everywhere than a closed circumferential length extending through the at least one turn-on structure segment in the circumferential direction around the center.

17. The short-circuit semiconductor component according to claim 16,
characterized in that
at least two turn-on structure segments that are separate from each other are provided in the circumferential direction of the semiconductor body.

18. The short-circuit semiconductor component according to claim 16,
characterized in that
the electrical resistance in the base region containing the turn-on structure is increased at least in a portion of the radial interspace between the turn-on structure and the trigger structure with the exception of at least one forward channel electrically coupling the at least one of the turn-on structure segments with the trigger structure.

19. The short-circuit semiconductor component according to claim 1,
characterized in that
a region of the base region embedding the turn-on structure between the trigger structure and the respective turn-on structure is configured in such a way that the turn-on structure can be turned on, by means of the trigger structure, with an overdrive factor of at most 10, wherein a minimum turn-on current causing the turn-on structure to be turned on is at least about 1 A.

20. The short-circuit semiconductor component according to claim 1,
characterized in that
a thickness ($W_n$) of the inner region in the vertical direction is greater than 400 µm.

21. The short-circuit semiconductor component according to claim 1,
characterized in that
the thickness of the front-side base region and/or the rear-side base region in the vertical direction is at least 50 µm.

22. The short-circuit semiconductor component according to claim 1,
characterized in that
the lateral width of the respective contact disk corresponds to the lateral electrode width ($W_{EV}$, $W_{ER}$) of the corresponding press-contacted electrode.

23. The short-circuit semiconductor component according to claim 1, wherein the short-circuit semiconductor component comprises the at least one rear-side turn-on structure that is embedded in the rear-side base region, the at least one rear-side turn-on structure at least partially covered by the rear-side electrode.

24. The short-circuit semiconductor component according to claim 1, wherein the ratio of the lateral front-side turn-on structure width (WSV) to the corresponding lateral front-side electrode width (WEV) of the respective electrode contacting the corresponding turn-on structure is between 0.25 and 0.7.

25. A method for operating a short-circuit semiconductor component that includes a semiconductor body having a rear-side base region of a first conduction type, an inner region of a second conduction type complementary to the first conduction type, and a front-side base region of the first conduction type successively arranged in a vertical direction starting from a rear side at least one front-side turn-on structure embedded in the front-side base region and/or at least one rear-side turn-on structure embedded in the rear-side base region, and at least one trigger structure coupled to the front-side base region or the rear-side base region that turns on the at least one front-side turn-on structure and/or the at least one rear-side turn-on structure, the method comprising:
activating the at least one trigger structure with an electrical turn-on signal to inject an electrical current surge into the semiconductor body between the at least one trigger structure and the at least one front-side turn-on structure or between the at least one trigger structure and the at least one rear-side turn-on structure, by fusing the semiconductor body to metal regions from contact disks of the at least one front-side turn-on structure to irreversibly destroy at least one of a first semiconductor junction formed between the at least one front-side turn-on structure and the front-side base region, a second semiconductor junction formed between the front-side base region and the inner region, a rear-side first semiconductor junction formed between the at least one rear-side turn-on structure and the rear-side base region, or a rear-side second semiconductor junction formed between the rear-side base region and the inner region.

\* \* \* \* \*